(12) United States Patent
Oh et al.

(10) Patent No.: US 11,637,248 B2
(45) Date of Patent: Apr. 25, 2023

(54) ORGANIC ELECTRIC ELEMENT COMPRISING COMPOUND FOR ORGANIC ELECTRIC ELEMENT AND ELECTRONIC DEVICE THEREOF

(71) Applicant: DUK SAN NEOLUX CO., LTD., Cheonan-si (KR)

(72) Inventors: Dae Hwan Oh, Cheonan-si (KR); Dae Sung Kim, Cheonan-si (KR); Moo Jin Park, Cheonan-si (KR); Jeong Seok Kim, Cheonan-si (KR); Sun Hee Lee, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 212 days.

(21) Appl. No.: 16/762,532

(22) PCT Filed: Oct. 12, 2018

(86) PCT No.: PCT/KR2018/012042
§ 371 (c)(1),
(2) Date: May 8, 2020

(87) PCT Pub. No.: WO2019/093665
PCT Pub. Date: May 16, 2019

(65) Prior Publication Data
US 2020/0365815 A1    Nov. 19, 2020

(30) Foreign Application Priority Data
Nov. 8, 2017  (KR) .................. 10-2017-0147774

(51) Int. Cl.
*H01L 51/00*    (2006.01)

(52) U.S. Cl.
CPC ...... *H01L 51/0074* (2013.01); *H01L 51/0005* (2013.01); *H01L 51/006* (2013.01); *H01L 51/0073* (2013.01)

(58) Field of Classification Search
CPC ............ H01L 51/0074; H01L 51/0005; H01L 51/006; H01L 51/0073; H01L 51/0061; C07D 307/91; C07D 409/12
(Continued)

(56) References Cited

U.S. PATENT DOCUMENTS

| 2003/0157364 | A1 | 8/2003 | Senoo et al. | |
| 2018/0358563 | A1* | 12/2018 | Park et al. | ......... H01L 51/0061 |
| 2021/0367161 | A1* | 11/2021 | Yang | ................. H01L 51/0072 |

FOREIGN PATENT DOCUMENTS

| CN | 106478566 A | 3/2017 |
| KR | 10-2016-0121946 A | 10/2016 |

(Continued)

OTHER PUBLICATIONS

English translation of Chinese Patent CN 106478566 by Huang date Mar. 8, 2017 Year 2017.*

*Primary Examiner* — Thinh T Nguyen
(74) *Attorney, Agent, or Firm* — Vorys, Safer, Seymour and Pease LLP; Mih Suhn Koh

(57) ABSTRACT

The organic electric element comprising a compound represented by Formula 1 as material of an emission-auxiliary layer and an electronic device thereof are disclosed, and by comprising the compound represented by Formula 1 in an emission-auxiliary layer, the driving voltage of the organic electric element can be lowered, and the luminous efficiency and life time of the organic electric element can be improved.

8 Claims, 1 Drawing Sheet

(58) Field of Classification Search
USPC .................................. 257/40; 438/82, 99
See application file for complete search history.

(56) References Cited

FOREIGN PATENT DOCUMENTS

| | | |
|---|---|---|
| KR | 10-2016-0146351 A | 12/2016 |
| KR | 10-1686835 B1 | 12/2016 |

* cited by examiner

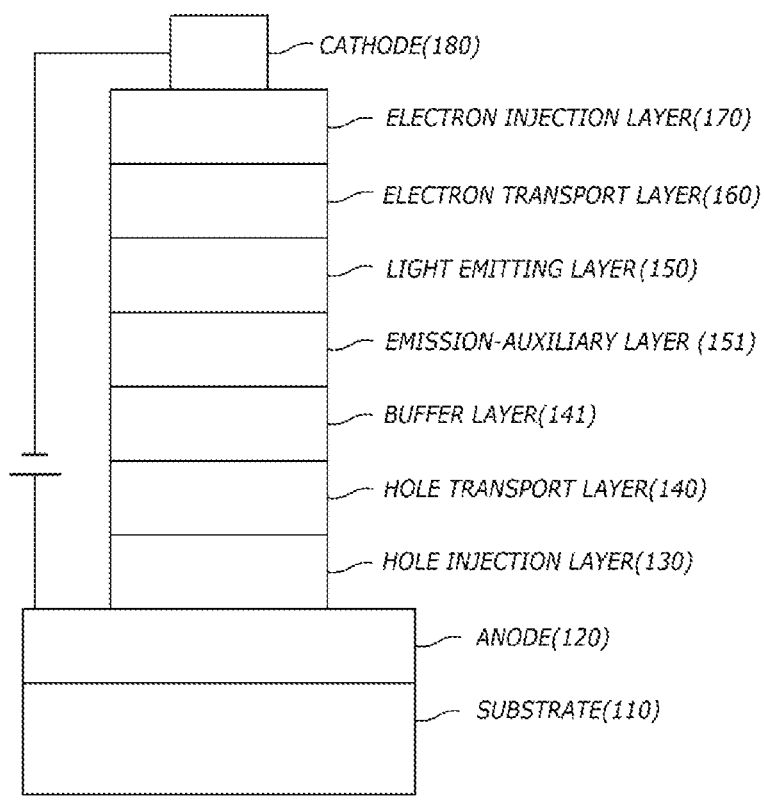

ORGANIC ELECTRIC ELEMENT COMPRISING COMPOUND FOR ORGANIC ELECTRIC ELEMENT AND ELECTRONIC DEVICE THEREOF

CROSS-REFERENCE TO RELATED APPLICATION

This patent application claims priority from and the benefit under 35 U.S.C. § 119 to § 121, and § 365 of Korean Patent Application No. 10-2017-0147774, filed on Nov. 8, 2017, which is hereby incorporated by reference for all purposes as if fully set forth herein. Further, this application claims the benefit of priority in countries other than U.S., which is hereby incorporated by reference herein.

BACKGROUND

Technical Field

The present invention relates to an organic electric element employing the compound for an organic electric element and an electronic device thereof.

Background Art

In general, an organic light emitting phenomenon refers to a phenomenon in which electric energy is converted into light energy of an organic material. An organic electric element utilizing the organic light emitting phenomenon usually has a structure including an anode, a cathode, and an organic material layer interposed therebetween. In many cases, the organic material layer has a multi-layered structure composed of different materials in order to improve efficiency and stability of an organic electric element, and for example, the organic material layer may include a hole injection layer, a hole transport layer, a light emitting layer, an electron transport layer, an electron injection layer, or the like.

Currently, the power consumption is required more and more as size of display becomes larger and larger in the portable display market. Therefore, the power consumption is a very important factor in the portable display with a limited power source of the battery, and efficiency and life span issue also must be solved.

Efficiency, life span, driving voltage, and the like are correlated with each other. For example, if efficiency is increased, then driving voltage is relatively lowered, and the crystallization of an organic material due to Joule heating generated during operation is reduced as driving voltage is lowered, as a result of which life span shows a tendency to increase. However, efficiency cannot be maximized only by simply improving the organic material layer. This is because long life span and high efficiency can be simultaneously achieved when energy levels and $T_1$ values among the respective layers included in the organic material layer, inherent material properties (mobility, interfacial properties, etc.) and the like are optimal combination.

In general, an electron is transferred from an electron transport layer to a light emitting layer and a hole is transferred from a hole transport layer to the light emitting layer, as a result, an exciton is formed by the recombination of the electron and hole. However, material used in a hole transport layer has a low $T_1$ value because the material should have a low HOMO value. As a result, the exciton generated in the light emitting layer is transferred to the hole transport layer, and thereby a charge unbalance in the light-emitting layer is caused. Therefore, the color purity, efficiency and life time are lowered because light is emitted from the hole transporting layer or the interface of the hole transporting layer.

In addition, when a material having a fast hole mobility is used for a low driving voltage, the efficiency tends to decrease. This cause a charge unbalance in the light emitting layer because the hole mobility is faster than the electron mobility in a general organic electric element, resulting in the reduced efficiency and lifetime.

Recently, an emission-auxiliary layer is formed between the hole transport layer and the light emitting layer in order to solve the light emission problem in the hole transport layer in the organic electroluminescent device, and thus it is time to develop a different emission-auxiliary layer according to each light-emitting layer (R, G, B).

An emission-auxiliary layer should be formed of a material having a hole mobility, a high $T_1$ (electron block) value, and a wide band gap to have a suitable driving voltage in order to solve the problems of the hole transport layer. These requirements are not satisfied only by the structural properties of the core of an emission-auxiliary layer material, and are possible when the properties of the core and sub substituents of the material are all properly combined. Therefore, it is strongly required to develop material of an emission-auxiliary layer that has a high $T_1$ value and a wide band gap in order to improve the efficiency and lifetime of the organic electric element.

That is, in order to allow an organic electric element to fully exhibit excellent features, it should be prerequisite to support a material constituting an organic material layer in the element, for example, a hole injection material, a hole transport material, a light emitting material, an electron transport material, an electron injection material, an emission-auxiliary layer material and the like, by a stable and efficient material. However, the stable and efficient material of organic material layer for an organic electric element has not been fully developed yet. Therefore, it is continuously required to develop new material and it is strongly required to develop material for an emission-auxiliary layer.

OBJECT, TECHNICAL SOLUTION AND EFFECTS OF THE INVENTION

The present invention is to provide an organic electric element using a compound capable of improving luminous efficiency, lowering a driving voltage, increasing heat resistance, improving color purity and lifetime of the element as an emission-auxiliary layer material, and an electronic device thereof.

In an aspect of the present invention, the present invention provides an organic electric element comprising a first electrode, a second electrode, and an organic material layer formed between the first electrode and the second electrode. Here, the organic material layer comprises an emission-auxiliary layer formed between the first electrode and a light emitting layer, and the emission-auxiliary layer comprises the compound represented by the following Formula.

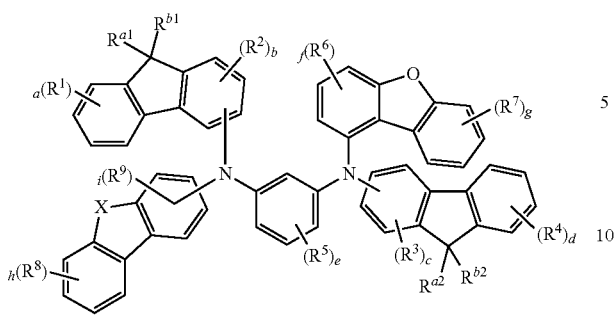

In another aspect of the present invention, the present invention provides an electronic device comprising the organic electric element.

By using the compound according to embodiment of the present invention as an emission-auxiliary layer material, a driving voltage of an organic electric element can be lowered and the luminous efficiency, color purity and lifetime of the element can be largely improved.

BRIEF DESCRIPTION OF THE DRAWINGS

The FIGURE illustrates an example of an organic electric element according to an embodiment of the present invention: 100 is an organic electroluminescent element, 110 is a substrate, 120 is a first electrode, 130 is a hole injection layer, 140 is a hole transport layer, 141 is a buffer layer, 150 is a light emitting layer, 151 is an emission-auxiliary layer, 160 is an electron transport layer, 170 is an electron injection layer, and 180 is a second electrode.

DETAILED DESCRIPTION

Unless otherwise stated, the term "aryl group" or "arylene group" as used herein has, but not limited to, 6 to 60 carbon atoms. The aryl group or arylene group in the present invention may comprise a monocyclic ring, ring assemblies, a fused polycyclic system, spiro compounds and the like.

The term "heterocyclic group" as used herein means a non-aromatic ring as well as an aromatic ring like "heteroaryl group" or "heteroarylene group", and unless otherwise stated, it means a ring comprising one or more heteroatoms and having 2 to 60 carbon atoms, but not limited thereto. Unless otherwise stated, the term "hetero atom" as used herein represents N, O, S, P or Si, and the heterocyclic group means a monocyclic form, ring assemblies, a fused polycyclic system or a spiro compound comprising heteroatom.

In addition, "heterocyclic group" means a ring comprising a heteroatom such as N, O, S, P, Si and so on instead of carbon forming a ring, it comprises a non-aromatic ring as well as an aromatic ring like "heteroaryl group" or "heteroarylene group", and it comprises the compound comprising a heteroatom group such as $SO_2$, $P=O$ etc. instead of carbon forming a ring such as the following compound.

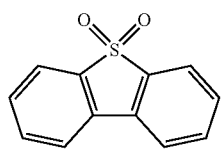 [SMILES: O=S1(=O)c2ccccc2-c2ccccc21]

Unless otherwise stated, the term "fluorenyl group" or "fluorenylene group" as used herein means univalent or bivalent functional group in which R, R' and R" are all hydrogen in the following structure, "substituted fluorenyl group" or "substituted fluorenylene group" means that at least any one of R, R' and R" is a substituent other than hydrogen, and it comprises the spiro compound formed by R and R' being bonded to each other together with the carbon to which R and R' are bonded.

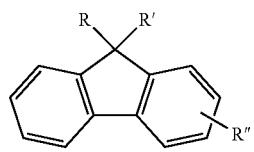

The term "spiro compound" as used herein has, a spiro union which means union having one atom as the only common member of two rings. The common atom is designated as 'spiro atom'. The compounds are defined as 'monospiro-', 'dispiro-' or 'trispiro-' depending on the number of spiro atoms in one compound.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and as 'phenanthrylene (group)' when it is 'divalent group', and it may also be described as a parent compound name, 'phenanthrene', regardless of its valence. Similarly, in the case of pyrimidine, it may be described as 'pyrimidine' regardless of its valence, and it may also be described as the name of corresponding functional group such as pyrimidinyl (group) when it is 'monovalent group', and as 'pyrimidylene (group)' when it is 'divalent group'.

In addition, otherwise specified, the formulas used in the present invention are as defined in the index definition of the substituent of the following formula.

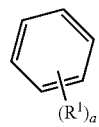

Here, when a is an integer of 0, the substituent $R^1$ is absent, when a is an integer of 1, $R^1$ is linked to any one of the carbon atoms constituting the benzene ring, when a is an integer of 2 or 3, the substituent $R^1$s are linked to the benzene ring as follows and the substituent $R^1$s may be the same and different. When a is an integer of 4 to 6, the substituents $R^1$s are linked to the benzene ring in a similar manner to that when a is an integer of 2 or 3, hydrogen linked to carbon constituents of the benzene ring may be omitted.

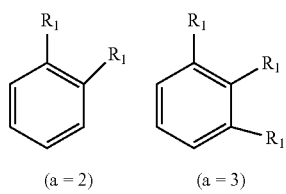

(a = 2)    (a = 3)

Hereinafter, a laminated structure of the electric element comprising the compound of the present invention will be described with reference to FIGURE.

In the following description of the present invention, a detailed description of known functions and configurations incorporated herein will be omitted when it may make the subject matter of the present invention rather unclear.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

The FIGURES shows an example of an organic electric element according to an embodiment of the present invention.

Referring to the FIGURE, an organic electric element 100 according to an embodiment of the present invention comprises a first electrode 120 formed on a substrate 110, a second electrode 180, and an organic material layer formed between the first electrode 120 and the second electrode 180 and comprising the compound of the present invention. Here, the first electrode 120 may be an anode (positive electrode), and the second electrode 180 may be a cathode (negative electrode). In the case of an inverted organic electroluminescent element, the first electrode may be a cathode, and the second electrode may be an anode.

The organic material layer may comprise a hole injection layer 130, a hole transport layer 140, a light emitting layer 150, an electron transport layer 160, and an electron injection layer 170 formed in sequence on the first electrode 120. Here, at least one layer of the organic material layer may be omitted, or the organic material layer may further include a hole blocking layer, an electron blocking layer, an emission-auxiliary layer 151, a buffer layer 141, etc., and the electron transport layer 160 or the like may serve as a hole blocking layer.

In addition, although not shown, the organic electric element according to an embodiment of the present invention may further include a protective layer or a layer for improving luminous efficiency formed on at least one side of sides of the first electrode and the second electrode, wherein at least one side is not facing the organic material layer.

The inventive compound employed in the organic material layer may be used as a material of a hole injection layer 130, a hole transport layer 140, electron transport layer 160, an electron injection layer 170, a light emitting layer 150, a layer for improving luminous efficiency, an emission-auxiliary layer and so on. For example, the inventive compound may be used as material of a hole transport layer 140 and/or an emission-auxiliary layer 151.

On the other hand, even if the core is same, the band gap, the electrical characteristics, the interface characteristics and the like may be different depending on which substituent is bonded at which position. Therefore, the selection of the core and the combination of the core and the sub-substituent bonded to the core are very important. In particular, long life span and high efficiency can be simultaneously achieved when the optimal combination of energy levels and $T_1$ values, inherent material properties (mobility, interfacial properties, etc.), and the like among the respective layers of an organic material layer is achieved.

As already described above, generally, in order to solve the emission problem with a hole transport layer of an organic electric element, it is preferable that an emission-auxiliary layer is formed between the hole transport layer and a light emitting layer, and it is necessary to develop different emission-auxiliary layers according to respective light emitting layers (R, G, B). On the other hand, even if the core of an emission-auxiliary layer is similar, it is very difficult to infer the characteristics of an emission-auxiliary layer because it is necessary to grasp the correlation between the emission-auxiliary layer and a hole transport layer and a light emitting layer (host).

Therefore, according to the present invention, energy level and $T_1$ value between the respective layers of the organic material layer, inherent material properties (mobility, interfacial properties, etc.) and the like can be optimized by forming a hole transport layer and/or an emission-auxiliary layer with the compound of the present invention, and thus it is possible to simultaneously improve the life span and efficiency of the organic electric element.

The organic electric element according to an embodiment of the present invention may be manufactured using various deposition methods. The organic electric element according to an embodiment of the present invention may be manufactured using a PVD (physical vapor deposition) method or CVD (chemical vapor deposition) method. For example, the organic electric element may be manufactured by depositing a metal, a conductive metal oxide, or a mixture thereof on the substrate to form the anode 120, forming the organic material layer including the hole injection layer 130, the hole transport layer 140, the light emitting layer 150, the electron transport layer 160, and the electron injection layer 170 thereon, and then depositing a material, which can be used as the cathode 180, thereon. Also, an emitting auxiliary layer 151 may be formed between a hole transport layer 140 and a light emitting layer 150.

Also, the organic material layer may be manufactured in such a manner that a smaller number of layers are formed using various polymer materials by a soluble process or solvent process, for example, spin coating, nozzle printing, inkjet printing, slot coating, dip coating, roll-to-roll, doctor blading, screen printing, or thermal transfer, instead of deposition. Since the organic material layer according to the present invention may be formed in various ways, the scope of protection of the present invention is not limited by a method of forming the organic material layer.

The organic electric element according to an embodiment of the present invention may be any one of an organic electroluminescent element (OLED), an organic solar cell, an organic photo conductor (OPC), an organic transistor, an element for monochromatic or white illumination and an element for quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electric dictionary, a point-tomultipoint (PMP), a remote controller, a navigation unit, a game player, various kinds of TVs, and various kinds of computers, and the display device may comprise an electroluminescent display, a quantum dot display and so on.

Hereinafter, an organic electric element according to an aspect of the present invention will be described.

An organic electric element according to an embodiment of the present invention comprises a first electrode, a second electrode, and an organic material layer formed between the first electrode and the second electrode. Here, the organic material layer comprises an emission-auxiliary layer formed between the first electrode and a light emitting layer, the emission-auxiliary layer comprises a compound represented by the following Formula 1.

[Formula 1]

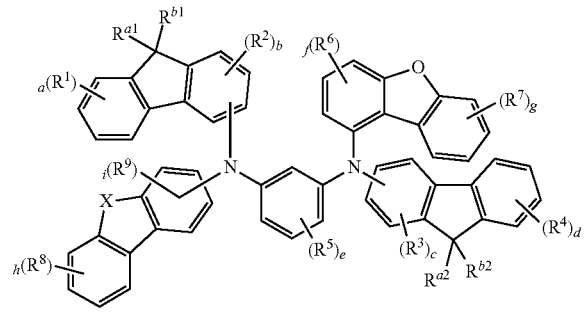

In the formula 1, each of symbols may be defined as follows.

X is O or S.

$R^{a1}$, $R^{b1}$, $R^{a2}$ and $R^{b2}$ may be each independently selected from the group consisting of a $C_1$-$C_{50}$ alkyl group, a $C_6$-$C_{60}$ aryl group, a fluorenyl group, a $C_2$-$C_{60}$ heterocyclic group comprising at least one heteroatom selected from the group consisting of O, N, S, Si and P.

In addition, $R^{a1}$ and $R^{b1}$ together may be bonded to each other to form a ring, and $R^{a2}$ and $R^{b2}$ together may be bonded to each other to form a ring, wherein the ring may be, for example, a $C_6$-$C_{60}$ aromatic hydrocarbon, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring group formed by a $C_3$-$C_{60}$ aliphatic ring with a $C_6$-$C_{60}$ aromatic ring or a combination thereof. $R^{a1}$ and $R^{b1}$ together and/or $R^{a2}$ and $R^{b2}$ together may be bonded to each other to form, preferably, a $C_6$-$C_{60}$ ring comprising a benzene ring, more preferably, fluorine or the derivatives thereof.

Where $R^{a1}$, $R^{b1}$, $R^{a2}$ and $R^{b2}$ are an alkyl group, the alkyl group may be preferably a $C_1$-$C_{10}$ alkyl group, more preferably, a $C_1$-$C_4$ alkyl group, for example, methyl, ethyl, propyl and so on. Where $R^{a1}$, $R^{b1}$, $R^{a2}$ and $R^{b2}$ are an aryl group, the aryl group may be preferably a $C_6$-$C_{30}$ or $C_6$-$C_{20}$ aryl group, more preferably a $C_6$-$C_{18}$ aryl group, for example, phenyl, naphthalene, biphenyl, terphenyl and so on, most preferably phenyl.

When $R^{a1}$ and $R^{b1}$ together and/or $R^{a2}$ and $R^{b2}$ together are bonded to each other to form a ring comprising a benzene ring, the ring may be, preferably, a $C_6$-$C_{21}$ ring, more preferably, a $C_6$-$C_{13}$ ring, when $R^{a1}$ and $R^{b1}$ together and/or $R^{a2}$ and $R^{b2}$ together are bonded to each other to form a fused ring group of an aromatic ring and an aliphatic ring, preferably, the fused ring may be a fused ring group of a $C_3$-$C_{30}$ aliphatic ring and a $C_6$-$C_{30}$ aromatic hydrocarbon, more preferably, a fused ring group of a $C_3$-$C_{18}$ aliphatic ring and a $C_6$-$C_{18}$ aromatic hydrocarbon. For example, $R^{a1}$ and $R^{b1}$ together and/or $R^{a2}$ and $R^{b2}$ together may bonded to form dihydroindene or derivatives thereof, fluorene or derivatives thereof, and consequently, a spiro compound may be formed by sharing a carbon atom with a pentagonal ring to which they are attached.

Preferably, at least one of $R^{a1}$, $R^{b1}$, $R^{a2}$ and $R^{b2}$ may be a methyl group or phenyl, $R^{a1}$ and $R^{b1}$ may be bonded to each other to form fluorene, benzofluorene or dibenzofluorene, or $R^{a2}$ and $R^{b2}$ may be bonded to each other to form fluorene, benzofluorene or dibenzofluorene. In addition, preferably, $R^{a1}$, $R^{b1}$, $R^{a2}$ and $R^{b2}$ may be all methyl group, phenyl group or fluorine, or $R^{a1}$ and $R^{b1}$ may be all methyl or phenyl and $R^{a2}$ and $R^{b2}$ may be bonded to each other to form a fluorene ring, or conversely, $R^{a1}$ and $R^{b1}$ may be bonded to each other to form a fluorene ring and both $R^{22}$ and $R^{b2}$ may be all methyl or phenyl.

$R^1$ to $R^9$ may be each independently selected from the group consisting of hydrogen, deuterium, halogen, a $C_6$-$C_{60}$ aryl group, a fluorenyl group, a $C_2$-$C_{60}$ heterocyclic group containing at least one heteroatom of O, N, S, Si, and P, a fused ring group formed by a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'—N(R')(R"), or adjacent groups together may be bonded to each other to form a ring.

When adjacent $R^1$ groups, adjacent $R^2$ groups, adjacent $R^3$ groups, adjacent $R^4$ groups, adjacent $R^5$ groups, adjacent $R^6$ groups and/or adjacent $R^7$ groups together may be bonded to each other to form a ring, the ring may be selected from the group consisting of a $C_6$-$C_{60}$ aromatic hydrocarbon, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring group formed by a $C_3$-$C_{60}$ aliphatic ring with a $C_6$-$C_{60}$ aromatic ring and a combination thereof, and the ring may be preferably a $C_6$-$C_{20}$ aromatic hydrocarbon, more preferably, a $C_6$-$C_{18}$ aromatic hydrocarbon, for example, benzene, naphthalene and so on. Therefore, when adjacent groups are bonded to each other, preferably, naphthalene, phenanthrene and so on may be formed together with a benzene ring to which adjacent groups are bonded.

Preferably, $R^{a1}$, $R^{b1}$, $R^{a2}$ and $R^{b2}$ may be each independently a $C_1$-$C_{10}$ alkyl group or a $C_6$-$C_{20}$ aryl group, $R^{a1}$ and $R^{b1}$ together and/or $R^{a2}$ and $R^{b2}$ together may be bonded to each other to form a $C_6$-$C_{21}$ ring comprising a benzene ring, and $R^1$ to $R^9$ may be each independently hydrogen or adjacent groups among $R^1$ to $R^9$ may be bonded to each other to form a $C_6$-$C_{20}$ ring comprising a benzene ring.

More preferably, $R^{a1}$, $R^{b1}$, $R^{a2}$ and $R^{b2}$ may be each independently a $C_1$-$C_4$ alkyl group or a $C_6$-$C_1$a aryl group, $R^{a1}$ and $R^{b1}$ together and/or $R^{a2}$ and $R^{b2}$ together may be bonded to each other to form a $C_6$-$C_{13}$ ring comprising a benzene ring, and at least one pair of adjacent groups among $R^1$ to $R^9$ may be bonded to each other to form $C_6$-$C_{12}$ aromatic hydrocarbon comprising a benzene ring and the rest may be hydrogen.

For example, $R^{a1}$, $R^{b1}$, $R^{a2}$ and $R^{b2}$ may be each independently methyl group or phenyl group or $R^{a1}$ and $R^{b1}$ together and/or $R^{a2}$ and $R^{b2}$ together may be bonded to each other to form fluorene, and at least one pair of adjacent groups among $R^1$ to $R^9$ may be bonded to each other to form a benzene ring.

a, d, e, g and h are each represent an integer of 0-4, b, c, f and i are each represent an integer of 0-3, and when each of these is an integer of 2 or more, each of the plurality of $R^1$s may be the same or different from each other, similarly, each of a plurality of $R^2$s, each of a plurality of $R^3$s, each of a plurality of $R^4$s, each of a plurality of $R^5$s, each of a plurality of $R^6$s, each of a plurality of $R^7$s, each of a plurality of $R^1$s, and each of a plurality of $R^9$s may be the same or different from each other.

L' may be selected from the group consisting of a single bond, a $C_6$-$C_{60}$ arylene group, a fluorenylene group, a fused ring group formed by a $C_3$-$C_{60}$ aliphatic ring with a $C_6$-$C_{60}$ aromatic ring, and a $C_2$-$C_{60}$ heterocyclic group.

R' and R" may be each independently selected from the group consisting of a $C_6$-$C_{60}$ aryl group, a fluorenyl group, a fused ring group formed by a $C_3$-$C_{60}$ aliphatic ring with a $C_6$-$C_{60}$ aromatic ring, and a $C_2$-$C_{60}$ heterocyclic group containing at least one heteroatom of O, N, S, Si, and P.

The above $R^{a1}$, $R^{b1}$, $R^{a2}$, $R^{b2}$, $R^1$ to $R^9$, L', R', R", a ring formed by $R^{a1}$ and $R^{b1}$ or $R^{a2}$ and $R^{b2}$, and a ring formed by adjacent groups among $R^1$-$R^9$ may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxyl group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ cycloalkyl group, a $C_7$-$C_{20}$ arylalkyl group, and a $C_5$-$C_{20}$ arylalkenyl group.

Formula 1 may be represented by one of Formula 2 to Formula 4 below.

<Formula 2>

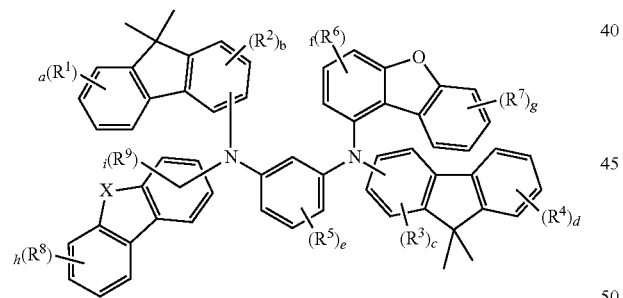

<Formula 3>

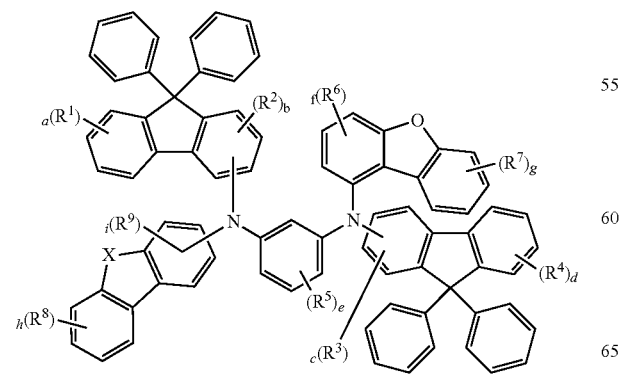

<Formula 4>

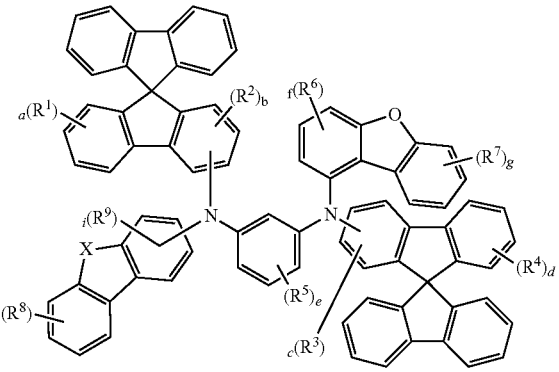

In Formulas 2 to 4, X, $R^1$ to $R^9$, a, b, c, d, e, f, g, h and i are the same as defined for Formula 1.

Specifically, the compound represented by formula 1 may be one of the following compounds.

P-1

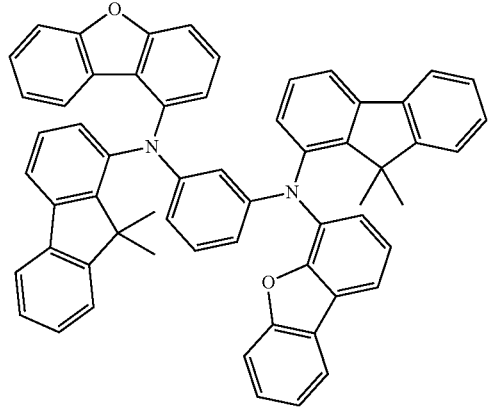

P-2

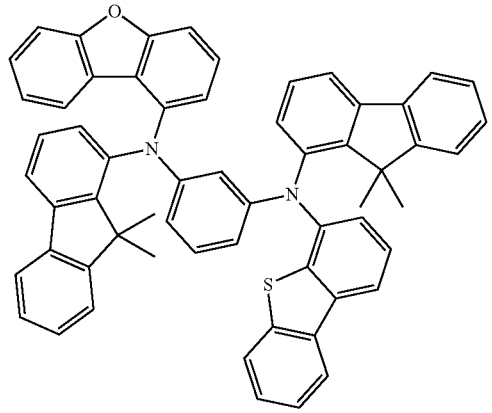

P-3
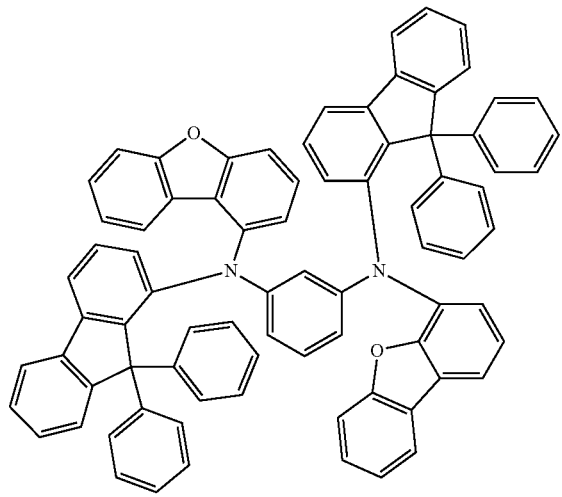
P-4
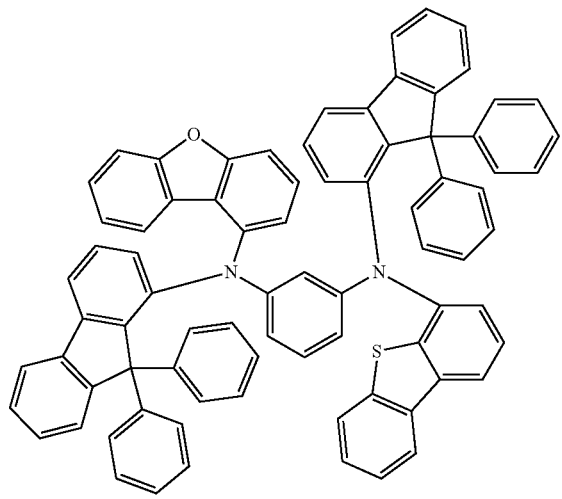
P-5
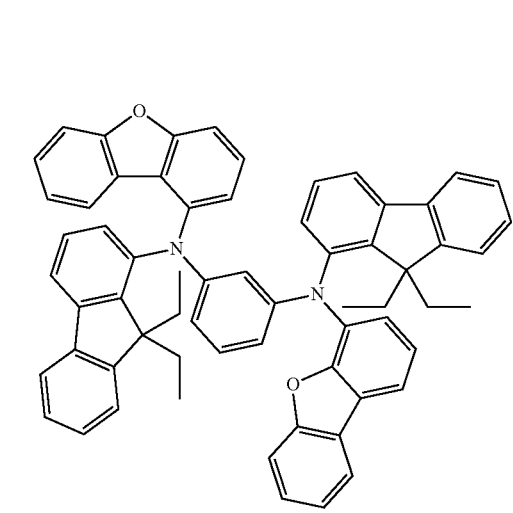
P-6
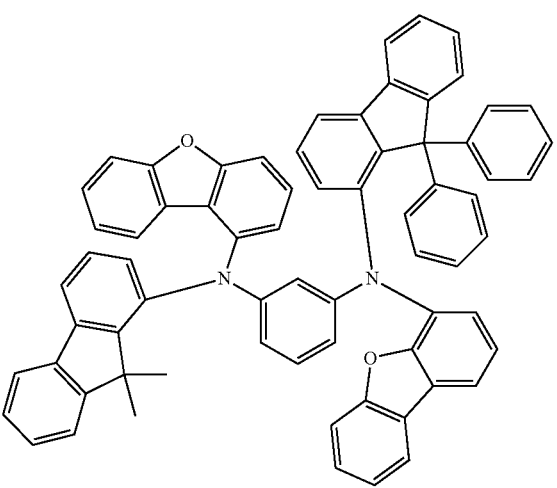
P-7
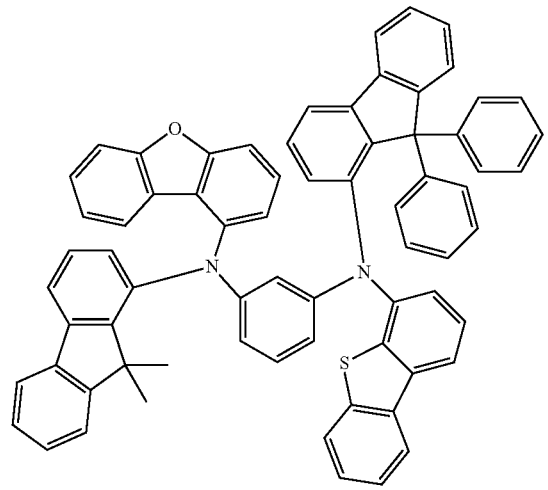
P-8
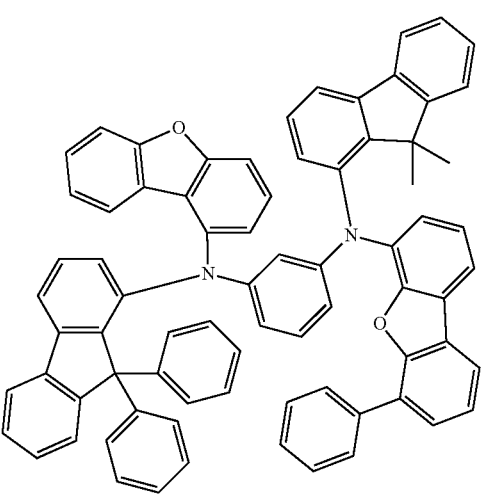

P-9
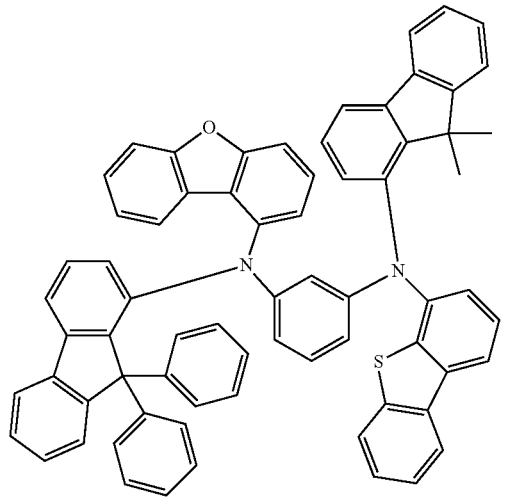
P-10
P-11
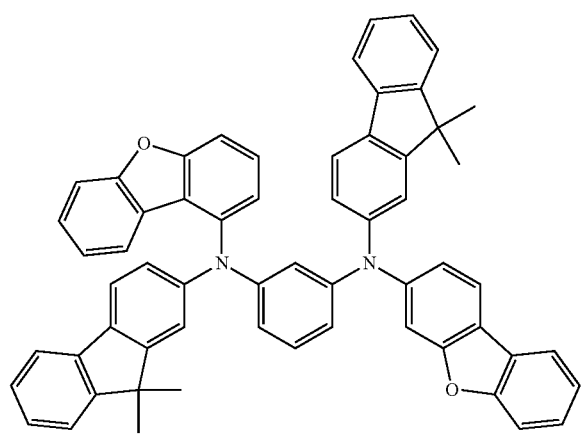
P-12
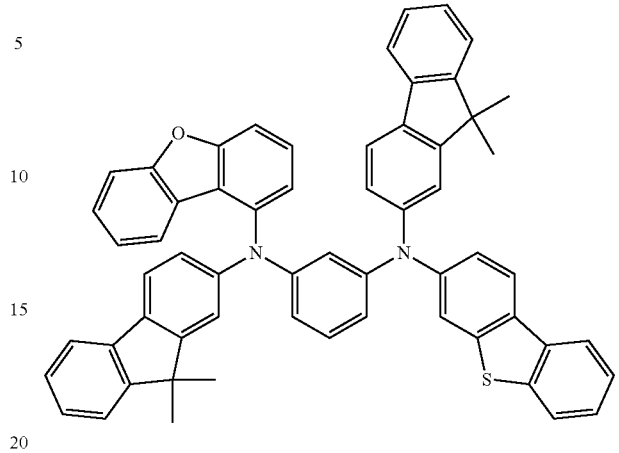
P-13
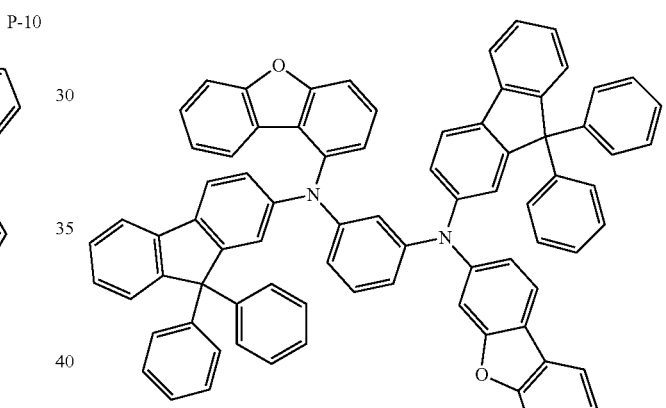
P-14
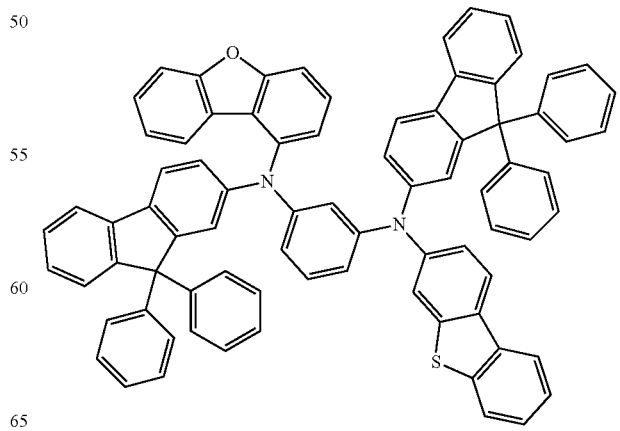

P-15
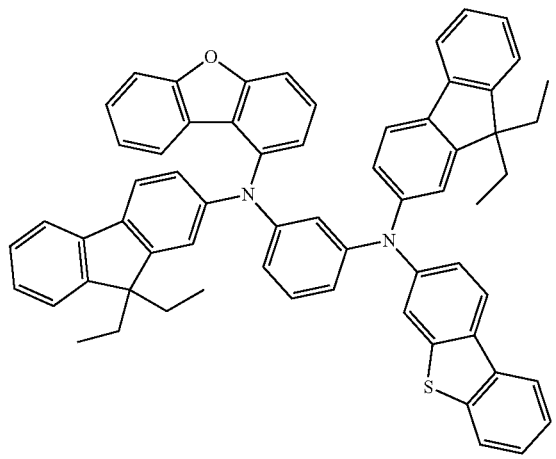
P-18
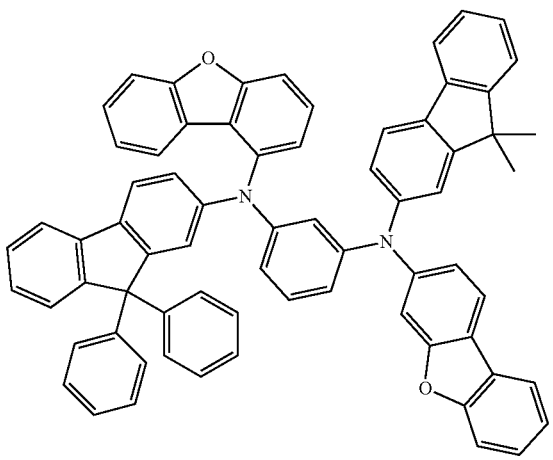
P-16
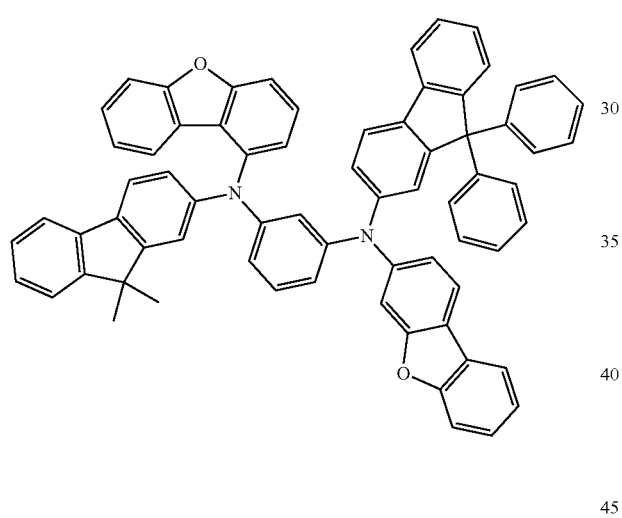
P-19
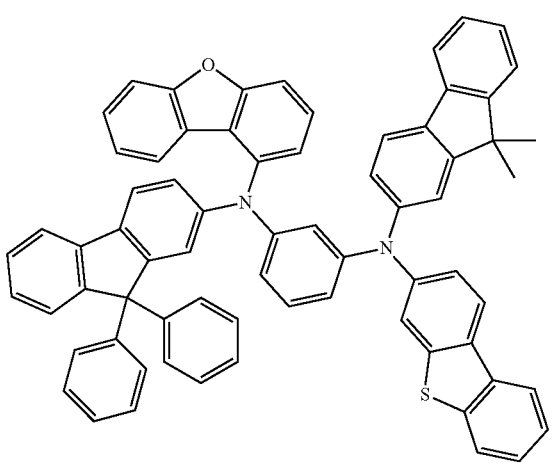
P-17
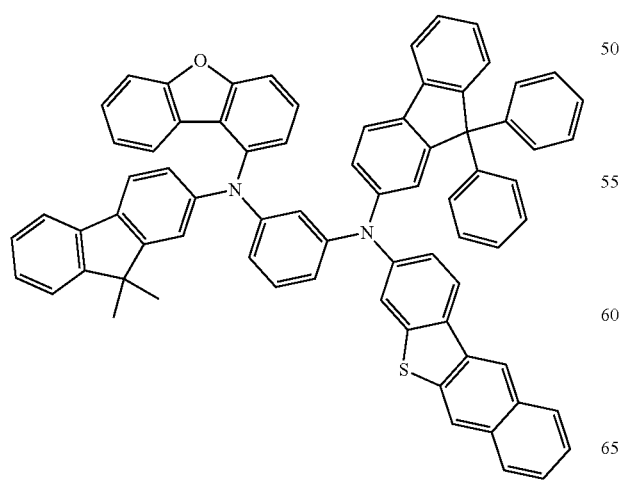
P-20
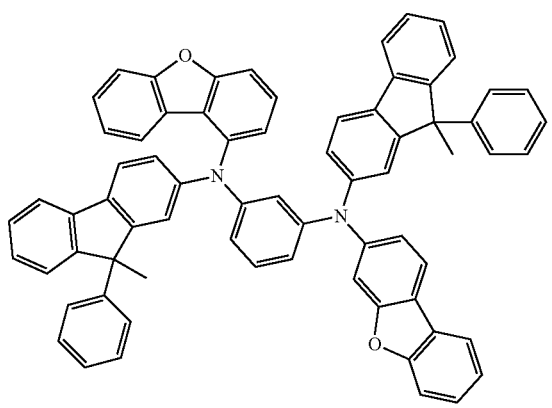

P-21
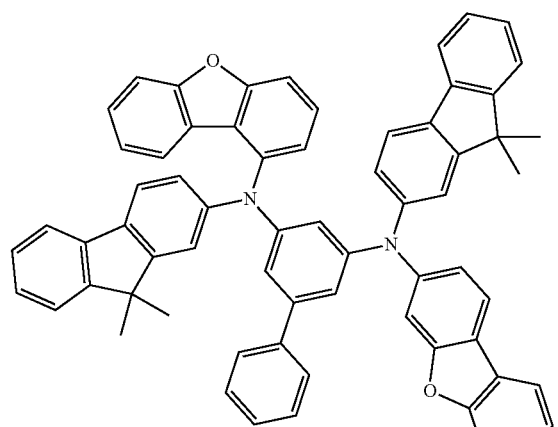
P-22
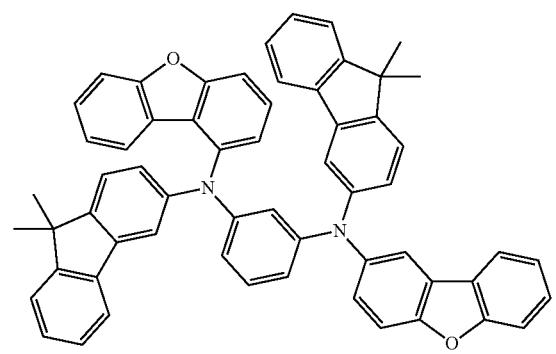
P-23
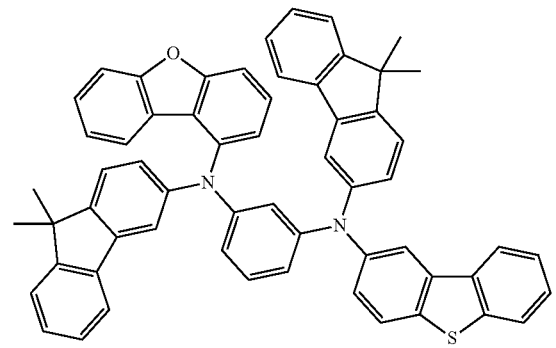
P-24
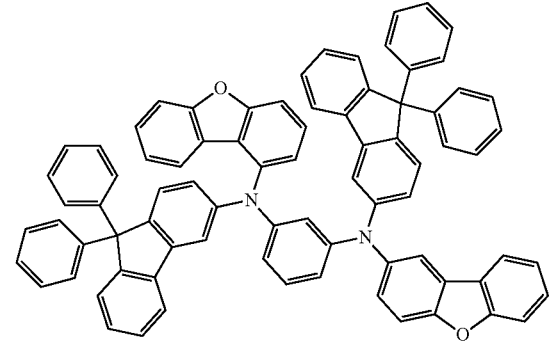
P-25
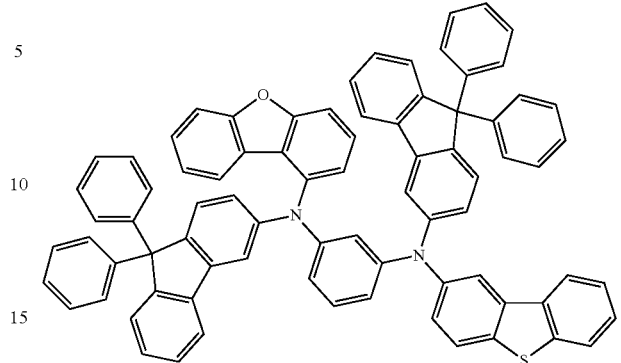
P-26
P-27
P-28

P-29
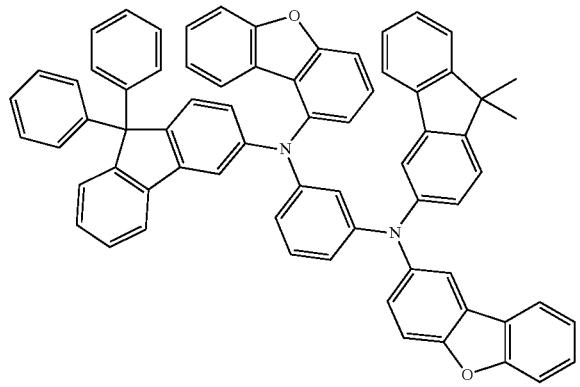
P-30
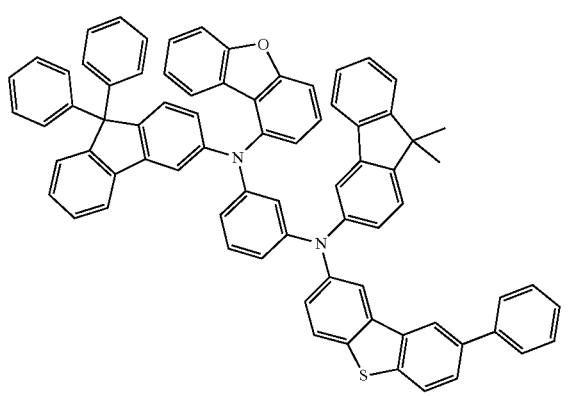
P-31
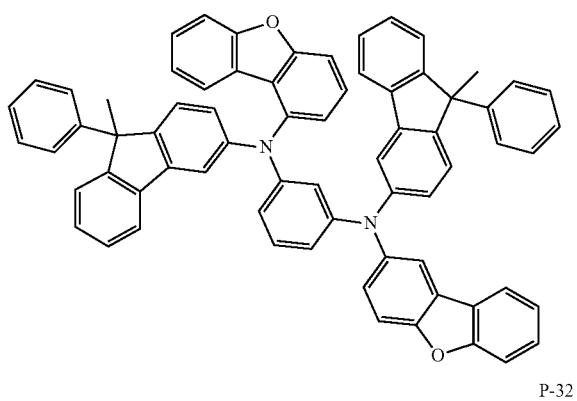
P-32
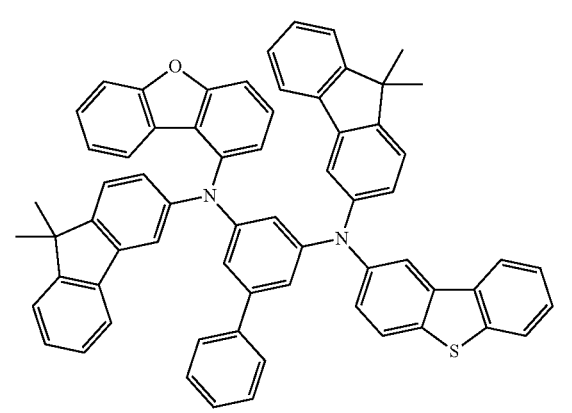
P-33
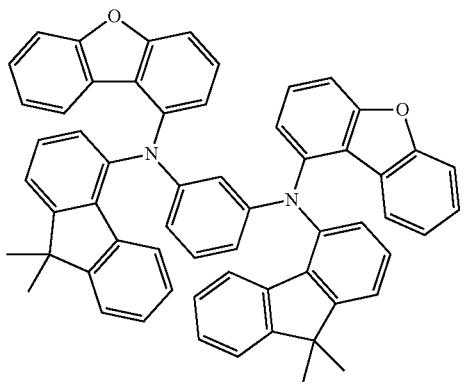
P-34
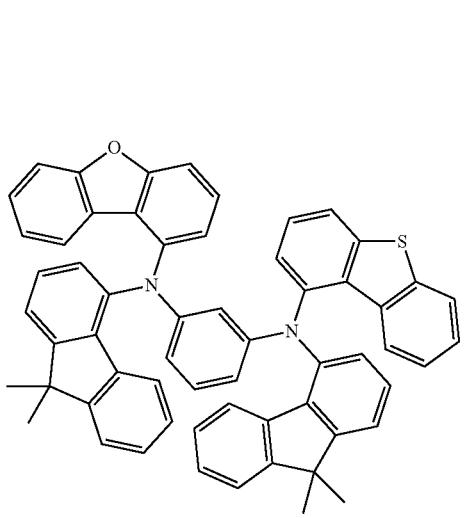
P-35
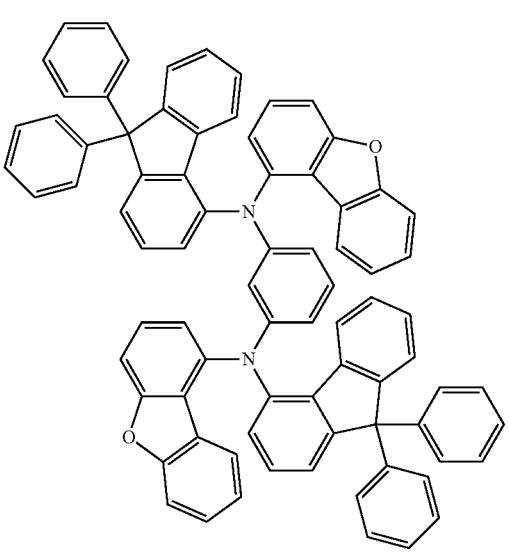

P-36
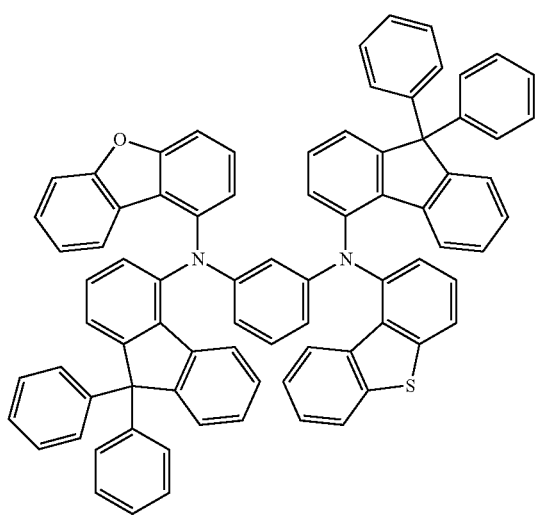
P-37
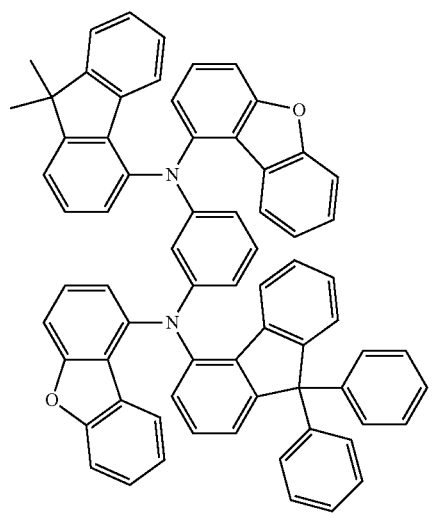
P-38
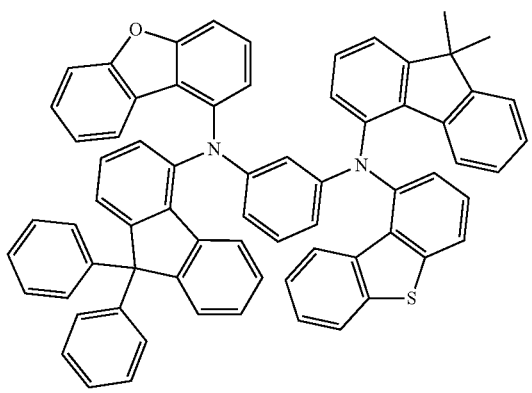
P-39
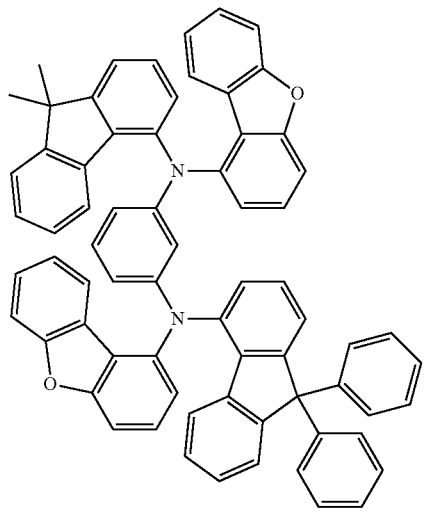
P-40
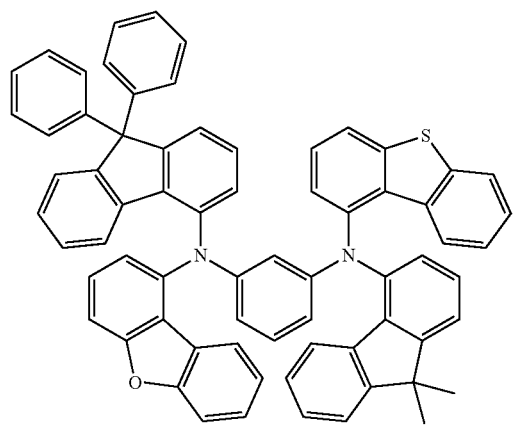
P-41
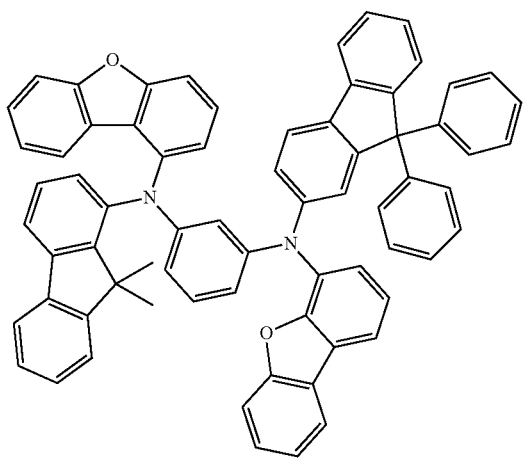

P-42
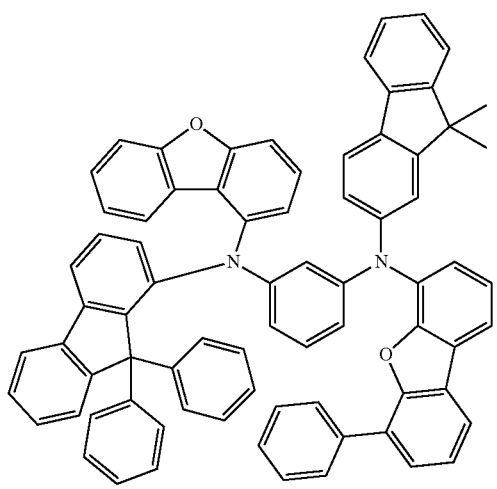
P-45
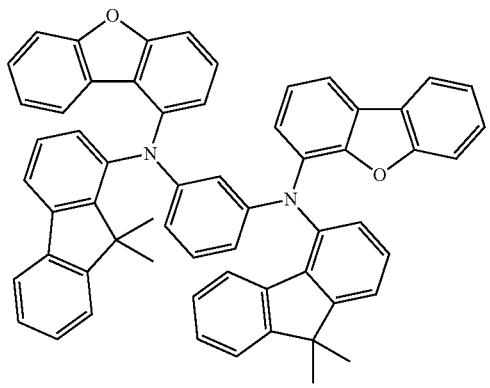
P-43
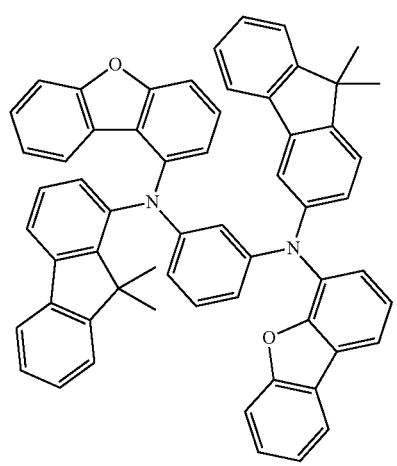
P-46
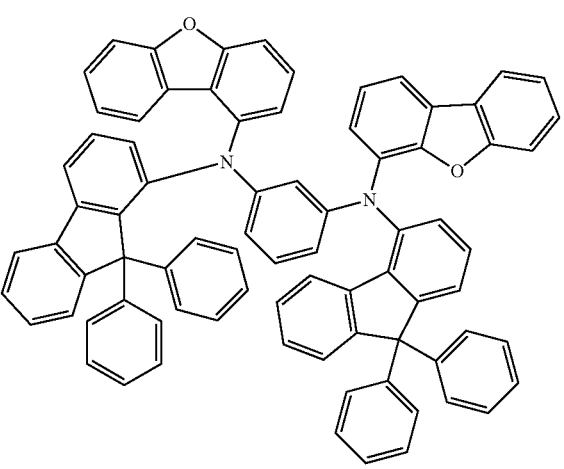
P-44
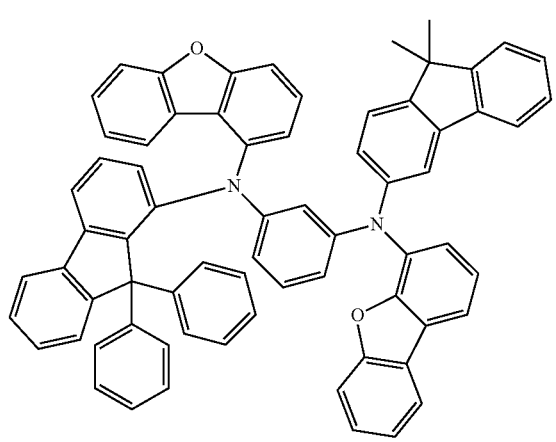
P-47
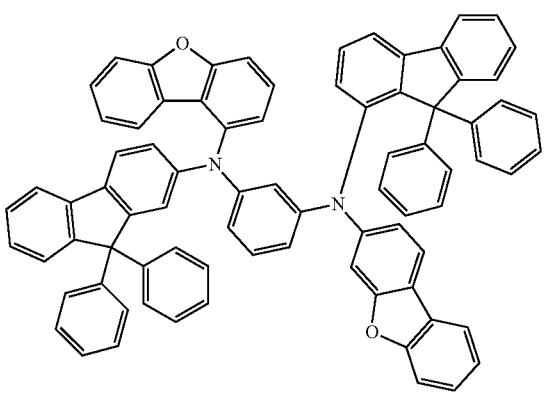

P-48
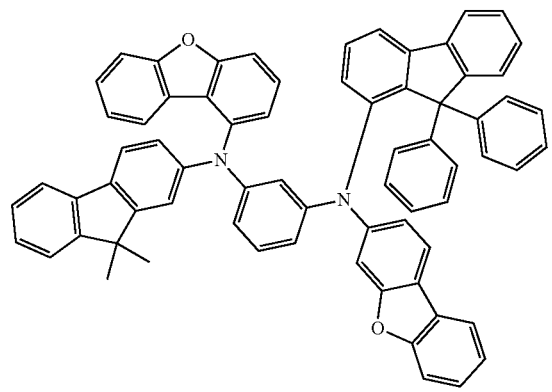
P-49
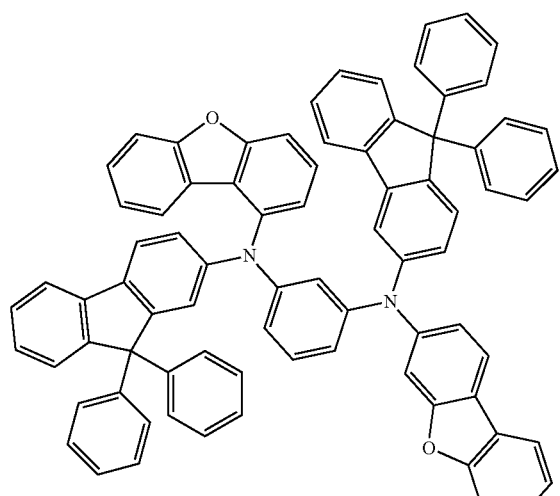
P-50
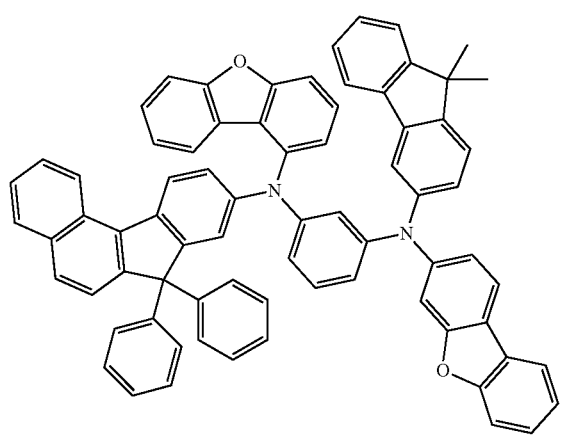
P-51
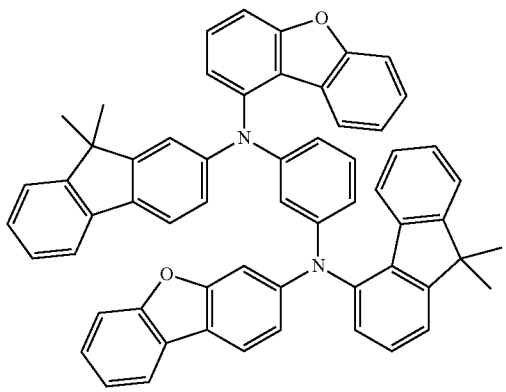
P-52
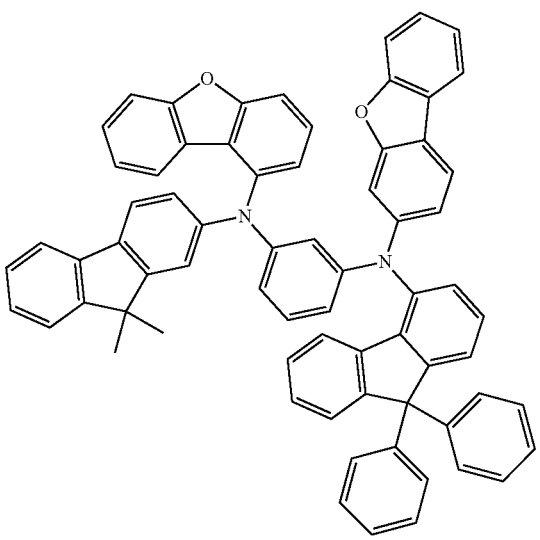
P-53
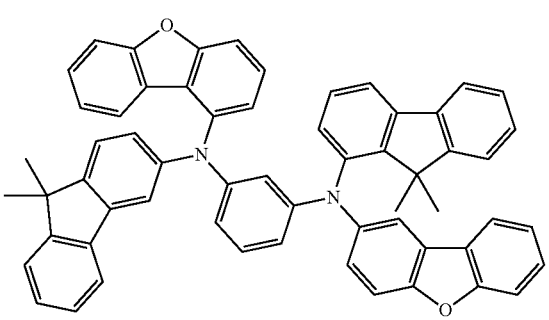

P-54
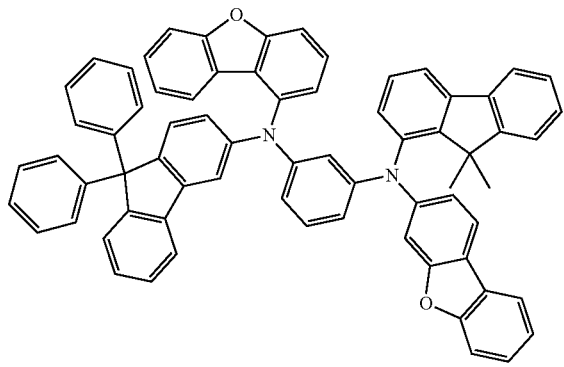
P-55
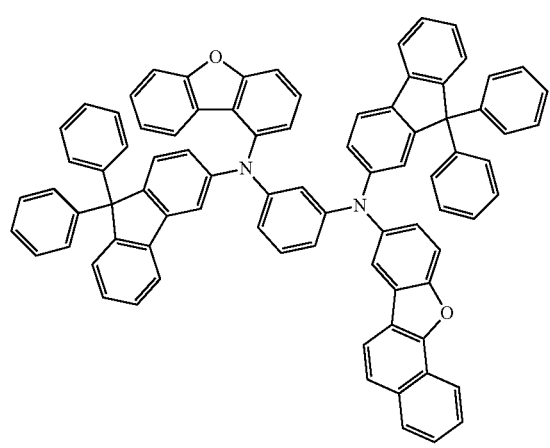
P-56
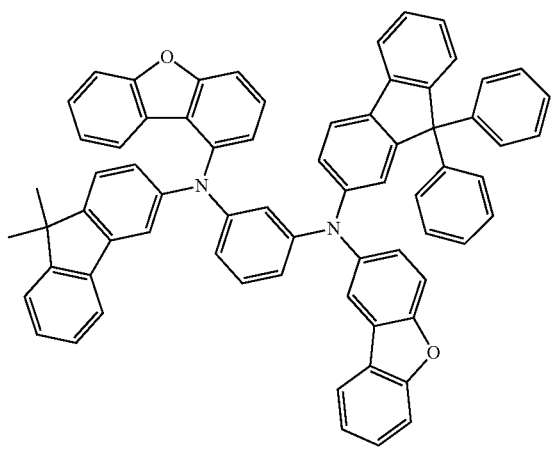
P-57
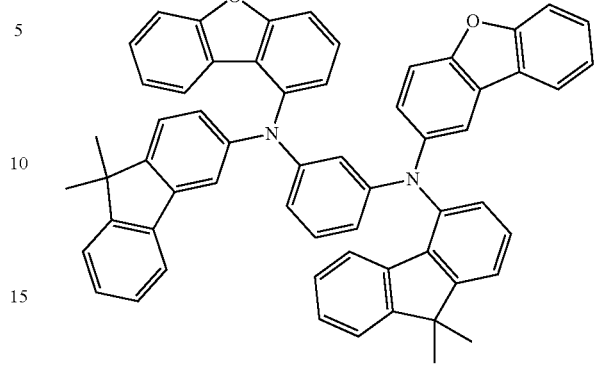
P-58
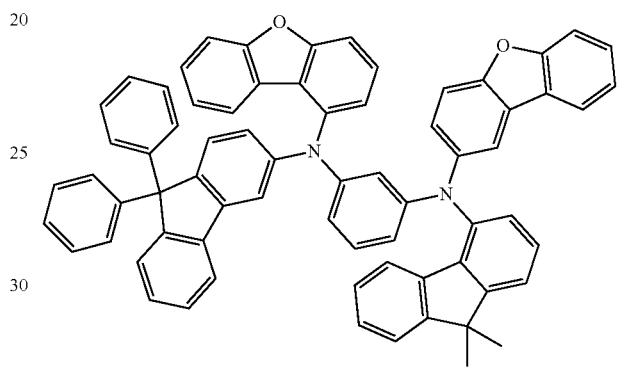
P-59
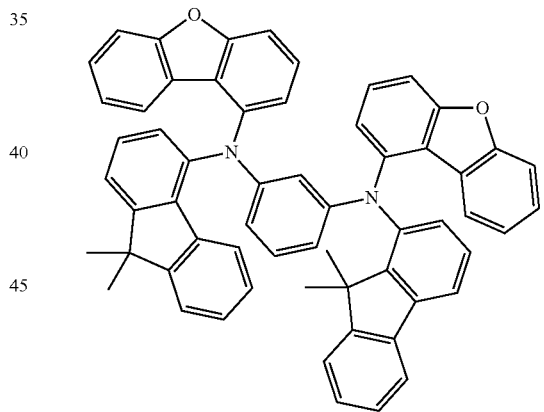
P-60
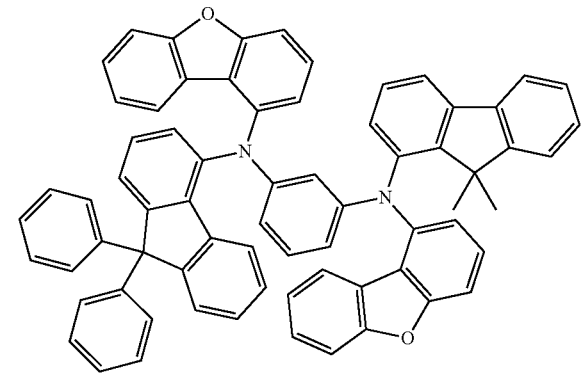

P-61
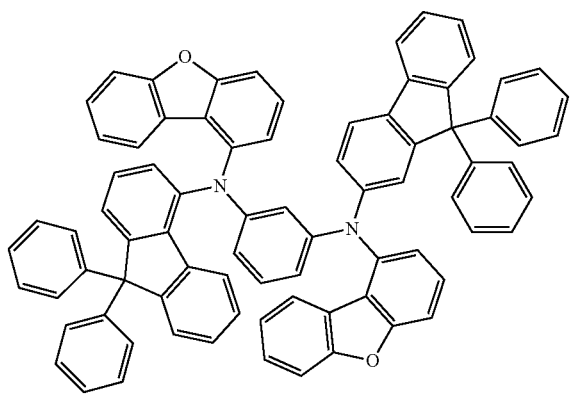
P-62
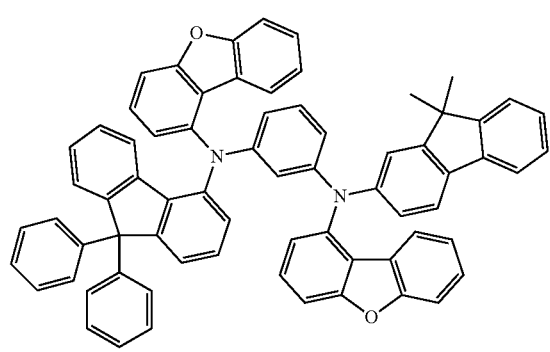
P-63
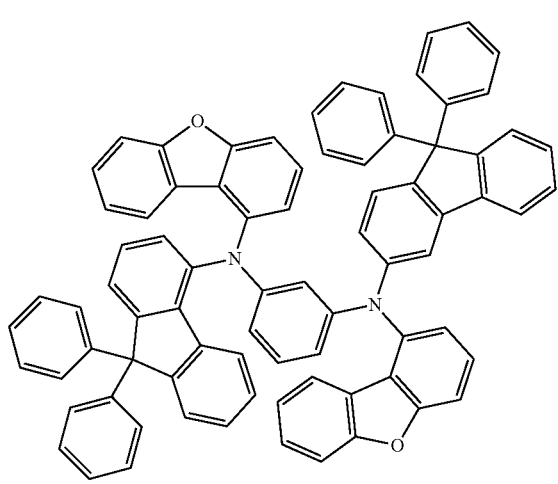
P-64
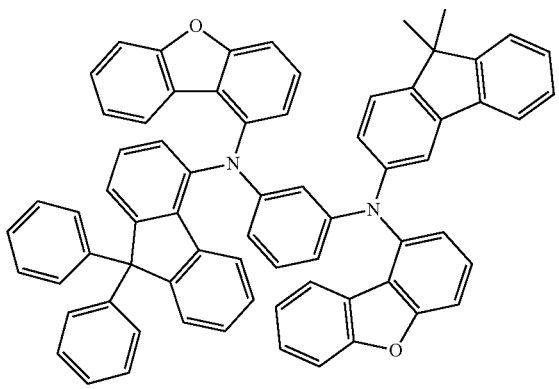
P-65
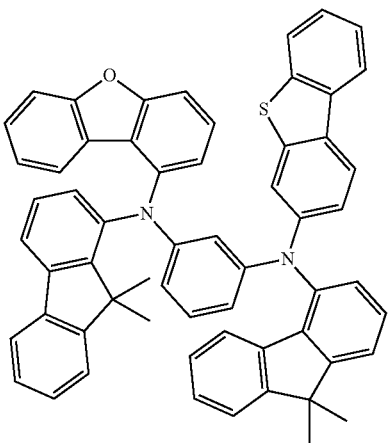
P-66
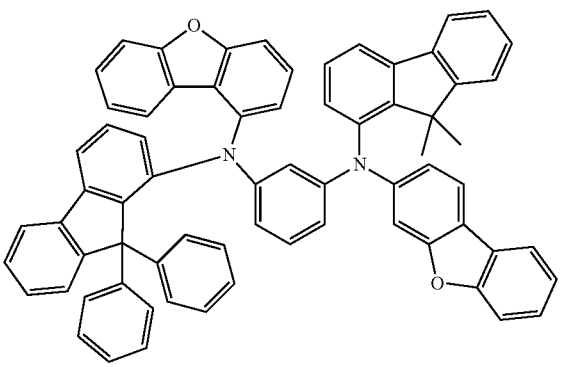
P-67
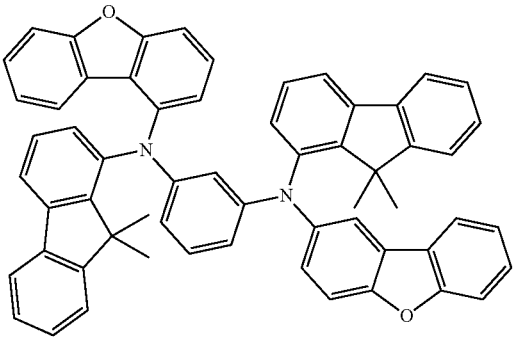

P-68
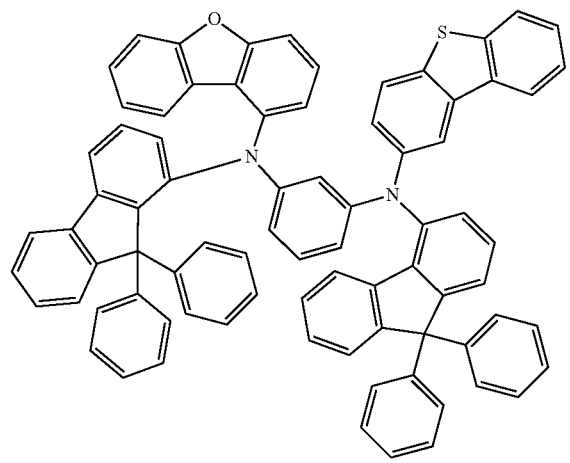
P-69
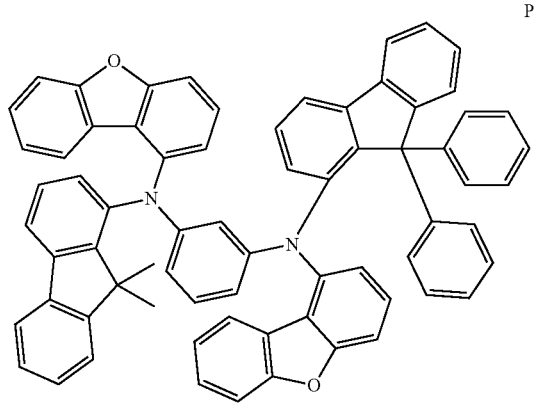
P-70
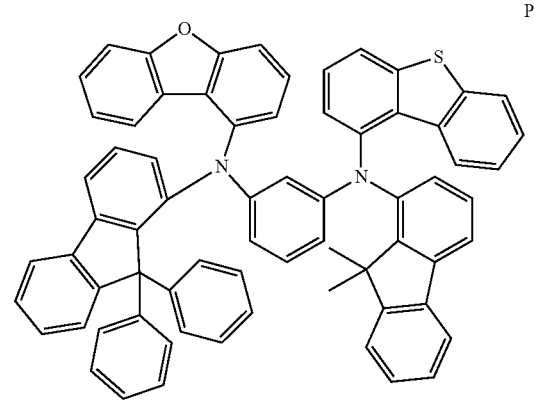
P-71
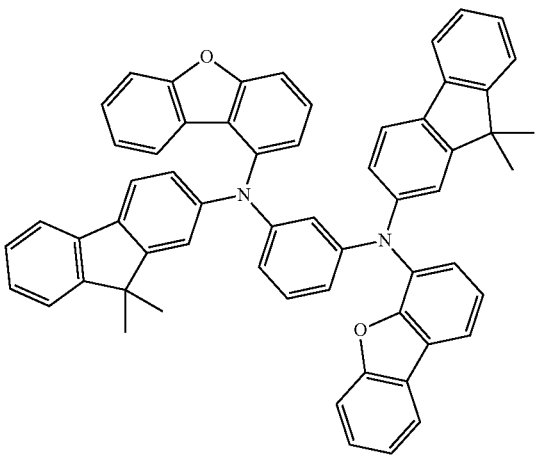
P-72
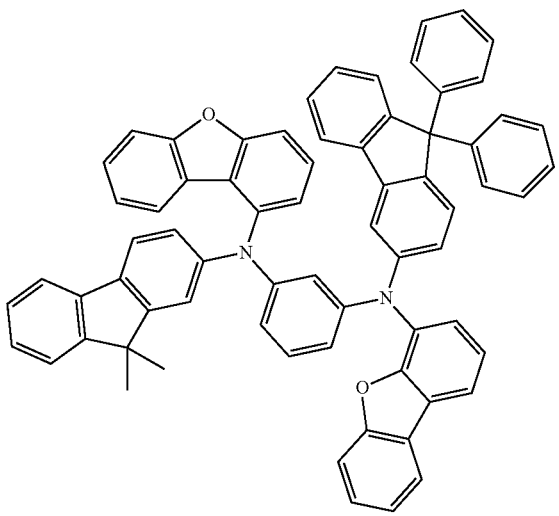
P-73
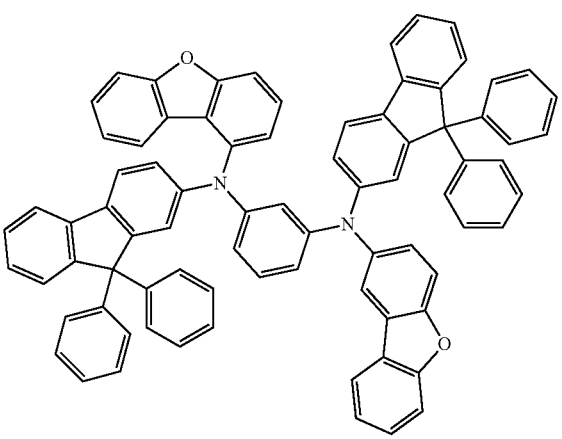

P-74
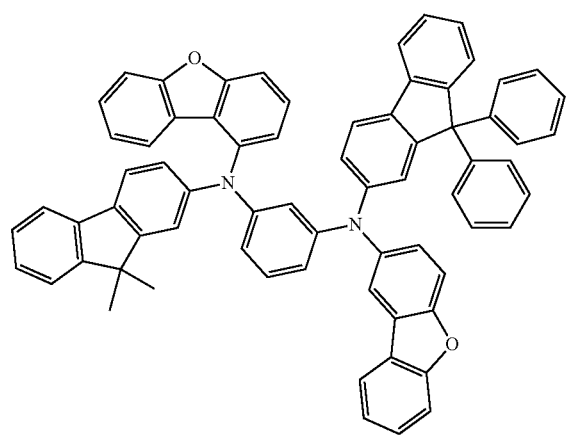
P-75
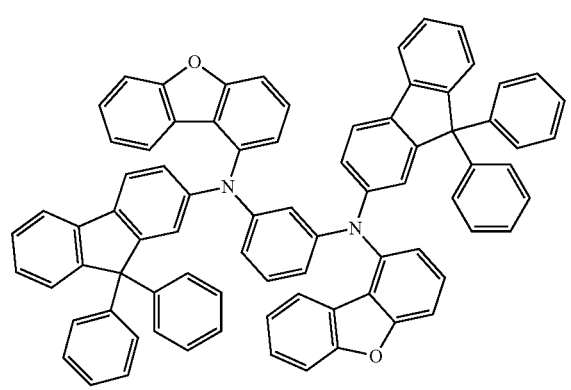
P-76
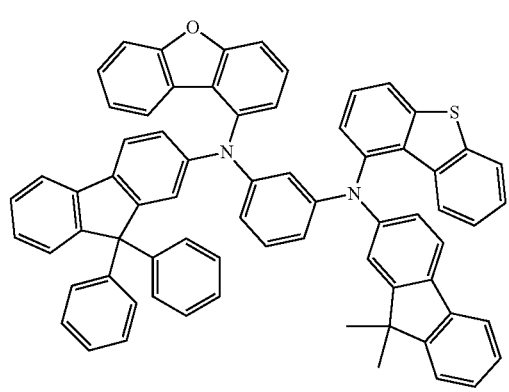
P-77
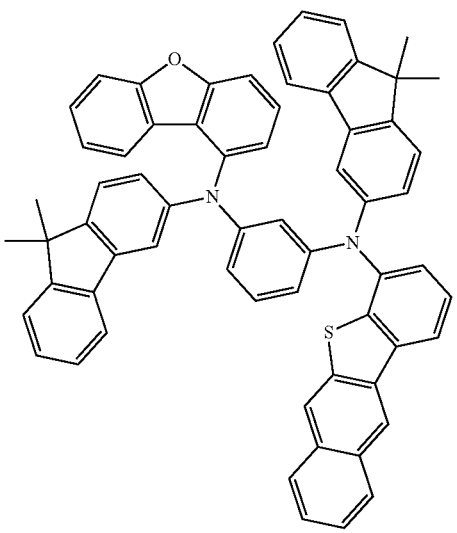
P-78
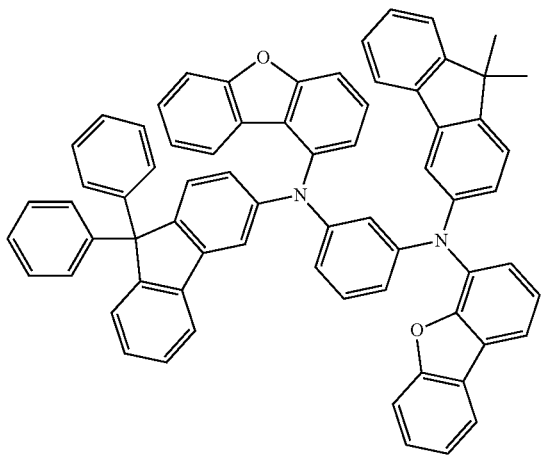
P-79
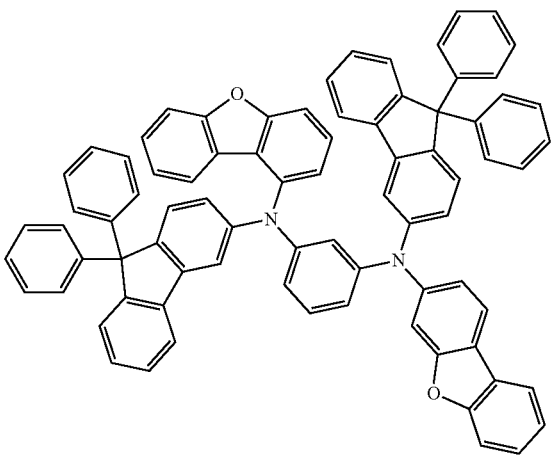

P-80
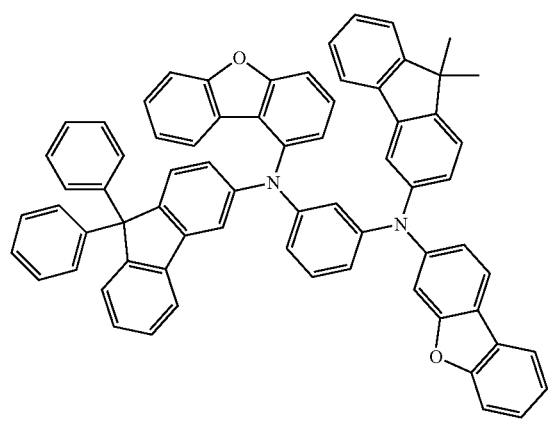
P-81
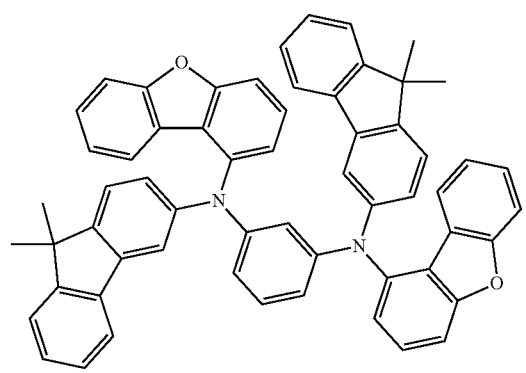
P-82
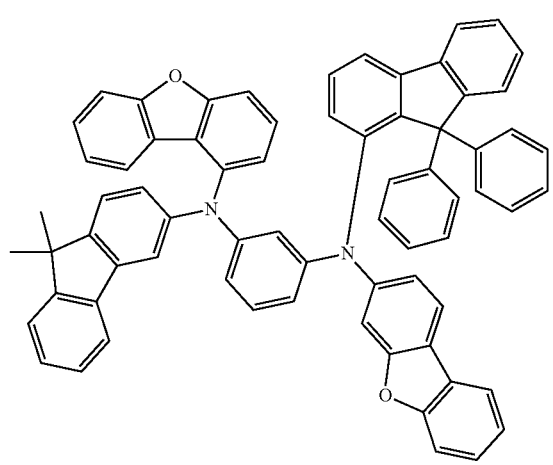
P-83
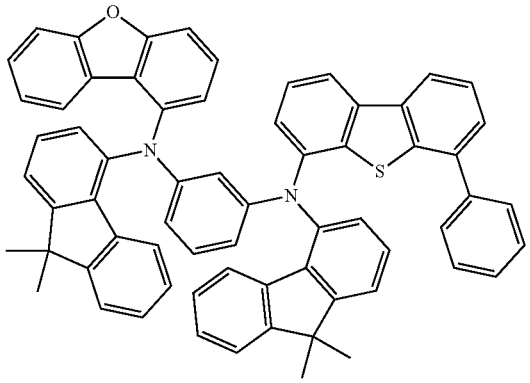
P-84
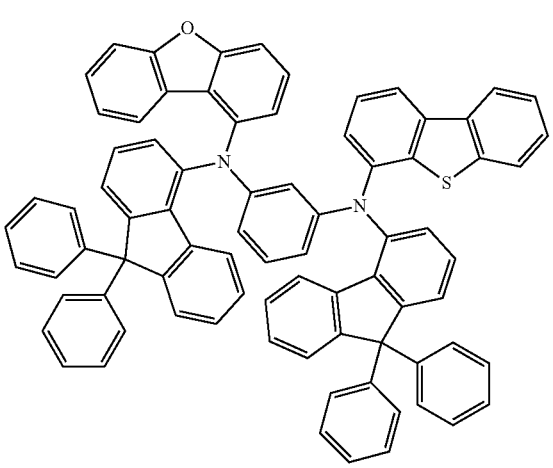
P-85
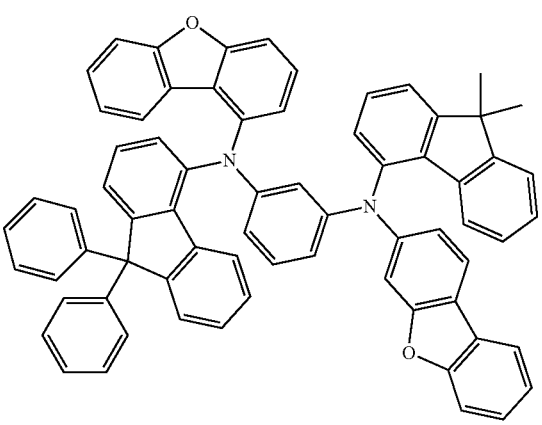

P-86
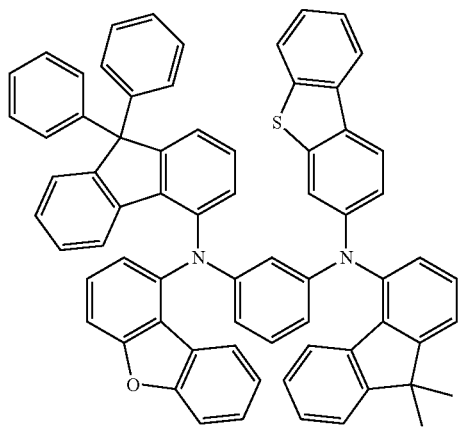
P-87
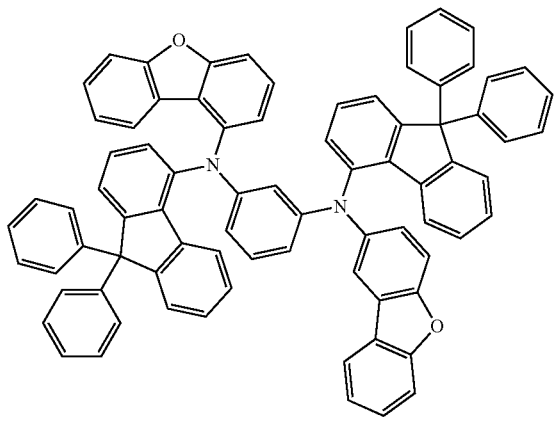
P-88
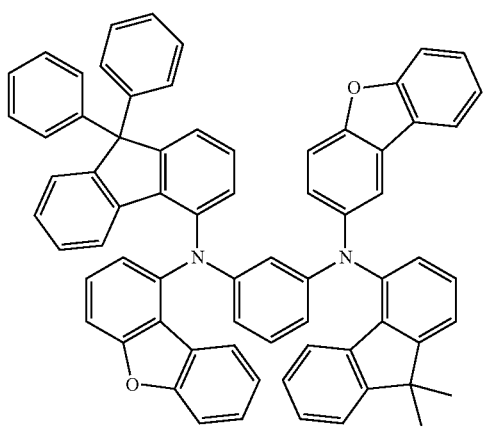
P-89
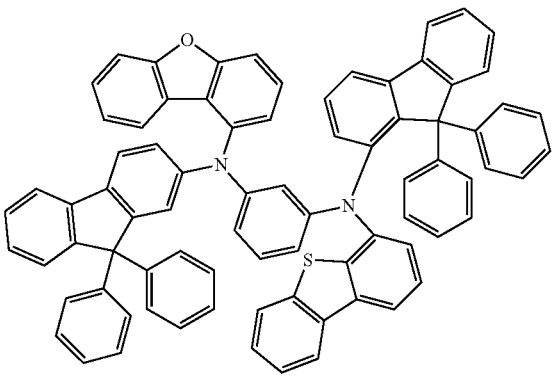
P-90
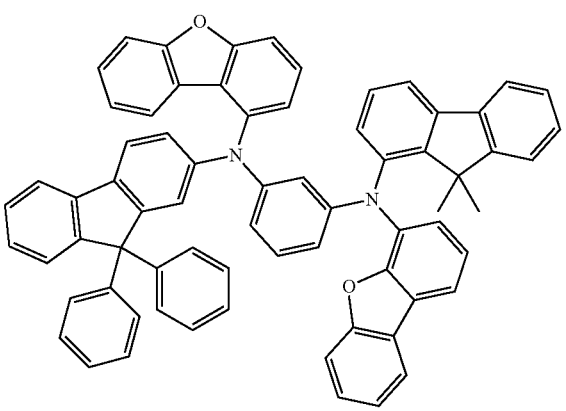
P-91
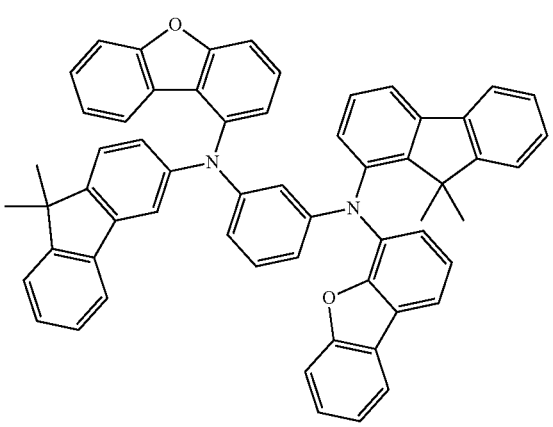

P-92
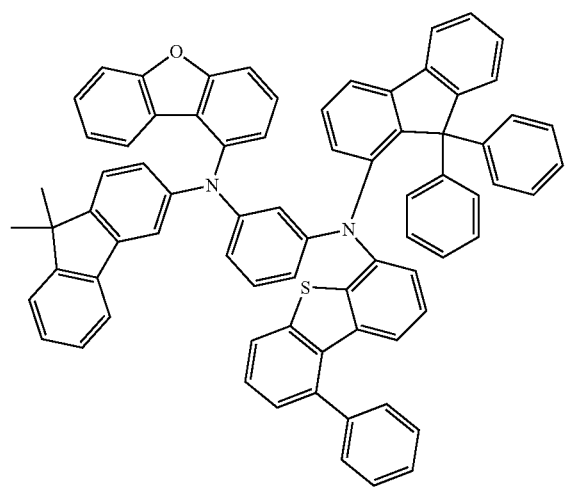
P-93
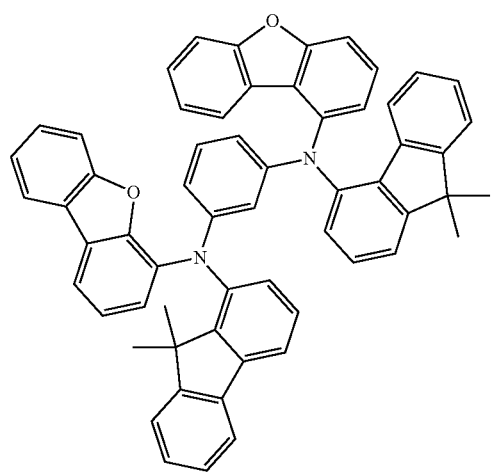
P-94
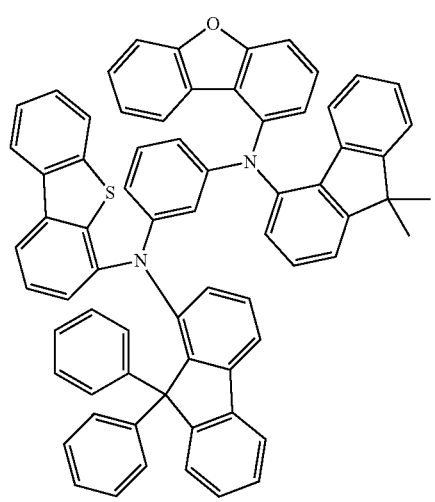
P-95
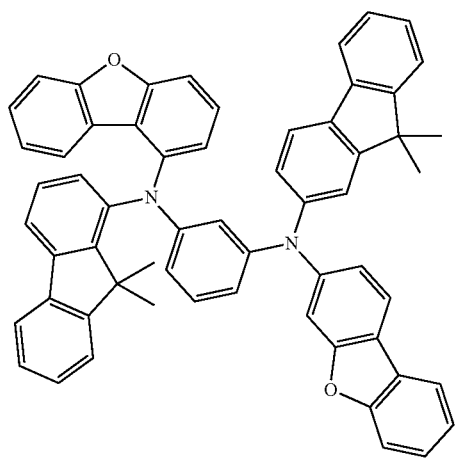
P-96
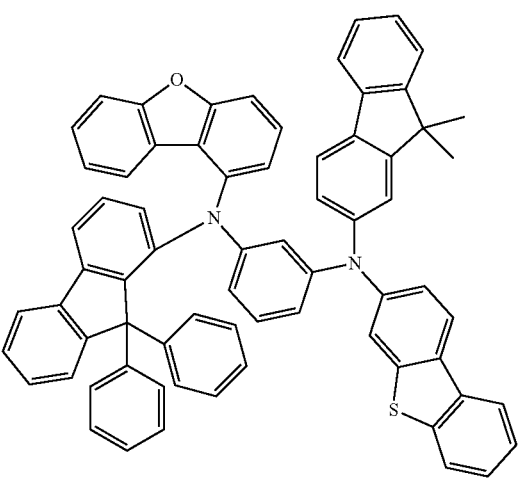
P-97
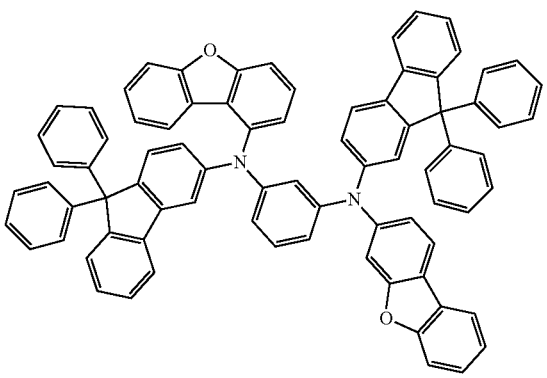

P-98
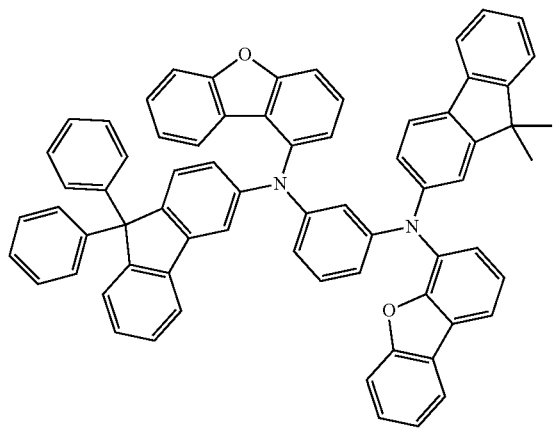
P-101
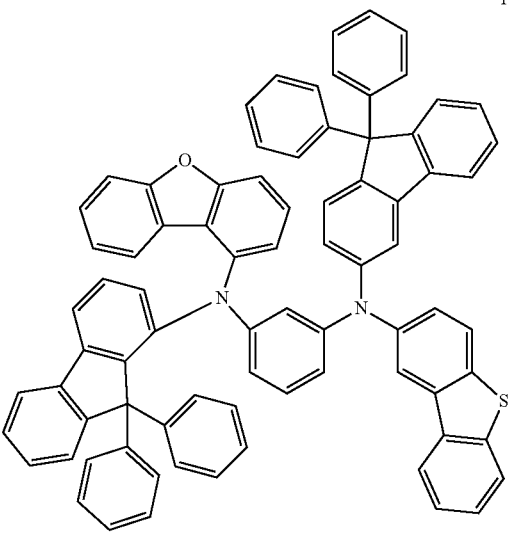
P-99
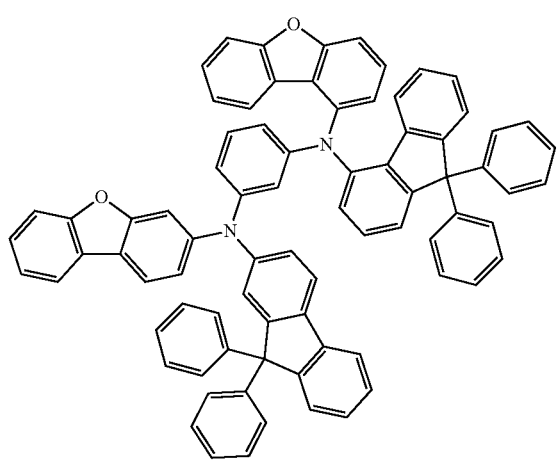
P-102
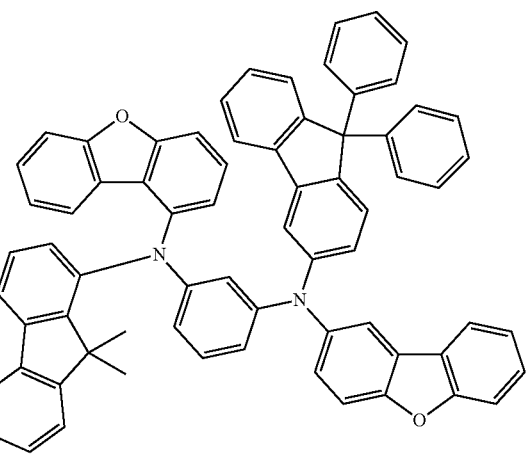
P-100
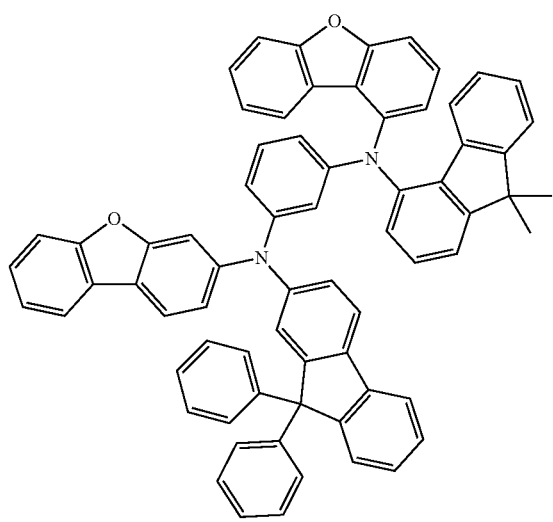
P-103
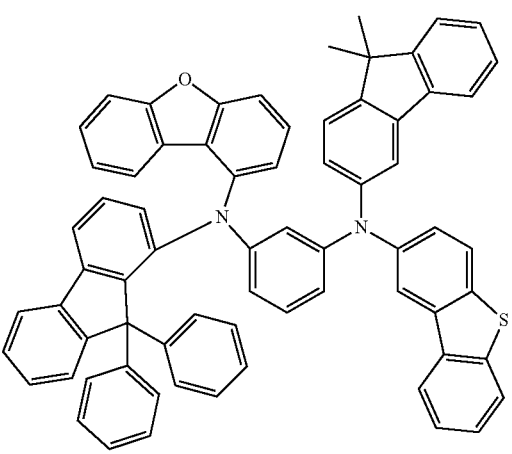

P-104
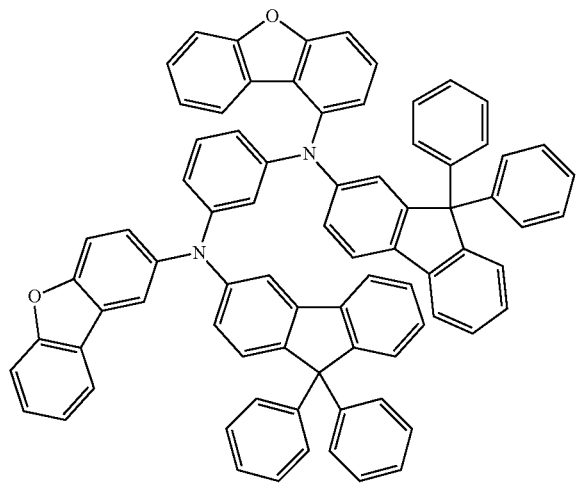
P-107
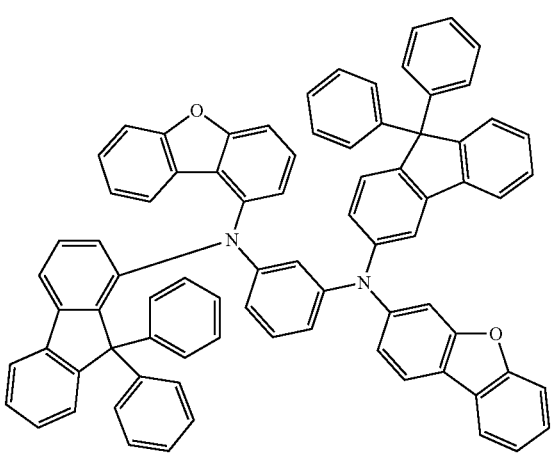
P-105
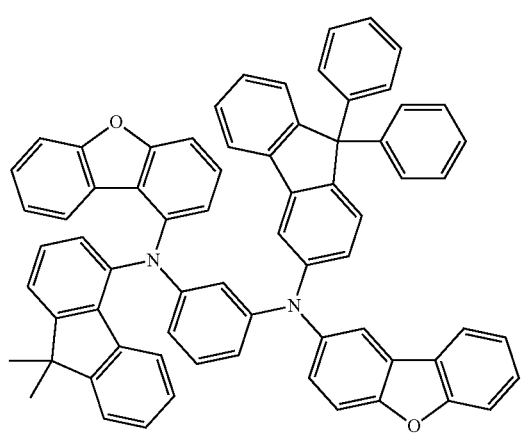
P-108
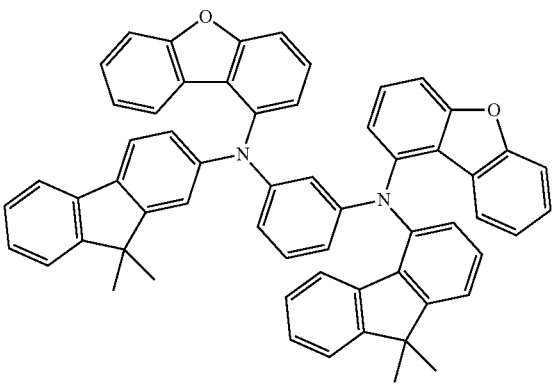
P-106
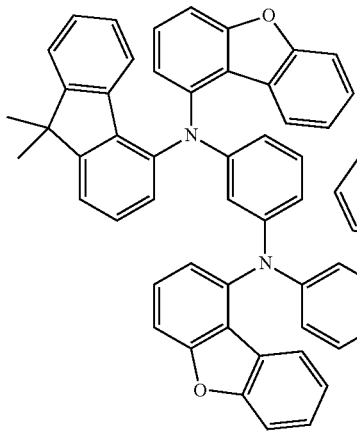
P-109

-continued
P-110
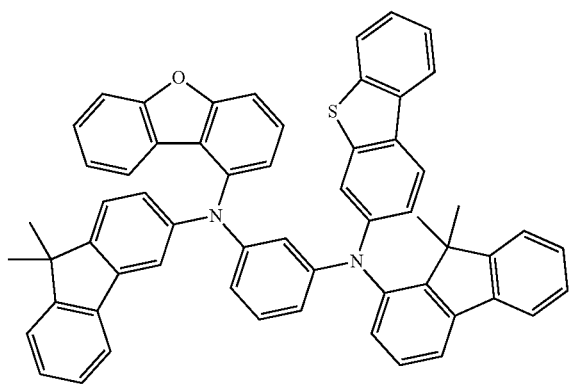
P-111
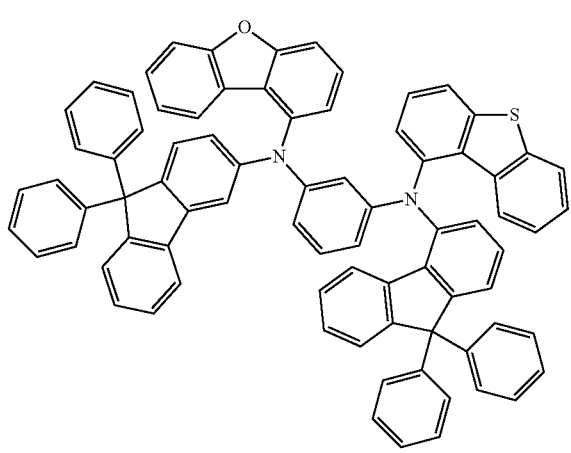
P-112
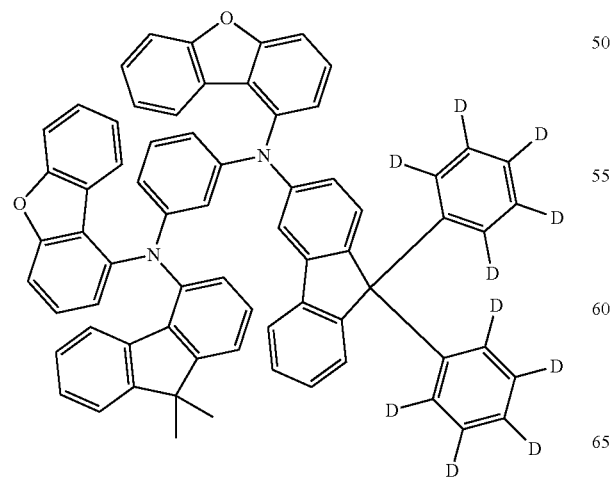
-continued
P-113
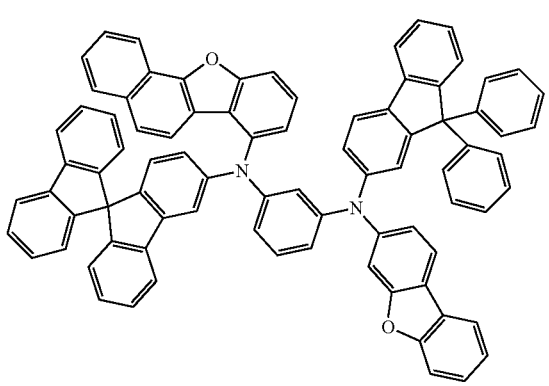
P-114
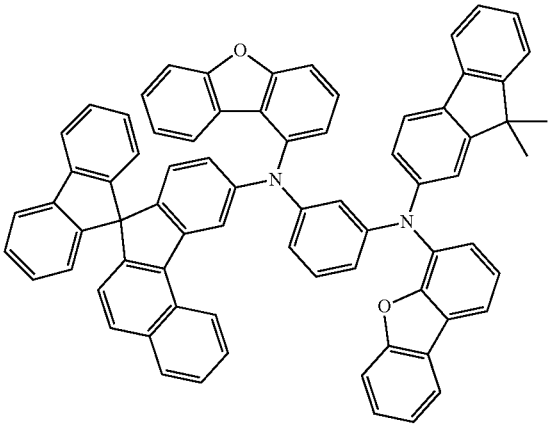
P-115
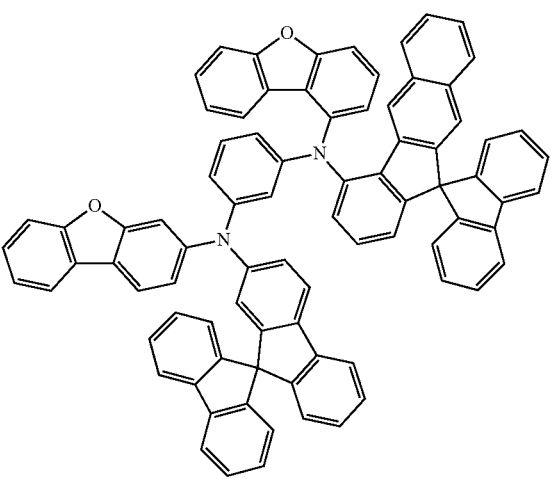

P-116

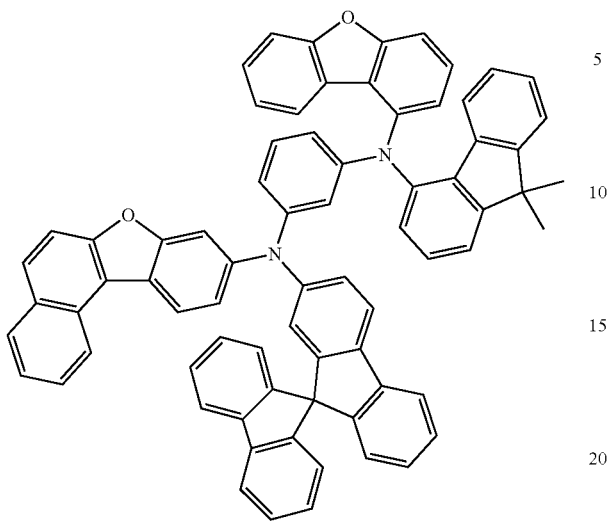

Preferably, the compound represented by Formula 1 may be comprised in an emission-auxiliary layer as a single compound or a mixture of two or more kinds, more preferably, it may be used as material of a green emission-auxiliary layer.

In another aspect of the present invention, the present invention provides an electronic device comprising a display device and a control unit for driving the display device, wherein the display device comprises the organic electric element comprising the compound represented by Formula 1.

Hereinafter, synthesis example of the compound represented by Formula 1 and preparation method of an organic electric element according to one embodiment of the present invention will be described in detail by way of examples. However, the present invention is not limited to the following examples.

SYNTHESIS EXAMPLE

The compound represented by Formula 1 according to the present invention can be synthesized by reacting Sub 1 and Sub 2 as shown in Reaction Scheme 1 below, but there is no limitation thereto.

<Reaction Scheme 1>

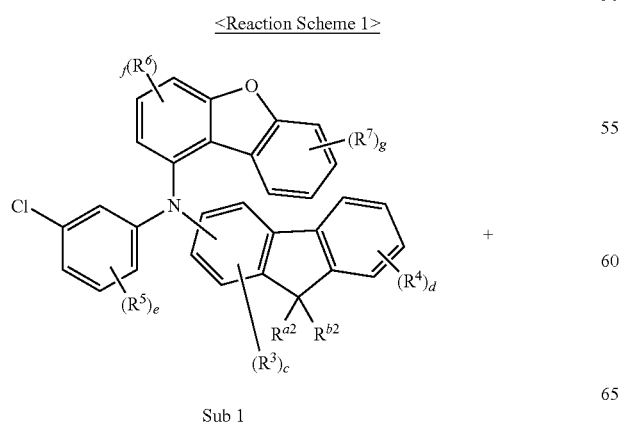

Sub 1

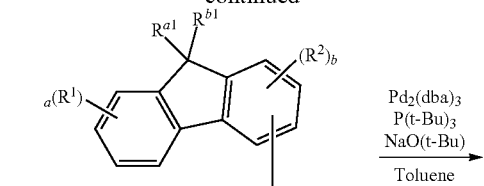

Sub 2

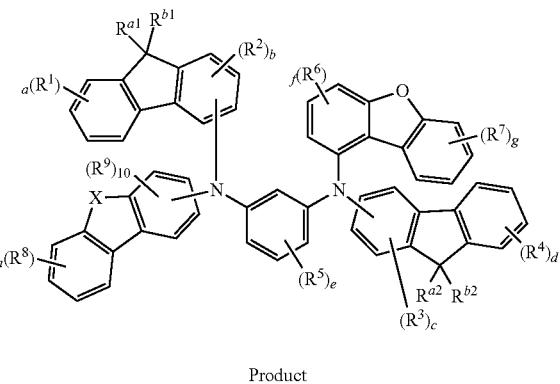

Product

I. Synthesis of Sub 1

Sub 1 of the Reaction Scheme 1 may be synthesized by the reaction route of the following Reaction Scheme 2, but there is no limitation thereto.

<Reaction Scheme 2>

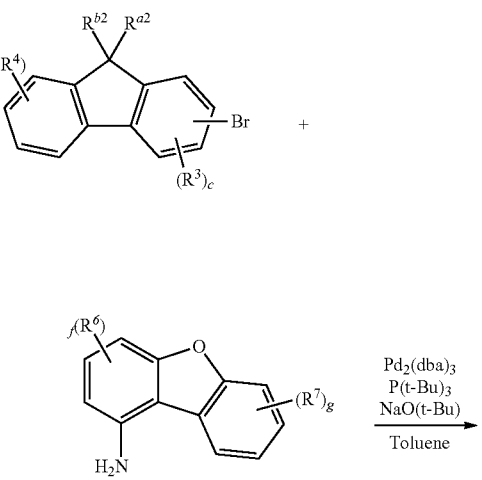

-continued

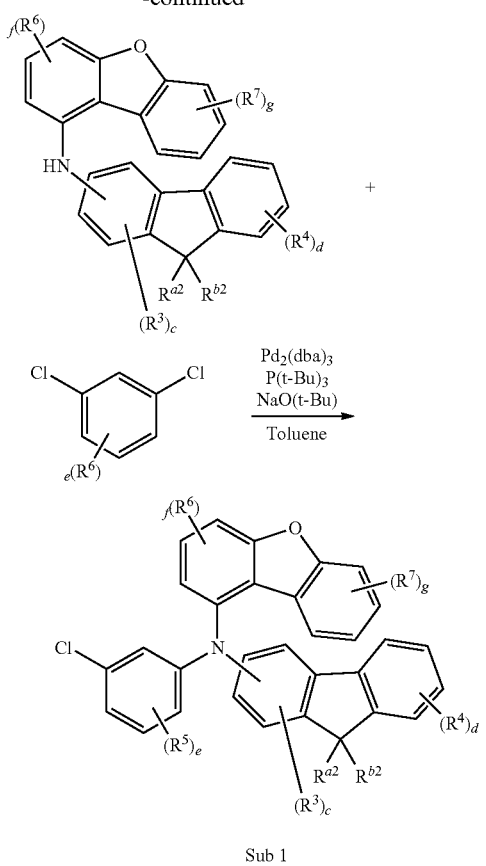

Sub 1

Synthesis Example Sub 1-1

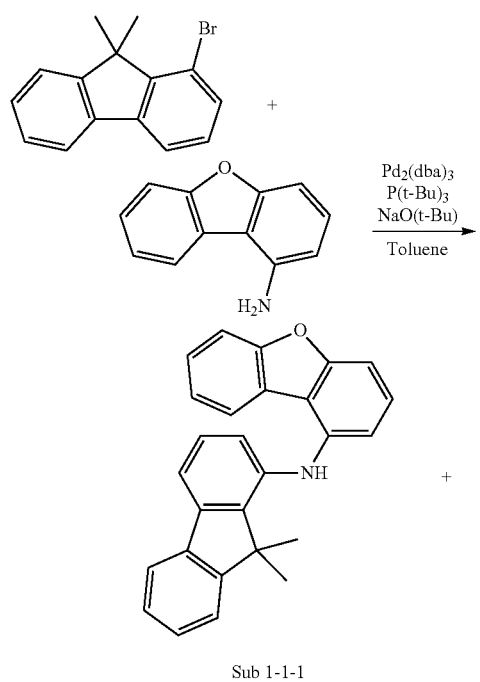

Sub 1-1-1

-continued

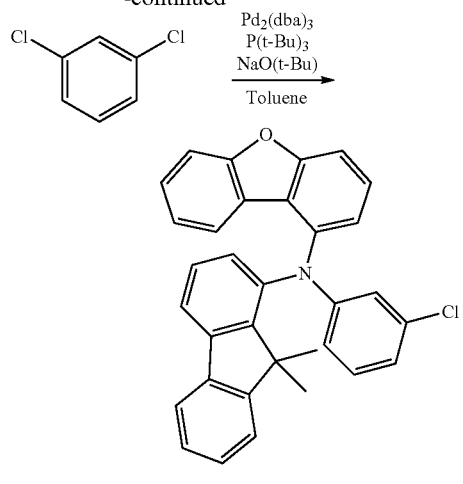

Sub 1-1

(1) Synthesis Method of Sub 1-1-1

1-bromo-9,9-dimethyl-9H-fluorene (50 g, 183.0 mmol), dibenzo[b, d]furan-1-amine (50.30 g, 274.6 mmol), Pd$_2$(dba)$_3$ (5.03 g, 5.5 mmol), P(t-Bu)$_3$ (2.96 g, 14.6 mmol), NaO(t-Bu) (52.77 g, 549.1 mmol) and toluene (2, 300 mL) were placed into a round bottom flask, and the mixture was heated for 4 hours at 60° C. under reflux. When the reaction was completed, the reaction product was diluted by adding distilled water at room temperature and the resultant was extracted with toluene and water. Thereafter, the organic layer was dried with MgSO$_4$ and concentrated, and then the resulting compound was passed through silica gel column and recrystallized to obtain the product Sub 1-1-1 (54.29 g, 79%).

(2) Synthesis Method of Sub 1-1

Sub 1-1-1 (30 g, 79.9 mmol), 1,3-dichlorobenzene (11.75 g, 79.9 mmol), Pd$_2$(dba)$_3$ (2.19 g, 2.4 mmol), P(t-Bu)$_3$ (1.29 g, 6.4 mmol), NaO(t-Bu) (23.04 g, 239.7 mmol) and toluene (800 mL) were placed into a round bottom flask, and the mixture was heated for 8 hours at 90° C. under reflux. When the reaction was completed, the reaction product was diluted by adding distilled water at room temperature and the resultant was extracted with toluene and water. Thereafter, the organic layer was dried with MgSO$_4$ and concentrated, and then the resulting compound was passed through a silica gel column and recrystallized to obtain the product Sub 1-1 (30.29 g, 78%).

Synthesis Example Sub 1-6

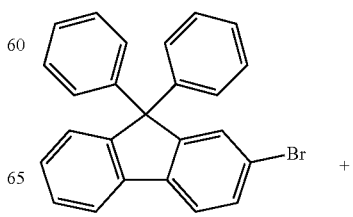

-continued

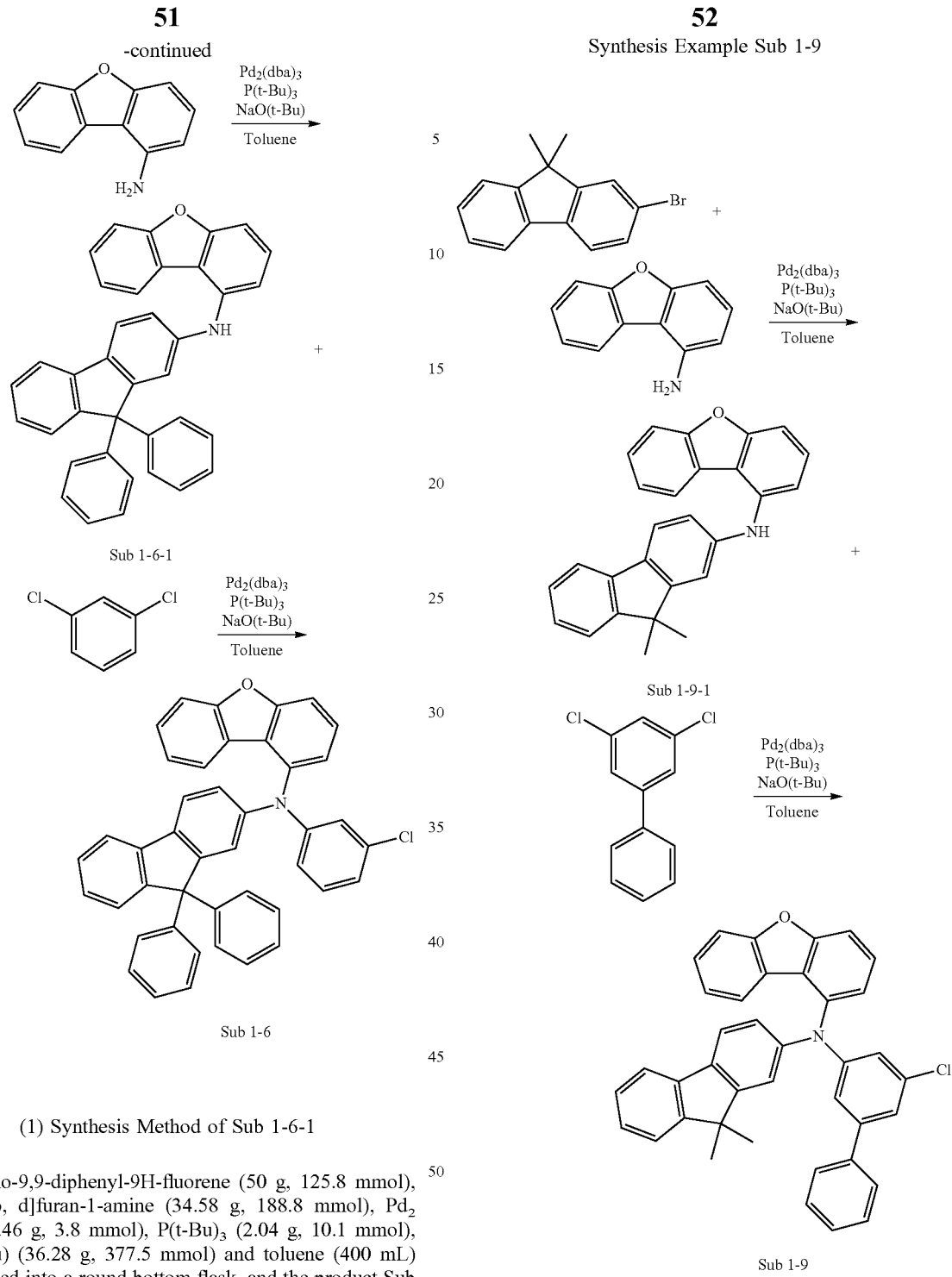

(1) Synthesis Method of Sub 1-6-1

2-bromo-9,9-diphenyl-9H-fluorene (50 g, 125.8 mmol), dibenzo[b, d]furan-1-amine (34.58 g, 188.8 mmol), Pd$_2$(dba)$_3$ (3.46 g, 3.8 mmol), P(t-Bu)$_3$ (2.04 g, 10.1 mmol), NaO(t-Bu) (36.28 g, 377.5 mmol) and toluene (400 mL) were placed into a round bottom flask, and the product Sub 1-6-1 (51.56 g, 82%) was obtained by the same method as in synthesis example of Sub 1-1-1.

(2) Synthesis Method of Sub 1-6

Sub 1-6-1 (30 g, 60.0 mmol), 1,3-dichlorobenzene (8.83 g, 60.0 mmol), Pd$_2$(dba)$_3$ (1.65 g, 1.8 mmol), P(t-Bu)$_3$ (0.97 g, 4.8 mmol), NaO(t-Bu) (17.31 g, 180.1 mmol) and toluene (600 mL) were placed into a round bottom flask, and the product Sub 1-6 (29.68 g, 81%) was obtained by the same method as in synthesis example of Sub 1-1.

Synthesis Example Sub 1-9

(1) Synthesis Method of Sub 1-9-1

2-bromo-9,9-dimethyl-9H-fluorene (50 g, 183.0 mmol), dibenzo[b, d]furan-1-amine (50.30 g, 274.6 mmol), Pd$_2$(dba)$_3$ (5.03 g, 5.5 mmol), P(t-Bu)$_3$ (2.96 g, 14.6 mmol), NaO(t-Bu) (52.77 g, 549.1 mmol) and toluene (2300 mL) were placed into a round bottom flask, and the product Sub 1-9-1 (54.98 g, 80%) was obtained by the same method as in synthesis example of Sub 1-1-1.

(2) Synthesis Method of Sub 1-9

Sub 1-9-1 (30 g, 79.9 mmol), 3,5-dichloro-1, 1'-biphenyl (17.83 g, 79.9 mmol), Pd$_2$(dba)$_3$ (2.19 g, 2.4 mmol), P(t-Bu)$_3$ (1.29 g, 6.4 mmol), NaO(t-Bu) (23.04 g, 239.7 mmol) and toluene (800 mL) were placed into a round bottom flask, and the product Sub 1-9 (33.68 g, 75%) was obtained by the same method as in synthesis example of Sub 1-1.

Synthesis Example Sub 1-11

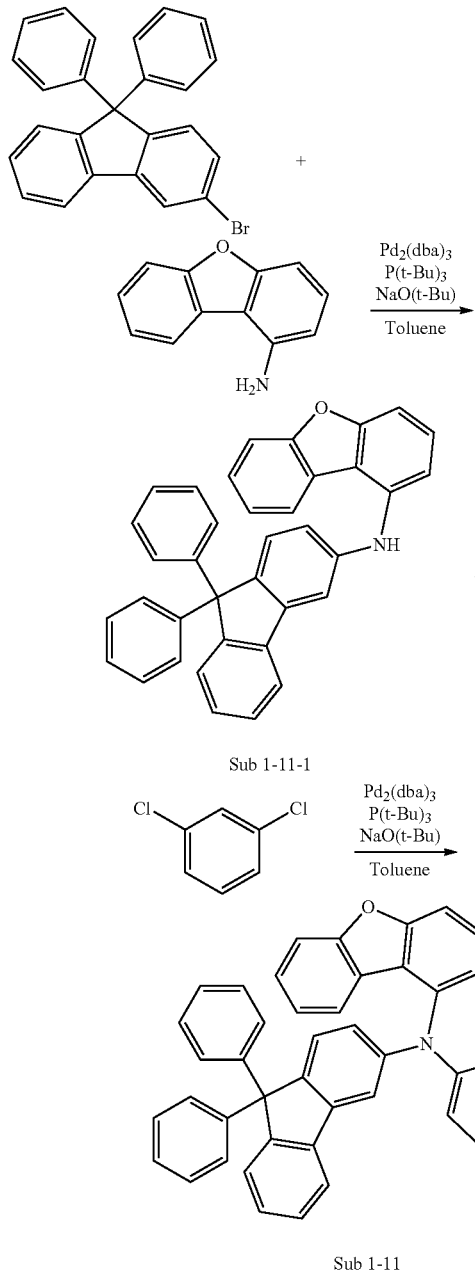

Sub 1-11

(1) Synthesis Method of Sub 1-11-1

3-bromo-9,9-diphenyl-9H-fluorene (50 g, 125.8 mmol), dibenzo[b, d]furan-1-amine (34.58 g, 188.8 mmol), Pd$_2$(dba)$_3$ (3.46 g, 3.8 mmol), P(t-Bu)$_3$ (2.04 g, 10.1 mmol), NaO(t-Bu) (36.28 g, 377.5 mmol) and toluene (1600 mL) were placed into a round bottom flask, and the product Sub 1-11-1 (49.67 g, 79%) was obtained by the same method as in synthesis example of Sub 1-1-1.

(2) Synthesis Method of Sub 1-11

Sub 1-11-1 (30 g, 60.0 mmol), 1,3-dichlorobenzene (8.83 g, 60.0 mmol), Pd$_2$(dba)$_3$ (1.65 g, 1.8 mmol), P(t-Bu)$_3$ (0.97 g, 4.8 mmol), NaO(t-Bu) (17.31 g, 180.1 mmol) and toluene (600 mL) were placed into a round bottom flask, and the product Sub 1-11 (30.41 g, 83%) was obtained by the same method as in synthesis example of Sub 1-1.

Synthesis Example Sub 1-15

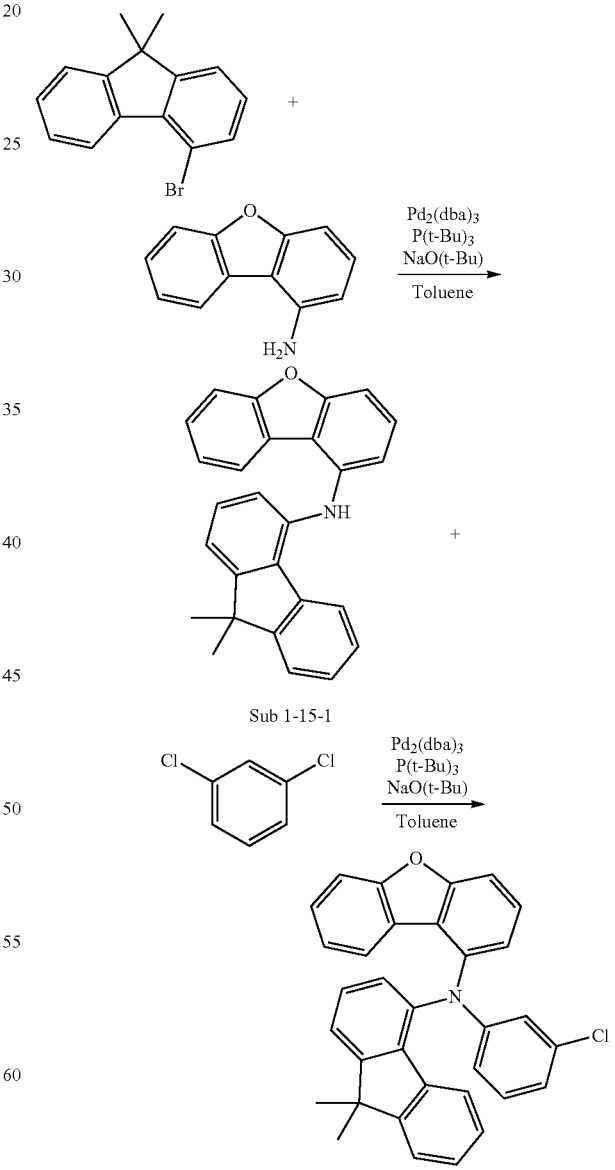

Sub 1-15

(1) Synthesis Method of Sub 1-15-1

4-bromo-9,9-dimethyl-9H-fluorene (50 g, 183.0 mmol), dibenzo[b, d]furan-1-amine (50.30 g, 274.6 mmol), Pd$_2$(dba)$_3$ (5.03 g, 5.5 mmol), P(t-Bu)$_3$ (2.96 g, 14.6 mmol), NaO(t-Bu) (52.77 g, 549.1 mmol) and toluene (2300 mL) were placed into a round bottom flask, and the product Sub 1-15-1 (53.61 g, 78%) was obtained by the same method as in synthesis example of Sub 1-1-1.

(2) Synthesis Method of Sub 1-15

Sub 1-15-1 (30 g, 79.9 mmol), 1,3-dichlorobenzene (11.75 g, 79.9 mmol), Pd$_2$(dba)$_3$ (2.19 g, 2.4 mmol), P(t-Bu)$_3$ (1.29 g, 6.4 mmol), NaO(t-Bu) (23.04 g, 239.7 mmol) and toluene (800 mL) were placed into a round bottom flask, and the product Sub 1-15 (31.45 g, 81%) was obtained by the same method as in synthesis example of Sub 1-1.

Synthesis Example Sub 1-17

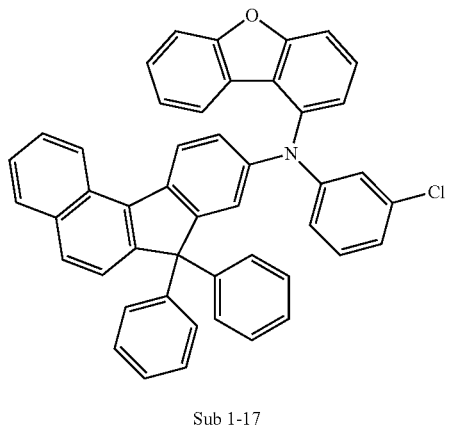

Sub 1-17

(1) Synthesis Method of Sub 1-17-1

9-bromo-7,7-diphenyl-7H-benzo[c]fluorine (50 g, 111.8 mmol), dibenzo[b, d]furan-1-amine (30.71 g, 167.6 mmol), Pd$_2$(dba)$_3$ (3.07 g, 3.4 mmol), P(t-Bu)$_3$ (1.81 g, 8.9 mmol), NaO(t-Bu) (32.22 g, 335.3 mmol) and toluene (1400 mL) were placed into a round bottom flask, and the product Sub 1-17-1 (47.30 g, 77%) was obtained by the same method as in synthesis example of Sub 1-1-1.

(2) Synthesis Method of Sub 1-17

Sub 1-17-1 (30 g, 54.6 mmol), 1,3-dichlorobenzene (8.02 g, 54.6 mmol), Pd$_2$(dba)$_3$ (1.50 g, 1.6 mmol), P(t-Bu)$_3$ (0.88 g, 4.4 mmol), NaO(t-Bu) (15.74 g, 163.7 mmol) and toluene (550 mL) were placed into a round bottom flask, and the product Sub 1-17 (28.83 g, 80%) was obtained by the same method as in synthesis example of Sub 1-1.

The compounds belonging to Sub 1 synthesized by the synthesis above may be, but not limited to, the following compounds, and Table 1 shows the FD-MS values of the following compounds.

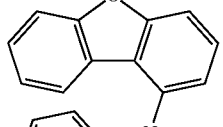

Sub 1-1

Sub 1-2
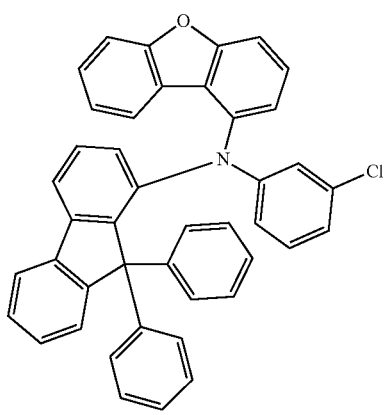
Sub 1-6
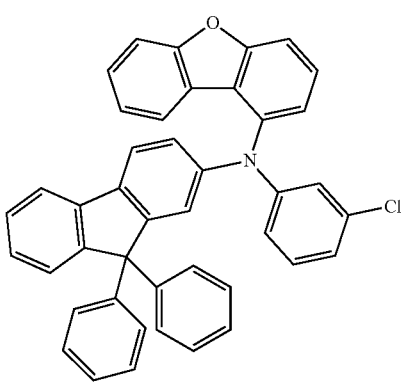
Sub 1-3
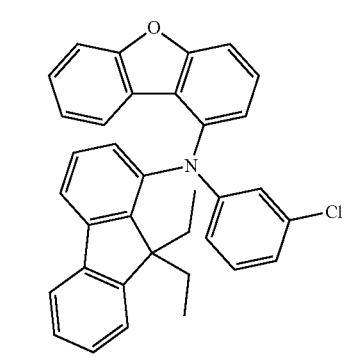
Sub 1-7
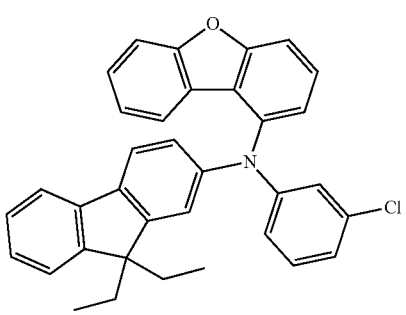
Sub 1-4
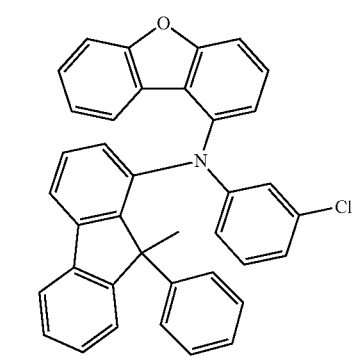
Sub 1-8
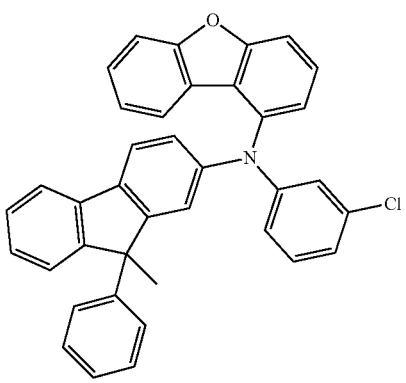
Sub 1-5
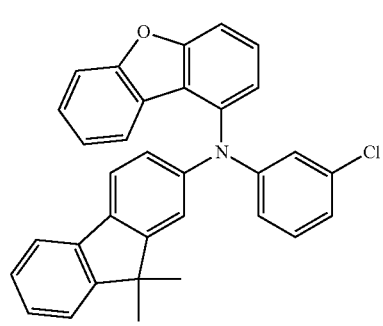
Sub 1-9
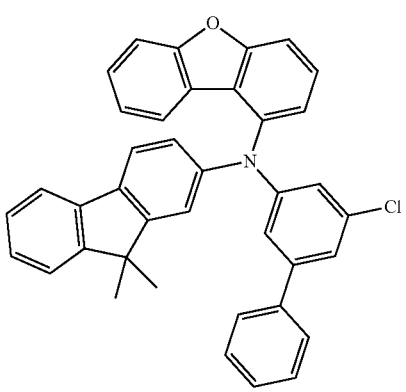

Sub 1-10
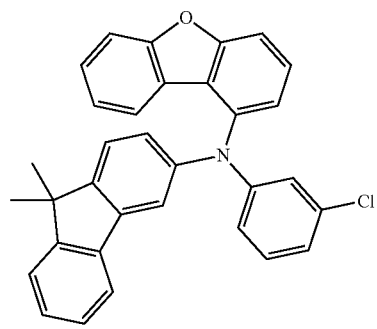
Sub 1-11
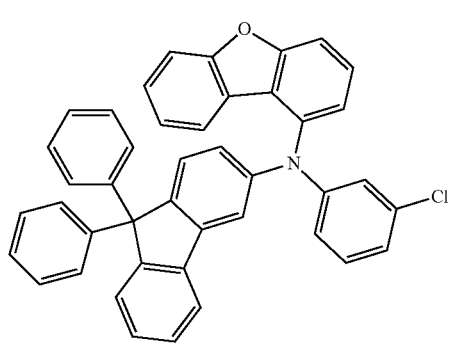
Sub 1-12
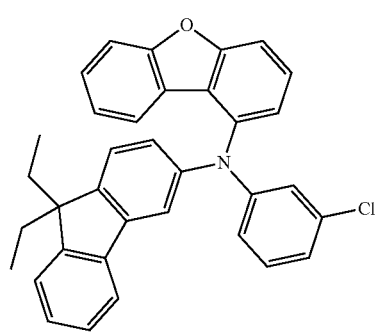
Sub 1-13
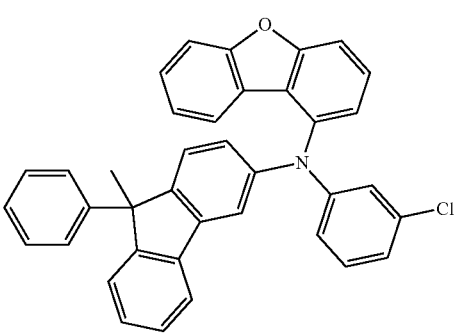
Sub 1-14
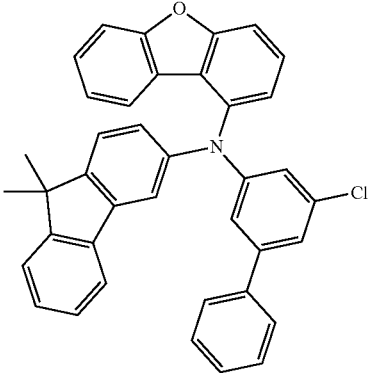
Sub 1-15
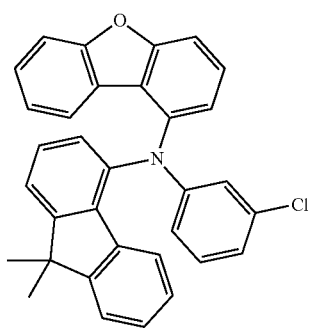
Sub 1-16
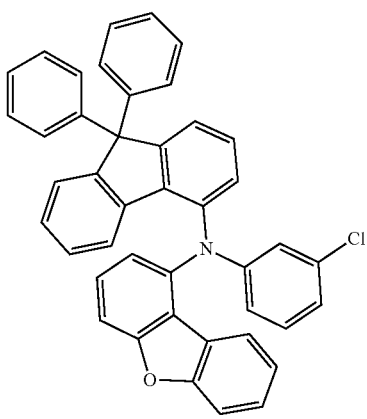
Sub 1-17
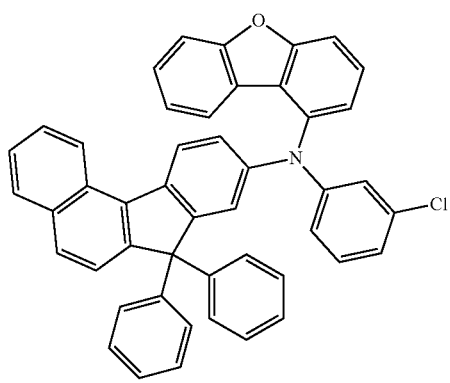

Sub 1-18

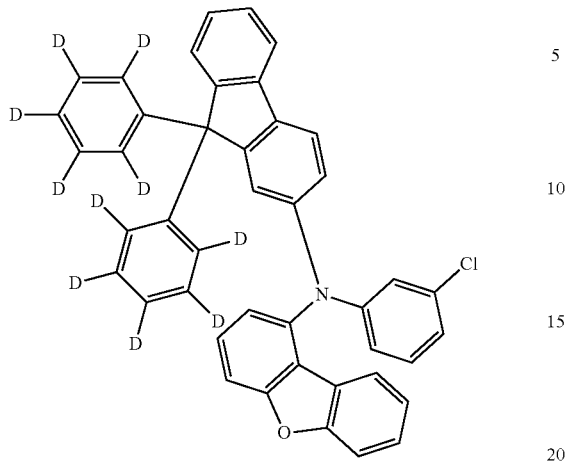

TABLE 1

| Compound | FD-MS | Compound | FD-MS |
| --- | --- | --- | --- |
| Sub 1-1 | m/z = 845.15 ($C_{33}H_{24}ClNO$ = 486.01) | Sub 1-2 | m/z = 609.19 ($C_{43}H_{28}ClNO$ = 610.15) |
| Sub 1-3 | m/z = 513.19 ($C_{35}H_{28}ClNO$ = 514.07) | Sub 1-4 | m/z = 547.17 ($C_{38}H_{26}ClNO$ = 548.08) |
| Sub 1-5 | m/z = 485.15 ($C_{33}H_{24}ClNO$ = 486.01) | Sub 1-6 | m/z = 609.19 ($C_{43}H_{28}ClNO$ = 610.15) |
| Sub 1-7 | m/z = 513.19 ($C_{35}H_{28}ClNO$ = 514.07) | Sub 1-8 | m/z = 547.17 ($C_{38}H_{26}ClNO$ = 548.08) |
| Sub 1-9 | m/z = 561.19 ($C_{39}H_{28}ClNO$ = 562.11) | Sub 1-10 | m/z = 485.15 ($C_{33}H_{24}ClNO$ = 486.01) |
| Sub 1-11 | m/z = 609.19 ($C_{43}H_{28}ClNO$ = 610.15) | Sub 1-12 | m/z = 513.19 ($C_{35}H_{28}ClNO$ = 514.07) |
| Sub 1-13 | m/z = 547.17 ($C_{38}H_{26}ClNO$ = 548.08) | Sub 1-14 | m/z = 561.19 ($C_{39}H_{28}ClNO$ = 562.11) |
| Sub 1-15 | m/z = 485.15 ($C_{33}H_{24}ClNO$ = 846.01) | Sub 1-16 | m/z = 609.15 ($C_{43}H_{28}ClNO$ = 610.15) |
| Sub 1-17 | m/z = 659.20 ($C_{47}H_{30}ClNO$ = 660.21) | Sub 1-18 | m/z = 619.25 ($C_{43}H_{18}D_{10}ClNO$ = 620.21) |

II. Example of Sub 2

The compounds belonging to Sub 2 may be, but not limited to, the following compounds, and Table 2 shows the FD-MS values of the following compounds.

Sub 2-1

Sub 2-2

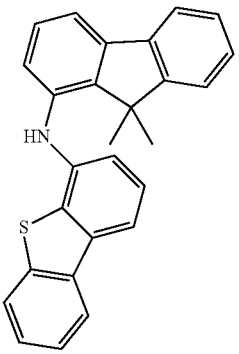

Sub 2-3

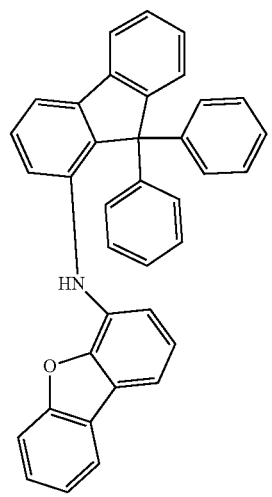

Sub 2-4
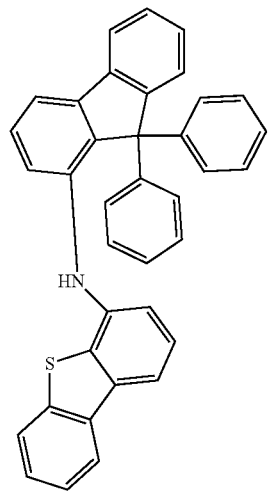
Sub 2-5
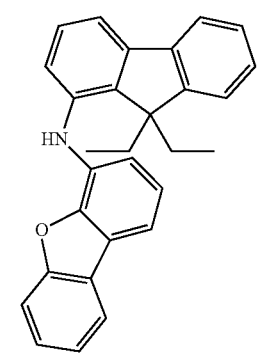
Sub 2-6
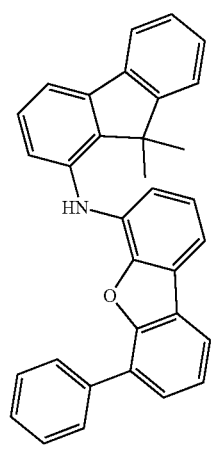
Sub 2-7
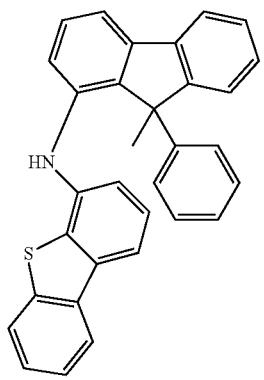
Sub 2-8
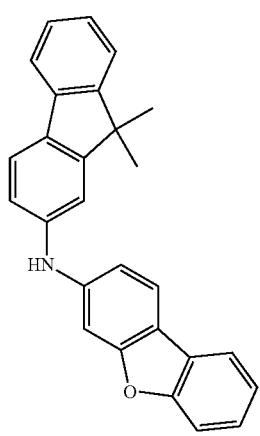
Sub 2-9
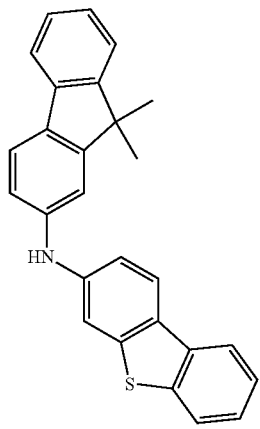

Sub 2-10
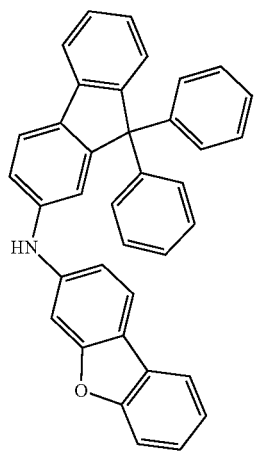
Sub 2-11
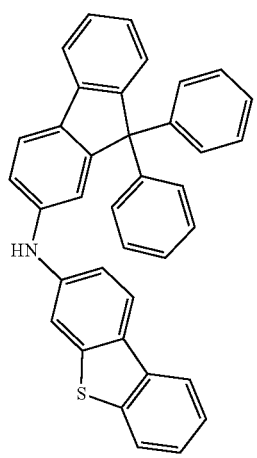
Sub 2-12
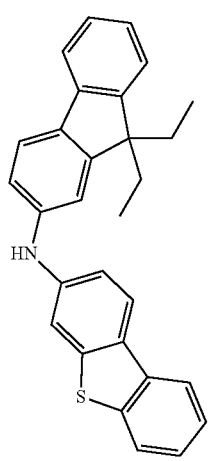
Sub 2-13
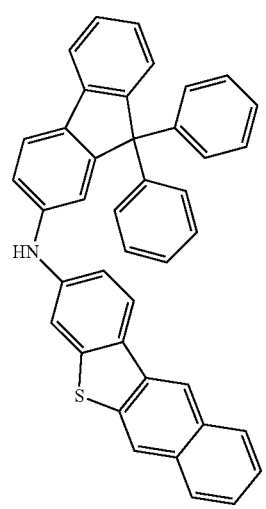
Sub 2-14
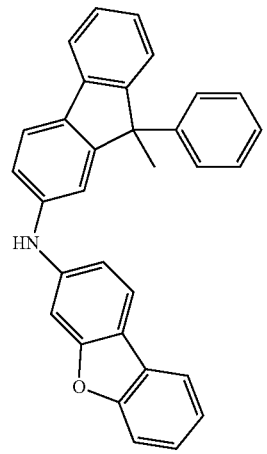
Sub 2-15
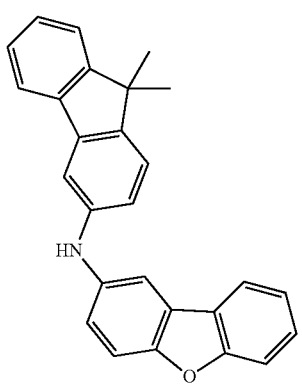

Sub 2-16
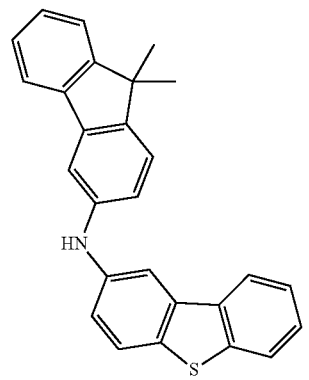
Sub 2-17
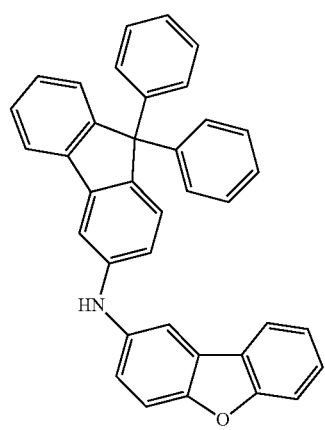
Sub 2-18
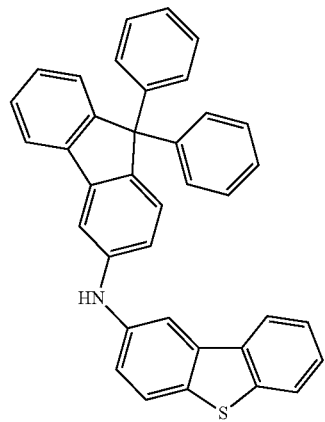
Sub 2-19
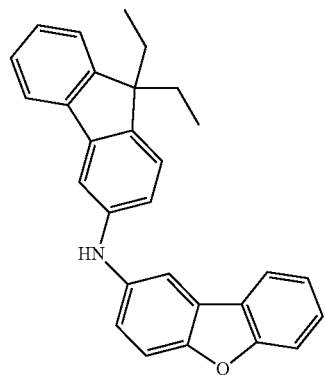
Sub 2-20
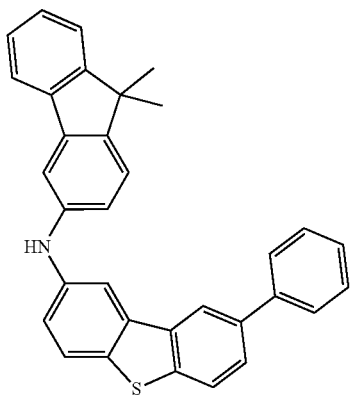
Sub 2-21
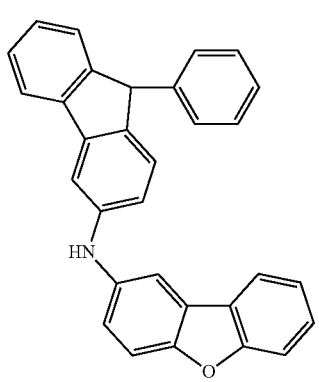
Sub 2-22
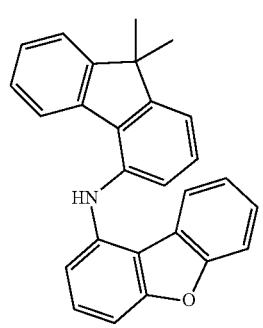
Sub 2-23
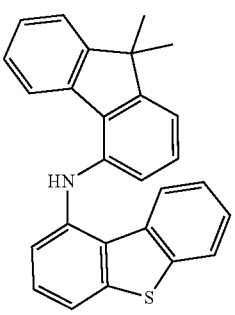

Sub 2-24
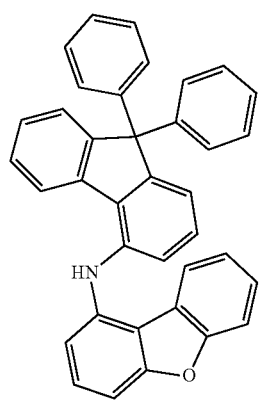
Sub 2-25
Sub 2-26
Sub 2-27
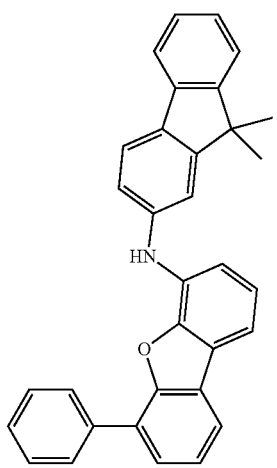
Sub 2-28
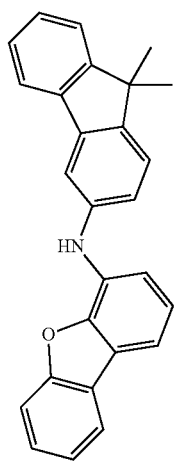
Sub 2-29
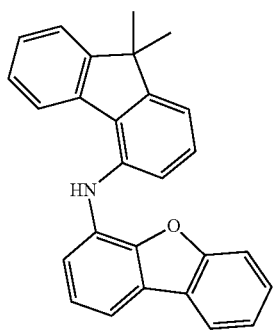
Sub 2-30
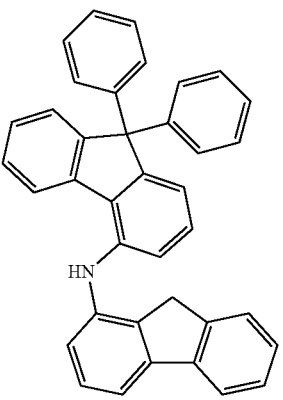

Sub 2-31
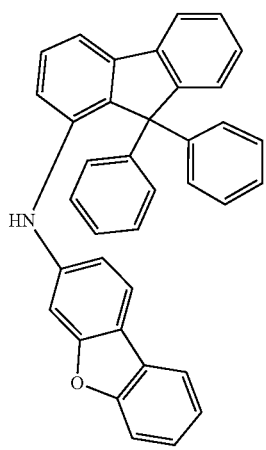
Sub 2-32
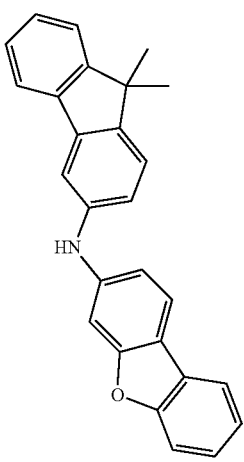
Sub 2-33
Sub 2-34
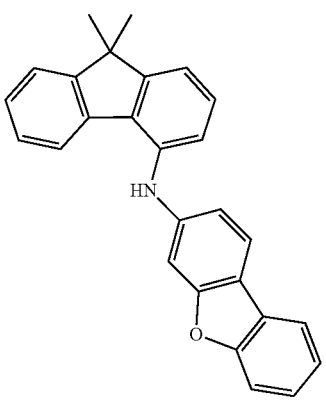
Sub 2-35
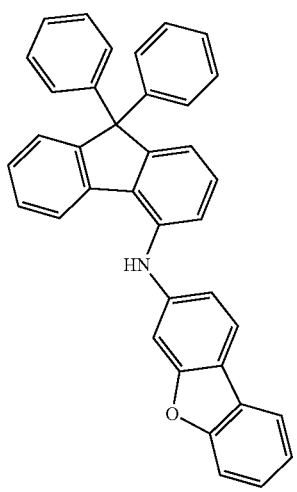
Sub 2-36
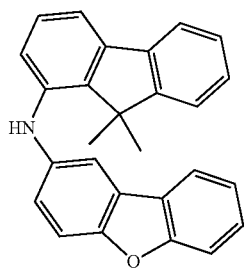
Sub 2-37

Sub 2-38
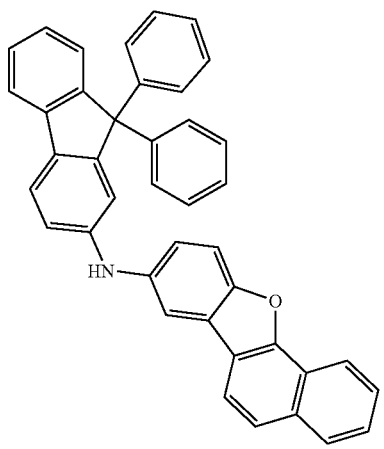
Sub 2-39
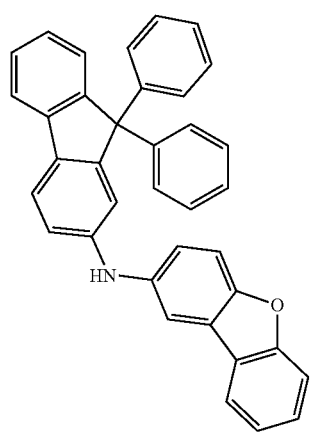
Sub 2-40
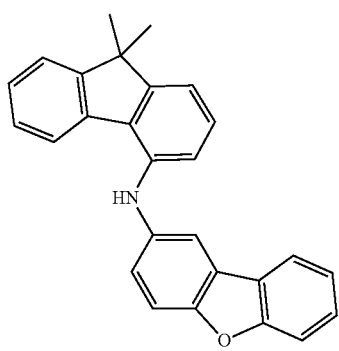
Sub 2-41
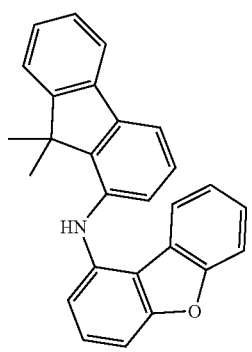
Sub 2-42
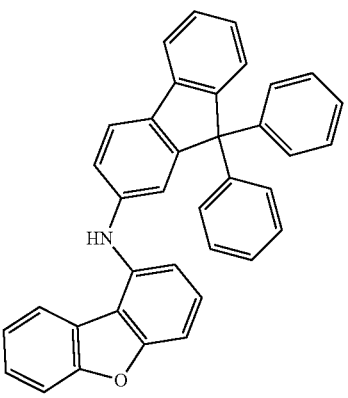
Sub 2-43
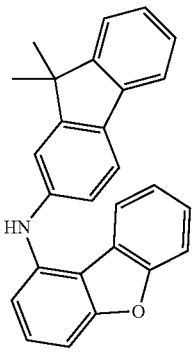
Sub 2-44
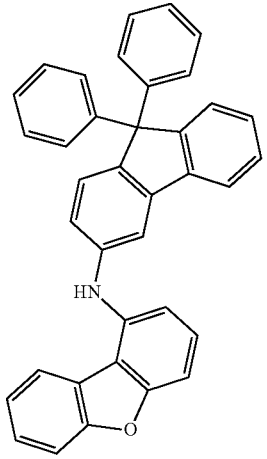
Sub 2-45
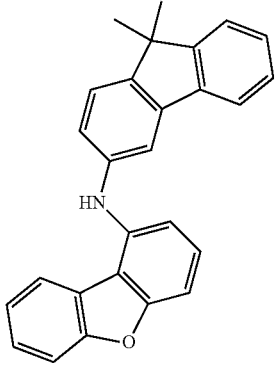

Sub 2-46
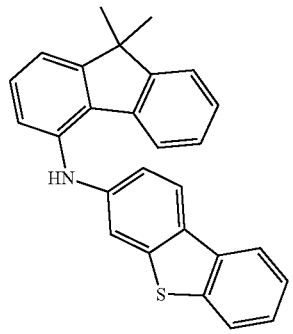
Sub 2-47
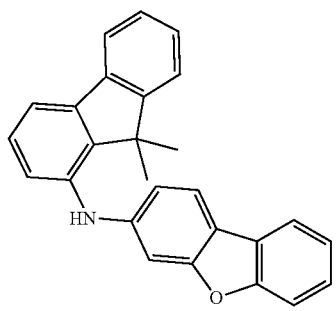
Sub 2-48
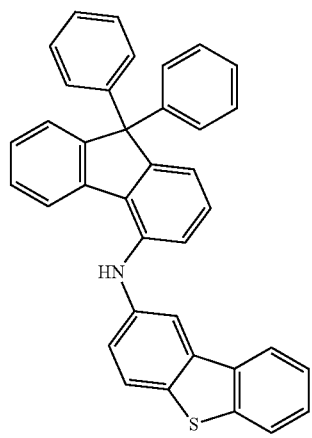
Sub 2-49
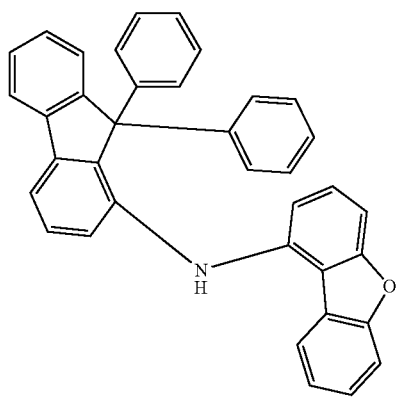
Sub 2-50
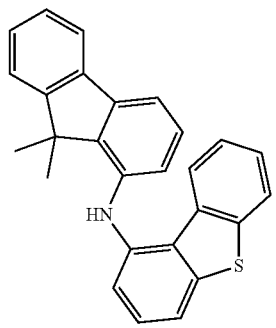
Sub 2-51
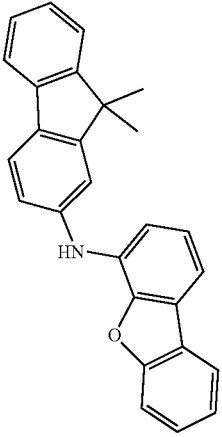
Sub 2-52
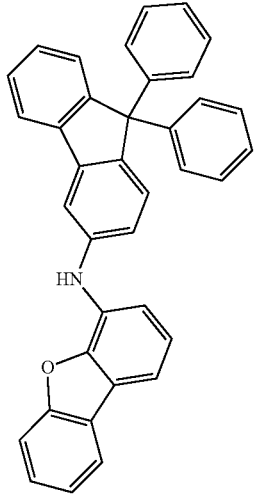

-continued
Sub 2-53
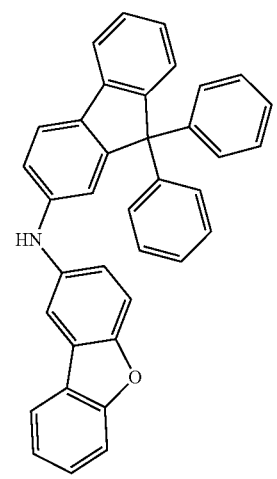
Sub 2-54
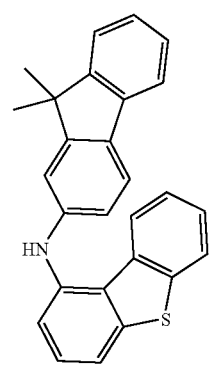
Sub 2-55
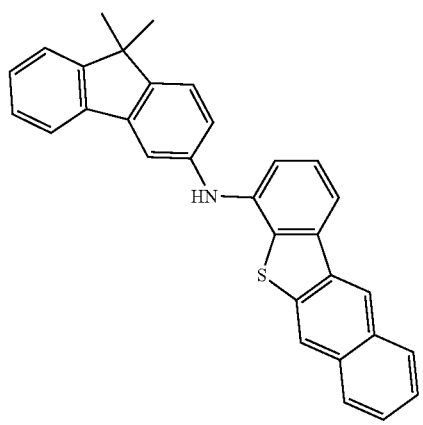
Sub 2-56
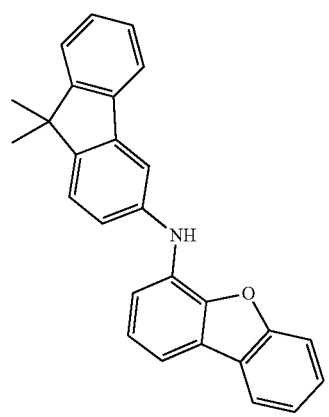
Sub 2-57
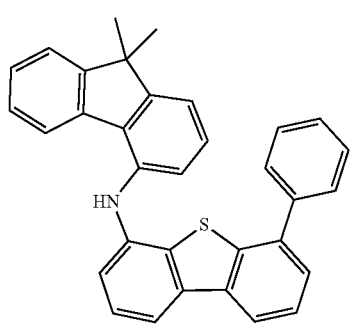
Sub 2-58
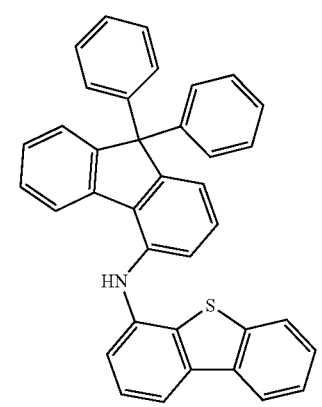
Sub 2-59
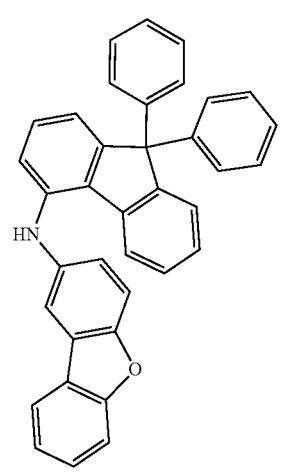

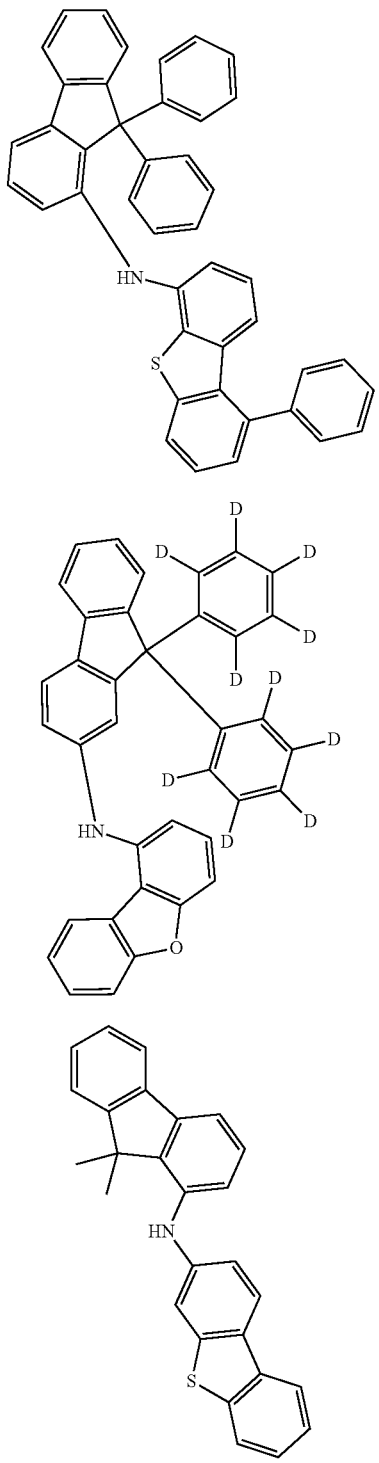
Sub 2-60
Sub 2-61
Sub 2-62
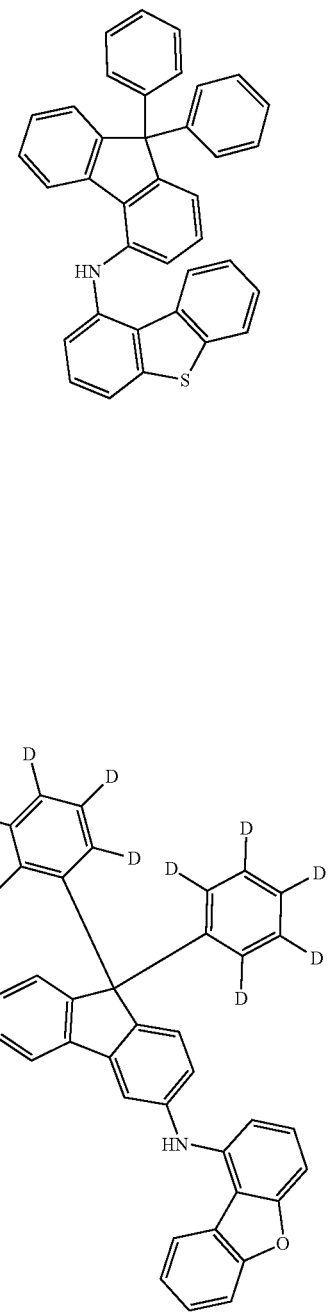
Sub 2-63
Sub 2-64
TABLE 2
| Compound | FD-MS | Compound | FD-MS |
|---|---|---|---|
| Sub 2-1 | m/z = 375.16 ($C_{27}H_{21}NO$ = 375.47) | Sub 2-2 | m/z = 391.14 ($C_{27}H_{21}NS$ = 391.53) |
| Sub 2-3 | m/z = 499.19 ($C_{37}H_{25}NO$ = 499.61) | Sub 2-4 | m/z = 515.17 ($C_{37}H_{25}NS$ = 515.67) |
| Sub 2-5 | m/z = 403.19 ($C_{29}H_{25}NO$ = 403.53) | Sub 2-6 | m/z = 451.19 ($C_{33}H_{25}NO$ = 451.57) |
| Sub 2-7 | m/z = 453.16 ($C_{32}H_{23}NS$ = 453.60) | Sub 2-8 | m/z = 375.16 ($C_{27}H_{21}NO$ = 375.47) |
| Sub 2-9 | m/z = 391.14 ($C_{27}H_{21}NS$ = 391.53) | Sub 2-10 | m/z = 499.19 ($C_{37}H_{25}NO$ = 499.61) |

TABLE 2-continued

| Compound | FD-MS | Compound | FD-MS |
|---|---|---|---|
| Sub 2-11 | m/z = 515.17 ($C_{37}H_{25}NS$ = 515.67) | Sub 2-12 | m/z = 419.17 ($C_{29}H_{25}NS$ = 419.59) |
| Sub 2-13 | m/z = 565.19 ($C_{41}H_{27}NS$ = 565.73) | Sub 2-14 | m/z = 437.18 ($C_{32}H_{23}NO$ = 437.54) |
| Sub 2-15 | m/z = 375.16 ($C_{27}H_{21}NO$ = 375.47) | Sub 2-16 | m/z = 391.14 ($C_{27}H_{21}NS$ = 391.53) |
| Sub 2-17 | m/z = 499.19 ($C_{37}H_{25}NO$ = 499.61) | Sub 2-18 | m/z = 515.17 ($C_{37}H_{25}NS$ = 515.67) |
| Sub 2-19 | m/z = 403.19 ($C_{29}H_{25}NO$ = 403.53) | Sub 2-20 | m/z = 467.17 ($C_{33}H_{25}NS$ = 467.63) |
| Sub 2-21 | m/z = 437.18 ($C_{32}H_{23}NO$ = 437.54) | Sub 2-22 | m/z = 375.16 ($C_{27}H_{21}NO$ = 375.47) |
| Sub 2-23 | m/z = 391.14 ($C_{27}H_{21}NS$ = 391.53) | Sub 2-24 | m/z = 499.19 ($C_{37}H_{25}NO$ = 499.61) |
| Sub 2-25 | m/z = 515.17 ($C_{37}H_{25}NS$ = 515.67) | Sub 2-26 | m/z = 499.19 ($C_{37}H_{25}NO$ = 499.61) |
| Sub 2-27 | m/z = 451.19 ($C_{33}H_{25}NO$ = 451.57) | Sub 2-28 | m/z = 375.16 ($C_{27}H_{21}NO$ = 375.47) |
| Sub 2-29 | m/z = 375.16 ($C_{27}H_{21}NO$ = 375.47) | Sub 2-30 | m/z = 499.19 ($C_{37}H_{25}NO$ = 499.61) |
| Sub 2-31 | m/z = 499.19 ($C_{37}H_{25}NO$ = 499.61) | Sub 2-32 | m/z = 499.19 ($C_{37}H_{25}NO$ = 499.61) |
| Sub 2-33 | m/z = 375.16 ($C_{27}H_{21}NO$ = 375.47) | Sub 2-34 | m/z = 375.16 ($C_{27}H_{21}NO$ = 375.47) |
| Sub 2-35 | m/z = 499.19 ($C_{37}H_{25}NO$ = 499.61) | Sub 2-36 | m/z = 375.16 ($C_{27}H_{21}NO$ = 375.47) |
| Sub 2-37 | m/z = 375.16 ($C_{27}H_{21}NO$ = 375.47) | Sub 2-38 | m/z = 549.21 ($C_{41}H_{27}NS$ = 549.67) |
| Sub 2-39 | m/z = 499.19 ($C_{37}H_{25}NO$ = 499.61) | Sub 2-40 | m/z = 375.16 ($C_{27}H_{21}NO$ = 375.47) |
| Sub 2-41 | m/z = 375.16 ($C_{27}H_{21}NO$ = 375.47) | Sub 2-42 | m/z = 499.19 ($C_{37}H_{25}NO$ = 499.61) |
| Sub 2-43 | m/z = 375.16 ($C_{27}H_{21}NO$ = 375.47) | Sub 2-44 | m/z = 499.19 ($C_{37}H_{25}NO$ = 499.61) |
| Sub 2-45 | m/z = 375.16 ($C_{27}H_{21}NO$ = 375.47) | Sub 2-46 | m/z = 391.14 ($C_{27}H_{21}NS$ = 391.53) |
| Sub 2-47 | m/z = 375.19 ($C_{27}H_{21}NO$ = 375.47) | Sub 2-48 | m/z = 515.17 ($C_{37}H_{25}NS$ = 515.67) |
| Sub 2-49 | m/z = 499.19 ($C_{37}H_{25}NO$ = 499.61) | Sub 2-50 | m/z = 391.14 ($C_{27}H_{21}NS$ = 391.53) |
| Sub 2-51 | m/z = 375.16 ($C_{27}H_{21}NO$ = 375.47) | Sub 2-52 | m/z = 499.19 ($C_{37}H_{25}NO$ = 499.61) |
| Sub 2-53 | m/z = 499.19 ($C_{37}H_{25}NO$ = 499.61) | Sub 2-54 | m/z = 391.14 ($C_{27}H_{21}NS$ = 391.53) |
| Sub 2-55 | m/z = 441.16 ($C_{31}H_{23}NS$ = 441.59) | Sub 2-56 | m/z = 375.16 ($C_{27}H_{21}NO$ = 375.47) |
| Sub 2-57 | m/z = 467.17 ($C_{33}H_{25}NS$ = 467.63) | Sub 2-58 | m/z = 515.17 ($C_{37}H_{25}NS$ = 515.67) |
| Sub 2-59 | m/z = 499.19 ($C_{37}H_{25}NO$ = 499.61) | Sub 2-60 | m/z = 591.20 ($C_{43}H_{29}NS$ = 951.77) |
| Sub 2-61 | m/z = 509.26 ($C_{37}H_{15}D_{10}NO$ = 509.67) | Sub 2-62 | m/z = 391.14 ($C_{27}H_{21}NS$ = 391.53) |
| Sub 2-63 | m/z = 515.17 ($C_{37}H_{25}NS$ = 515.67) | Sub 2-64 | m/z = 509.26 ($C_{37}H_{15}D_{10}NO$ = 509.67) |

III. Synthesis Method of Product

Synthesis of Compound P-1

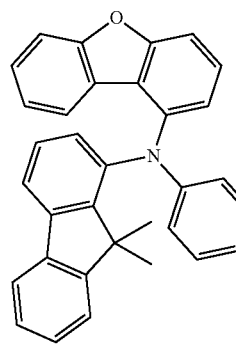

Sub 1-1

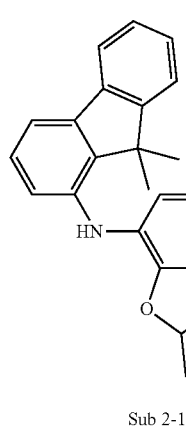

Sub 2-1

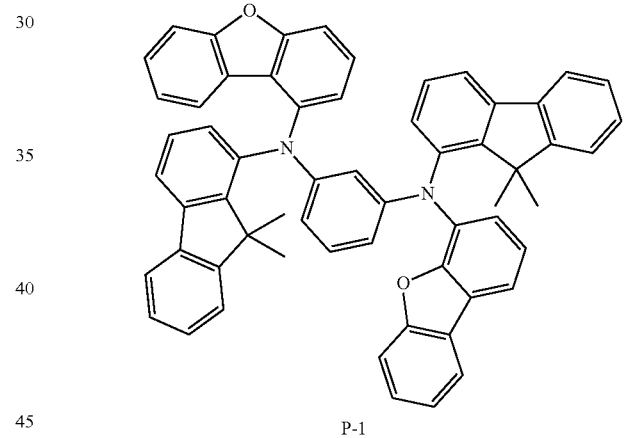

P-1

Sub 1-1 (10 g, 20.6 mmol), Sub 2-1 (7.73 g, 20.6 mmol), $Pd_2(dba)_3$ (0.57 g, 0.6 mmol), $P(t-Bu)_3$ (0.33 g, 1.6 mmol), NaO(t-Bu) (5.93 g, 61.7 mmol) and toluene (200 mL) were placed into a round bottom flask, the mixture was heated for 3 hours at 110° C. under reflux. When the reaction was completed, the reaction product was diluted by adding distilled water at room temperature and the resultant was extracted with toluene and water. Thereafter, the organic layer was dried with $MgSO_4$ and concentrated, and then the resulting compound was dissolved in toluene, was passed through a silica filter and was concentrated. Then, the concentrate was recrystallized by using toluene and acetone to obtain the product P-1 (15.11 g, 89%).

Synthesis of Compound P-7

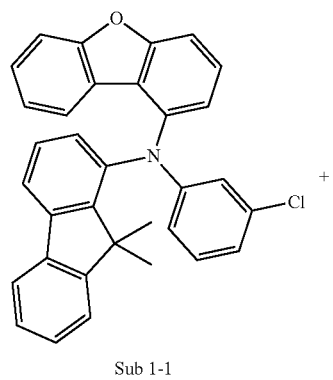

Sub 1-1

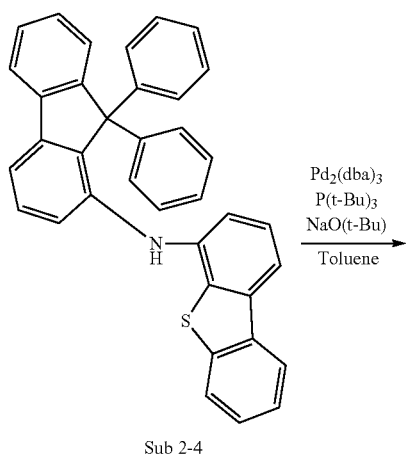

Sub 2-4

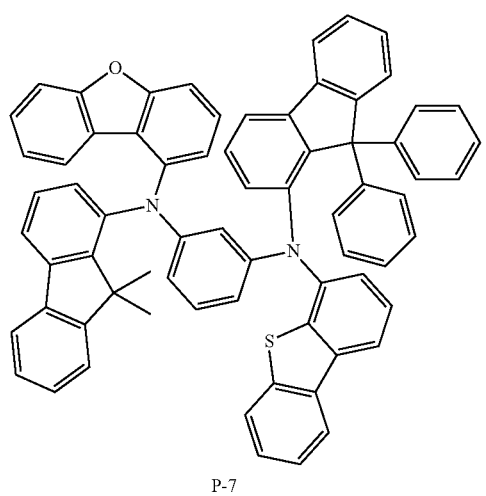

P-7

Sub 1-1 (10 g, 20.6 mmol), Sub 2-4 (10.61 g, 20.6 mmol), Pd$_2$(dba)$_3$ (0.57 g, 0.6 mmol), P(t-Bu)$_3$ (0.33 g, 1.6 mmol), NaO(t-Bu) (5.93 g, 61.7 mmol) and toluene (200 mL) were placed into a round bottom flask, and the product P-7 (17.08 g, 86%) was obtained by the same method as in synthesis example of P-1.

Synthesis of Compound P-13

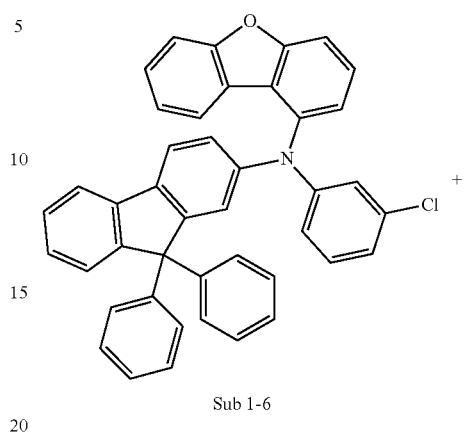

Sub 1-6

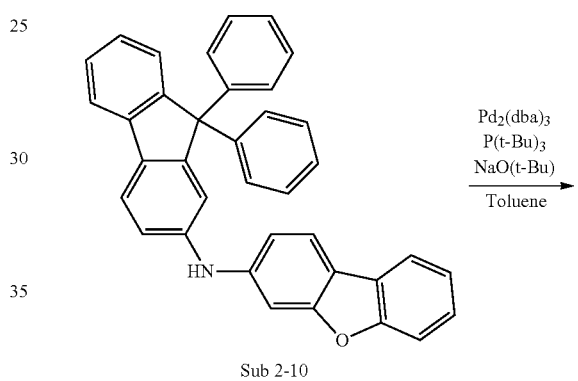

Sub 2-10

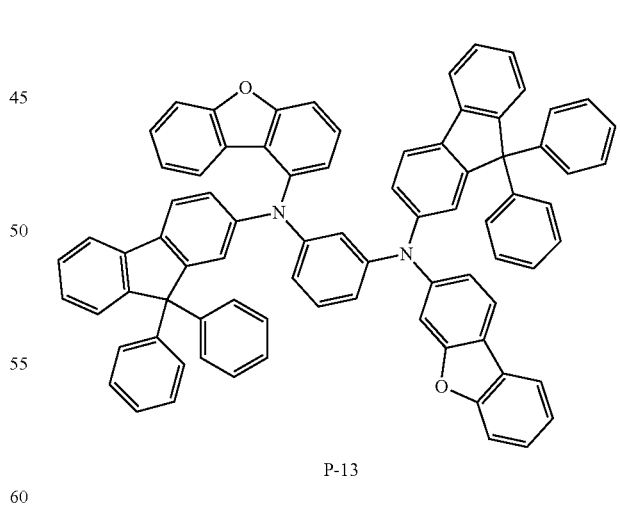

P-13

Sub 1-1 (10 g, 16.4 mmol), Sub 2-10 (8.19 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 49.2 mmol) and toluene (160 mL) were placed into a round bottom flask, and the product P-13 (14.42 g, 82%) was obtained by the same method as in synthesis example of P-1.

85
Synthesis of Compound P-33

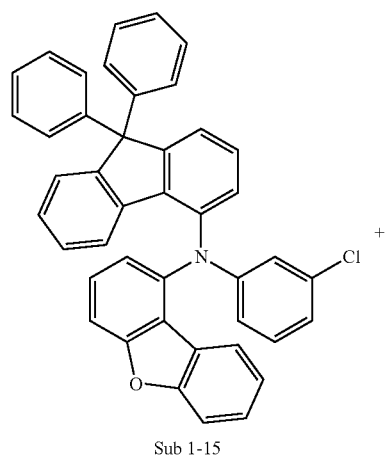
Sub 1-15

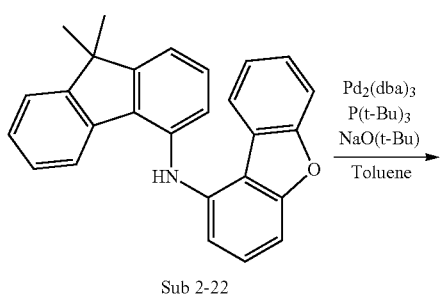
Sub 2-22

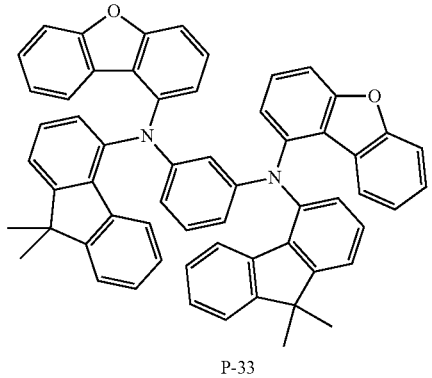
P-33

Sub 1-15 (10 g, 16.4 mmol), Sub 2-22 (6.15 g, 16.4 mmol), Pd₂(dba)₃ (0.45 g, 0.5 mmol), P(t-Bu)₃ (0.27 g, 1.3 mmol), NaO(t-Bu) (4.73 g, 49.2 mmol) and toluene (160 mL) were placed into a round bottom flask, and the product P-33 (11.09 g, 82%) was obtained by the same method as in synthesis example of P-1.

86
Synthesis of Compound P-42

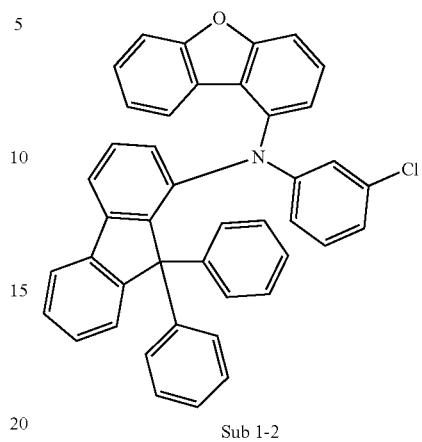
Sub 1-2

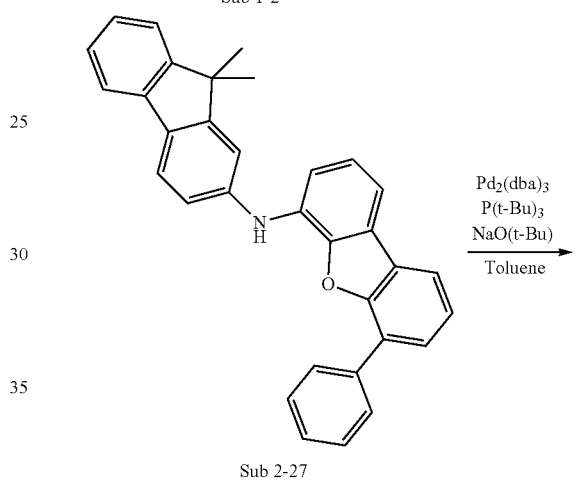
Sub 2-27

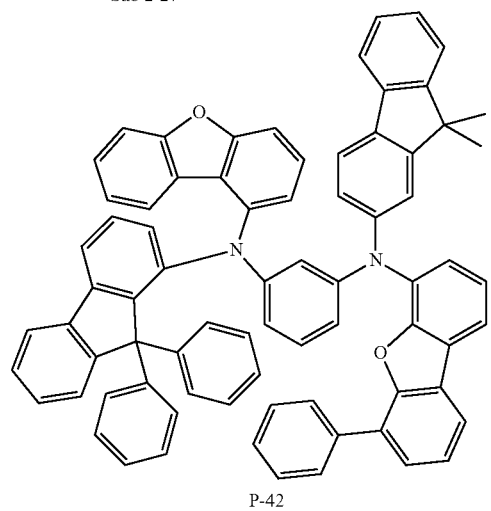
P-42

Sub 1-2 (10 g, 16.4 mmol), Sub 2-27 (7.40 g, 16.4 mmol), Pd₂(dba)₃ (0.45 g, 0.5 mmol), P(t-Bu)₃ (0.27 g, 1.3 mmol), NaO(t-Bu) (4.73 g, 49.2 mmol) and toluene (160 mL) were placed into a round bottom flask, and the product P-42 (13.61 g, 81%) was obtained by the same method as in synthesis example of P-1.

87
Synthesis of Compound P-47

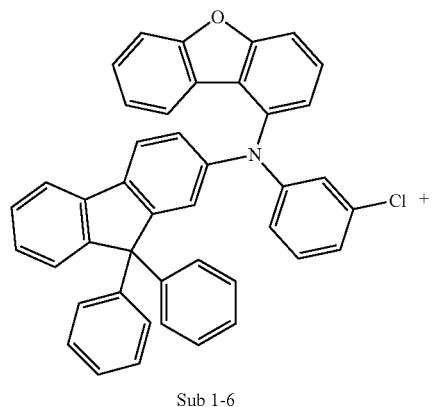
Sub 1-6

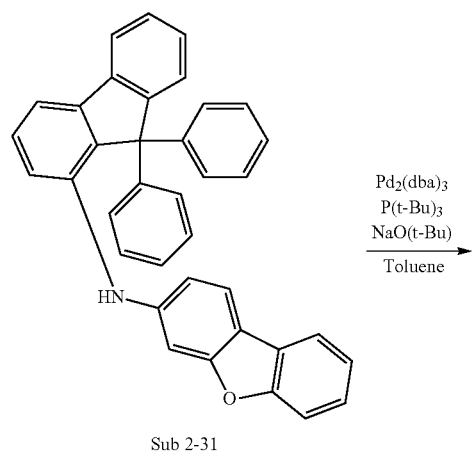
Sub 2-31

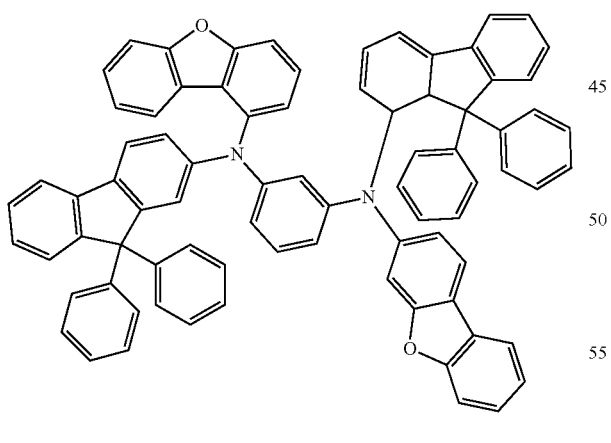
P-47

Sub 1-6 (10 g, 16.4 mmol), Sub 2-31 (8.19 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 19.2 mmol) and toluene (160 mL) were placed into a round bottom flask, and the product P-47 (14.60 g, 83%) was obtained by the same method as in synthesis example of P-1.

88
Synthesis of Compound P-51

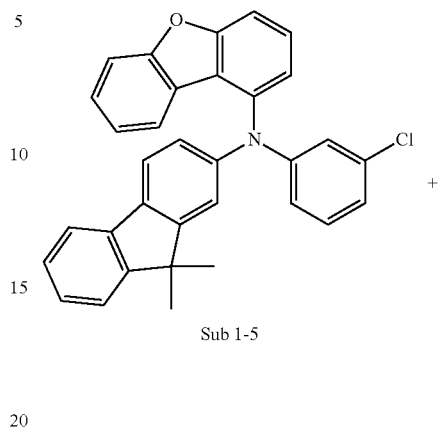
Sub 1-5

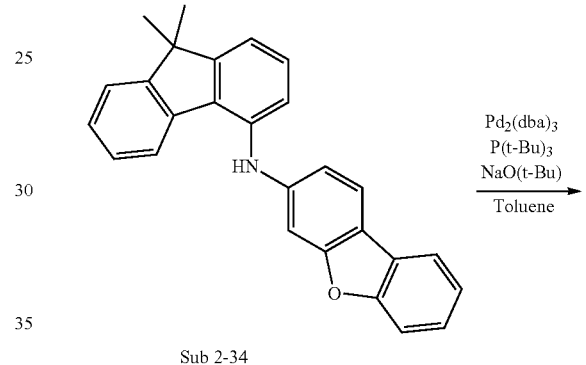
Sub 2-34

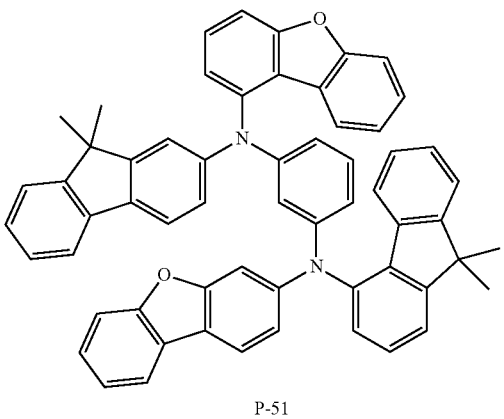
P-51

Sub 1-5 (10 g, 20.6 mmol), Sub 2-34 (7.73 g, 20.6 mmol), Pd$_2$(dba)$_3$ (0.57 g, 0.6 mmol), P(t-Bu)$_3$ (0.33 g, 1.6 mmol), NaO(t-Bu) (5.93 g, 61.7 mmol) and toluene (200 mL) were placed into a round bottom flask, and the product P-51 (14.43 g, 85%) was obtained by the same method as in synthesis example of P-1.

Synthesis of Compound P-58

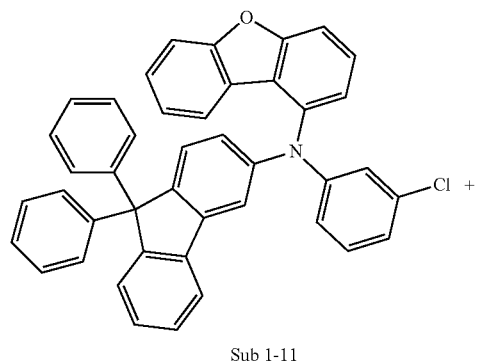

Sub 1-11

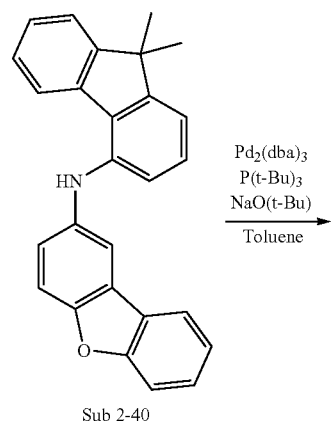

Sub 2-40

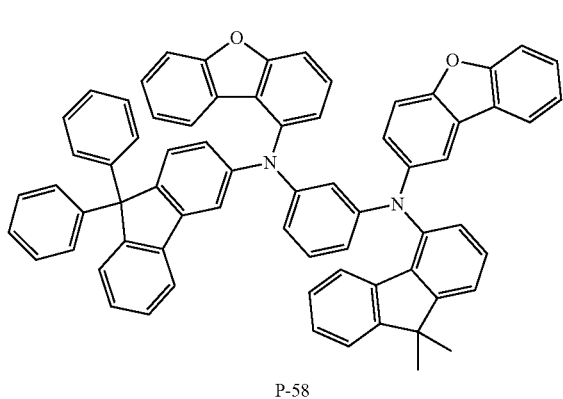

P-58

Sub 1-11 (10 g, 16.4 mmol), Sub 2-40 (6.15 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 49.2 mmol) and toluene (160 mL) were placed into a round bottom flask, and the product P-58 (13.07 g, 84%) was obtained by the same method as in synthesis example of P-1.

Synthesis of Compound P-64

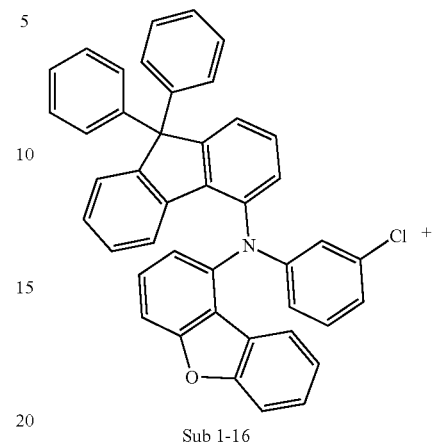

Sub 1-16

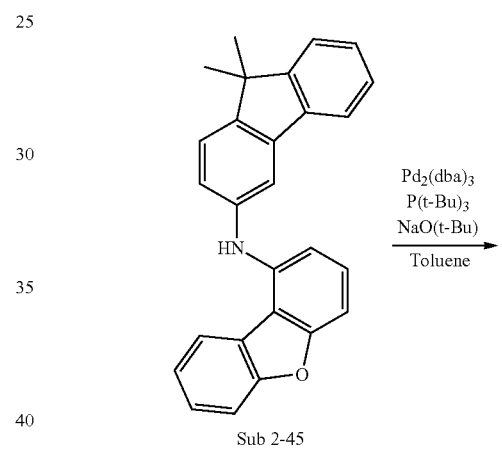

Sub 2-45

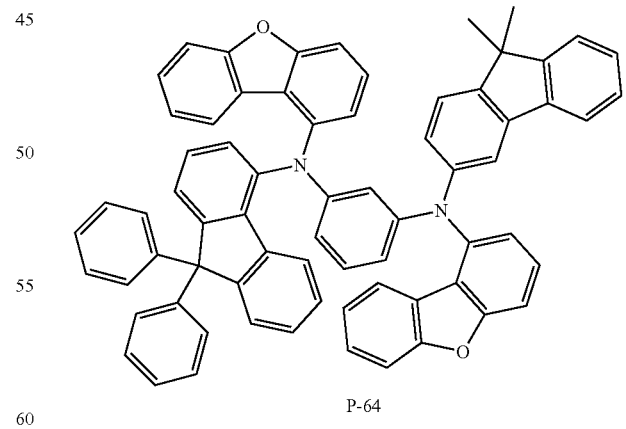

P-64

Sub 1-16 (10 g, 16.4 mmol), Sub 2-45 (6.15 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 49.2 mmol) and toluene (160 mL) were placed into a round bottom flask, and the product P-64 (12.60 g, 81%) was obtained by the same method as in synthesis example of P-1.

Synthesis of Compound P-74

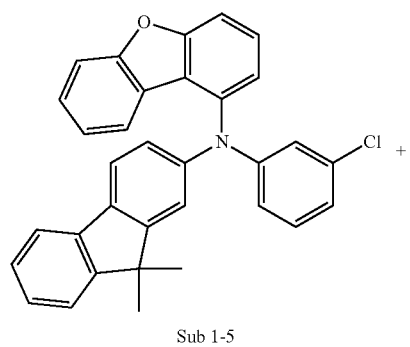

Sub 1-5

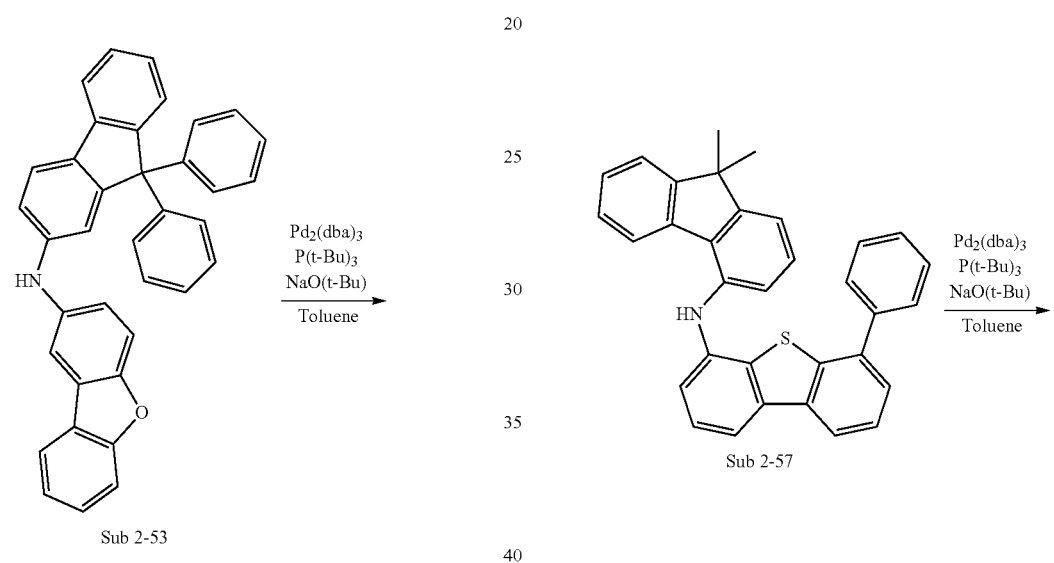

Sub 2-53

P-74

Sub 1-5 (10 g, 20.6 mmol), Sub 2-53 (10.28 g, 20.6 mmol), Pd$_2$(dba)$_3$ (0.57 g, 0.6 mmol), P(t-Bu)$_3$ (0.33 g, 1.6 mmol), NaO(t-Bu) (5.93 g, 61.7 mmol) and toluene (200 mL) were placed into a round bottom flask, and the product P-74 (16.99 g, 87%) was obtained by the same method as in synthesis example of P-1.

Synthesis of Compound P-83

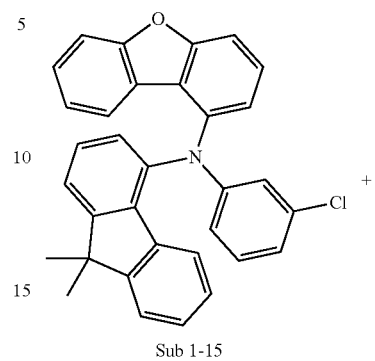

Sub 1-15

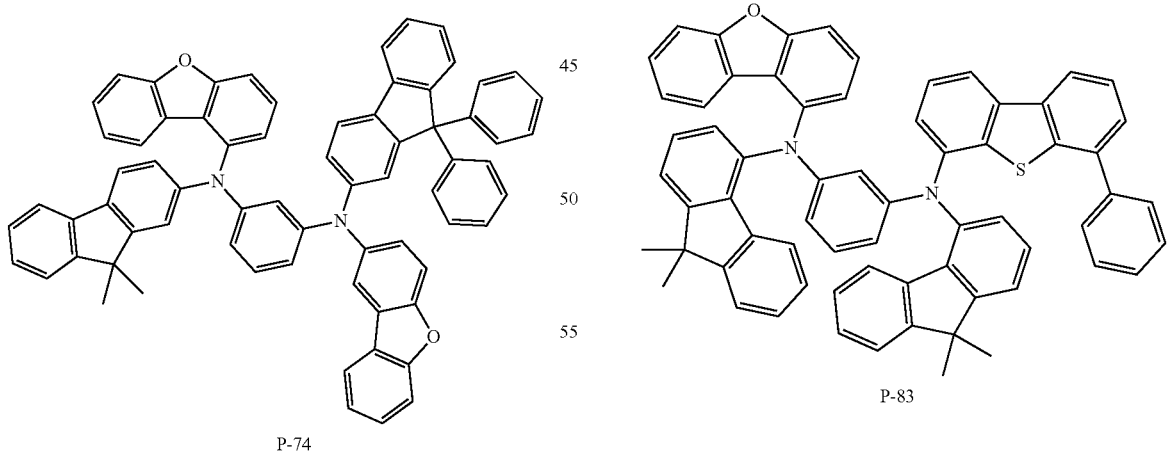

Sub 2-57

P-83

Sub 1-15 (10 g, 20.6 mmol), Sub 2-57 (9.62 g, 20.6 mmol), Pd$_2$(dba)$_3$ (0.57 g, 0.6 mmol), P(t-Bu)$_3$ (0.33 g, 1.6 mmol), NaO(t-Bu) (5.93 g, 61.7 mmol) and toluene (200 mL) were placed into a round bottom flask, and the product P-83 (15.66 g, 83%) was obtained by the same method as in synthesis example of P-1.

Synthesis of Compound P-89

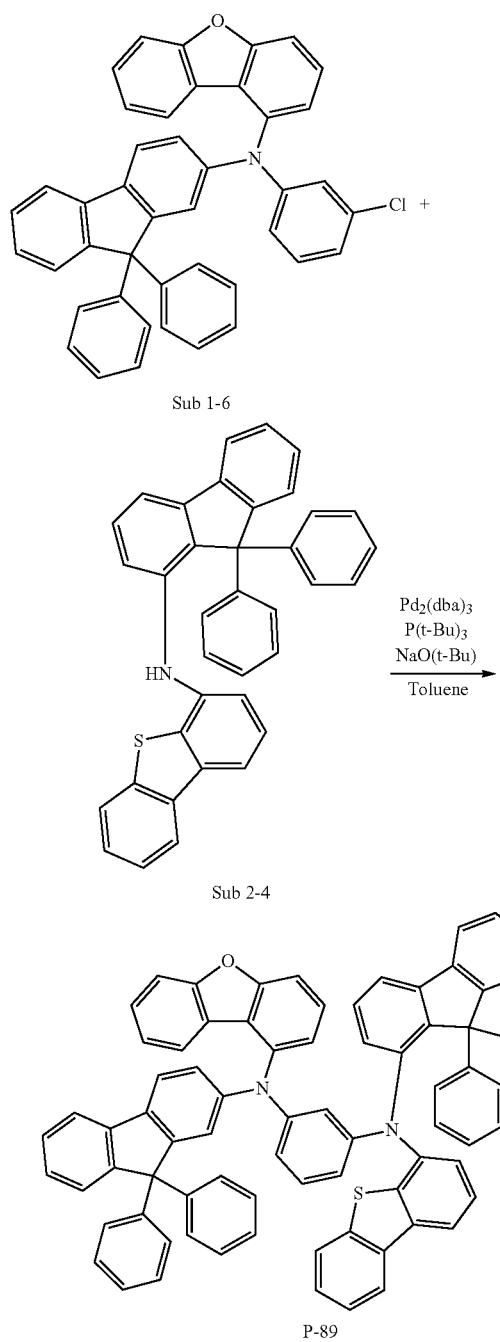

Sub 1-6

Sub 2-4

P-89

Synthesis of Compound P-104

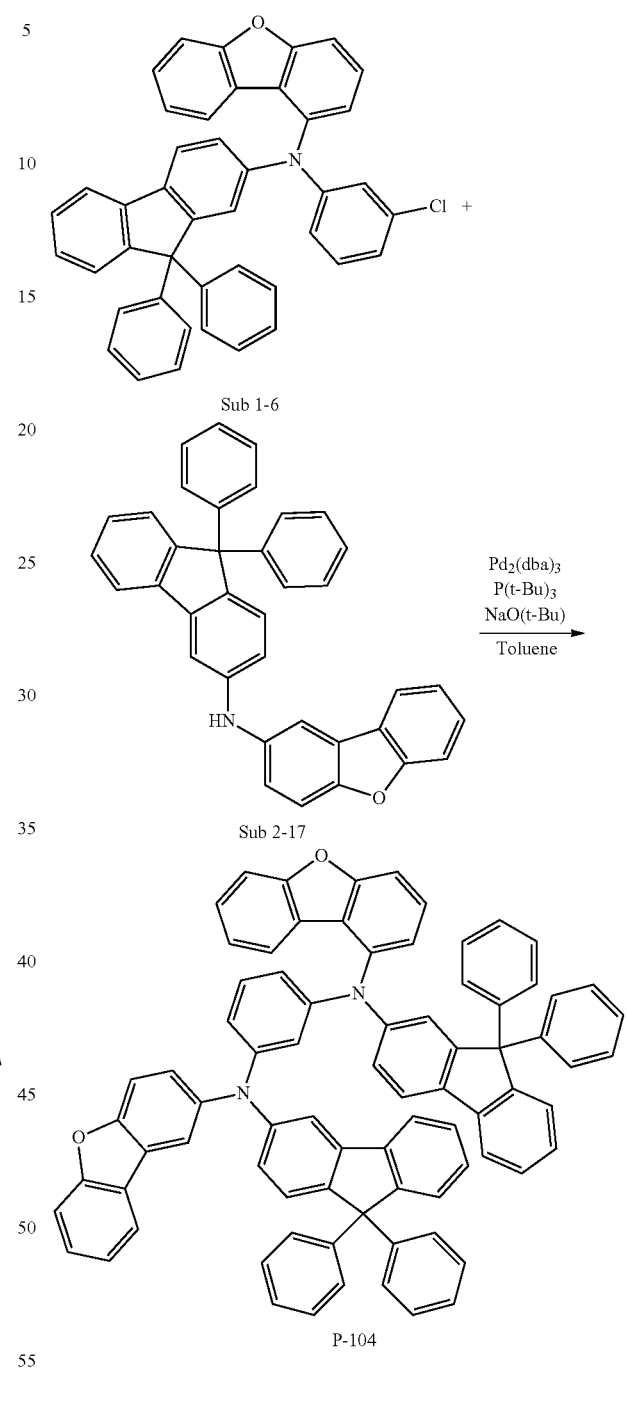

Sub 1-6

Sub 2-17

P-104

Sub 1-16 (10 g, 16.4 mmol), Sub 2-4 (8.45 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 49.2 mmol) and toluene (160 mL) were placed into a round bottom flask, and the product P-89 (15.00 g, 84%) was obtained by the same method as in synthesis example of P-1.

Sub 1-6 (10 g, 16.4 mmol), Sub 2-17 (8.19 g, 16.4 mmol), Pd$_2$(dba)$_3$ (0.45 g, 0.5 mmol), P(t-Bu)$_3$ (0.27 g, 1.3 mmol), NaO(t-Bu) (4.73 g, 49.2 mmol) and toluene (160 mL) were placed into a round bottom flask, and the product P-104 (14.95 g, 85%) was obtained by the same method as in synthesis example of P-1.

Synthesis of Compound P-110

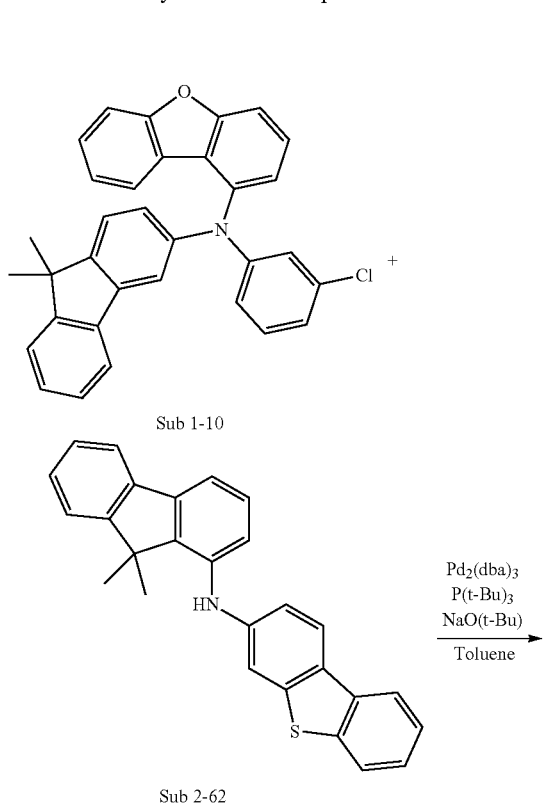

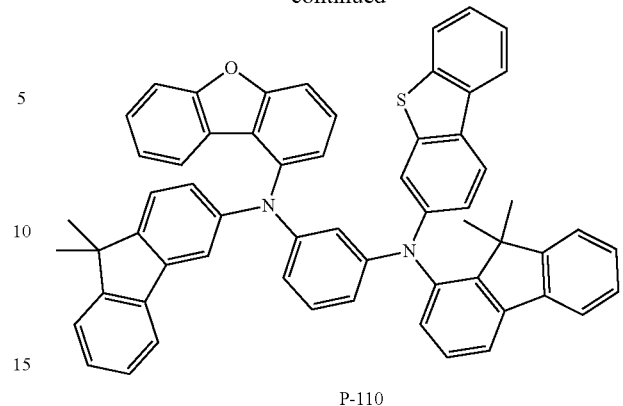

Sub 1-10 (10 g, 20.6 mmol), Sub 2-62 (8.06 g, 20.6 mmol), Pd$_2$(dba)$_3$ (0.57 g, 0.6 mmol), P(t-Bu)$_3$ (0.33 g, 1.6 mmol), NaO(t-Bu) (5.93 g, 61.7 mmol) and toluene (200 mL) were placed into a round bottom flask, and the product P-110 (14.88 g, 86%) was obtained by the same method as in synthesis example of P-1.

The FD-MS values of the compounds P-1 to P-116 of the present invention prepared according to the above synthesis examples are shown in the following Table 3.

TABLE 3

| Compound | FD-MS | Compound | FD-MS |
|---|---|---|---|
| P-1 | m/z = 824.34 (C$_{60}$H$_{44}$N$_2$O$_2$ = 825.02) | P-2 | m/z = 840.32 (C$_{60}$H$_{44}$N$_2$OS = 841.09) |
| P-3 | m/z = 1072.40 (C$_{80}$H$_{52}$N$_2$O$_2$ = 1073.31) | P-4 | m/z = 1088.38 (C$_{80}$H$_{52}$N$_2$OS = 1059.37) |
| P-5 | m/z = 880.40 (C$_{64}$H$_{52}$N$_2$O$_2$ = 881.13) | P-6 | m/z = 948.37 (C$_{70}$H$_{48}$N$_2$O$_2$ = 949.17) |
| P-7 | m/z = 964.35 (C$_{70}$H$_{48}$N$_2$OS = 965.23) | P-8 | m/z = 1024.40 (C$_{76}$H$_{52}$N$_2$O$_2$ = 1025.26) |
| P-9 | m/z = 964.35 (C$_{70}$H$_{48}$N$_2$OS = 965.23) | P-10 | m/z = 964.35 (C$_{70}$H$_{48}$N$_2$OS = 965.23) |
| P-11 | m/z = 824.34 (C$_{60}$H$_{44}$N$_2$O$_2$ = 825.02) | P-12 | m/z = 840.32 (C$_{60}$H$_{44}$N$_2$OS = 841.09) |
| P-13 | m/z = 1072.40 (C$_{80}$H$_{52}$N$_2$O$_2$ = 1073.31) | P-14 | m/z = 1088.38 (C$_{80}$H$_{52}$N$_2$OS = 1089.37) |
| P-15 | m/z = 896.38 (C$_{64}$H$_{52}$N$_2$OS = 897.19) | P-16 | m/z = 948.37 (C$_{70}$H$_{48}$N$_2$O$_2$ = 949.17) |
| P-17 | m/z = 1014.36 (C$_{74}$H$_{50}$N$_2$OS = 1015.29) | P-18 | m/z = 948.37 (C$_{70}$H$_{48}$N$_2$O$_2$ = 949.17) |
| P-19 | m/z = 964.35 (C$_{70}$H$_{48}$N$_2$OS = 965.23) | P-20 | m/z = 948.37 (C$_{70}$H$_{48}$N$_2$O$_2$ = 949.17) |
| P-21 | m/z = 900.37 (C$_{66}$H$_{48}$N$_2$O$_2$ = 901.12) | P-22 | m/z = 824.34 (C$_{60}$H$_{44}$N$_2$O$_2$ = 825.02) |
| P-23 | m/z = 840.32 (C$_{60}$H$_{44}$N$_2$OS = 941.09) | P-24 | m/z = 1072.40 (C$_{80}$H$_{52}$N$_2$O$_2$ = 1073.31) |
| P-25 | m/z = 1088.38 (C$_{80}$H$_{52}$N$_2$OS = 1089.37) | P-26 | m/z = 880.40 (C$_{64}$H$_{52}$N$_2$O$_2$ = 881.13) |
| P-27 | m/z = 948.37 (C$_{70}$H$_{48}$N$_2$O$_2$ = 949.17) | P-28 | m/z = 964.35 (C$_{70}$H$_{48}$N$_2$OS = 965.23) |
| P-29 | m/z = 948.37 (C$_{70}$H$_{48}$N$_2$O$_2$ = 949.17) | P-30 | m/z = 1040.38 (C$_{76}$H$_{52}$N$_2$OS = 1041.33) |
| P-31 | m/z = 948.37 (C$_{70}$H$_{48}$N$_2$O$_2$ = 949.17) | P-32 | m/z = 916.35 (C$_{66}$H$_{48}$N$_2$OS = 917.18) |
| P-33 | m/z = 824.34 (C$_{60}$H$_{44}$N$_2$O$_2$ = 825.02) | P-34 | m/z = 840.32 (C$_{60}$H$_{44}$N$_2$OS = 841.09) |
| P-35 | m/z = 1072.40 (C$_{80}$H$_{52}$N$_2$O$_2$ = 1073.31) | P-36 | m/z = 1088.38 (C$_{80}$H$_{52}$N$_2$OS = 1089.37) |
| P-37 | m/z = 948.37 (C$_{70}$H$_{48}$N$_2$O$_2$ = 949.17) | P-38 | m/z = 964.35 (C$_{70}$H$_{48}$N$_2$OS = 965.23) |
| P-39 | m/z = 948.37 (C$_{70}$H$_{48}$N$_2$O$_2$ = 949.17) | P-40 | m/z = 964.35 (C$_{70}$H$_{48}$N$_2$OS = 965.23) |
| P-41 | m/z = 948.37 (C$_{70}$H$_{48}$N$_2$O$_2$ = 949.17) | P-42 | m/z = 1024.40 (C$_{76}$H$_{52}$N$_2$O$_2$ = 1025.26) |
| P-43 | m/z = 824.34 (C$_{60}$H$_{44}$N$_2$O$_2$ = 825.02) | P-44 | m/z = 948.37 (C$_{70}$H$_{48}$N$_2$O$_2$ = 949.17) |
| P-45 | m/z = 824.34 (C$_{60}$H$_{44}$N$_2$O$_2$ = 825.02) | P-46 | m/z = 1072.40 (C$_{80}$H$_{52}$N$_2$O$_2$ = 1073.31) |
| P-47 | m/z = 1072.40 (C$_{80}$H$_{52}$N$_2$O$_2$ = 1073.31) | P-48 | m/z = 948.37 (C$_{70}$H$_{48}$N$_2$O$_2$ = 949.17) |
| P-49 | m/z = 1072.40 (C$_{80}$H$_{52}$N$_2$O$_2$ = 1073.31) | P-50 | m/z = 998.39 (C$_{74}$H$_{50}$N$_2$O$_2$ = 999.23) |
| P-51 | m/z = 824.34 (C$_{60}$H$_{44}$N$_2$O$_2$ = 825.02) | P-52 | m/z = 948.37 (C$_{70}$H$_{48}$N$_2$O$_2$ = 949.17) |
| P-53 | m/z = 824.34 (C$_{60}$H$_{44}$N$_2$O$_2$ = 825.02) | P-54 | m/z = 948.37 (C$_{70}$H$_{48}$N$_2$O$_2$ = 949.17) |
| P-55 | m/z = 1122.42 (C$_{84}$H$_{54}$N$_2$O$_2$ = 1123.37) | P-56 | m/z = 948.37 (C$_{70}$H$_{48}$N$_2$O$_2$ = 949.17) |
| P-57 | m/z = 824.34 (C$_{60}$H$_{44}$N$_2$O$_2$ = 825.02) | P-58 | m/z = 948.37 (C$_{70}$H$_{48}$N$_2$O$_{22}$ = 949.17) |
| P-59 | m/z = 824.34 (C$_{60}$H$_{44}$N$_2$O$_2$ = 825.02) | P-60 | m/z = 948.37 (C$_{70}$H$_{48}$N$_2$O$_2$ = 949.17) |
| P-61 | m/z = 1072.40 (C$_{80}$H$_{52}$N$_2$O$_2$ = 1073.31) | P-62 | m/z = 948.37 (C$_{70}$H$_{48}$N$_2$O$_2$ = 949.17) |
| P-63 | m/z = 1072.40 (C$_{80}$H$_{52}$N$_2$O$_2$ = 1073.31) | P-64 | m/z = 948.37 (C$_{70}$H$_{48}$N$_2$O$_2$ = 949.17) |
| P-65 | m/z = 840.32 (C$_{60}$H$_{44}$N$_2$OS = 841.09) | P-66 | m/z = 948.37 (C$_{70}$H$_{48}$N$_2$O$_2$ = 949.17) |
| P-67 | m/z = 824.34 (C$_{60}$H$_{44}$N$_2$O$_2$ = 825.02) | P-68 | m/z = 1088.38 (C$_{80}$H$_{52}$N$_2$OS = 1089.37) |
| P-69 | m/z = 948.37 (C$_{70}$H$_{48}$N$_2$O$_2$ = 949.17) | P-70 | m/z = 964.35 (C$_{70}$H$_{48}$N$_2$OS = 965.23) |
| P-71 | m/z = 824.34 (C$_{60}$H$_{44}$N$_2$O$_2$ = 825.02) | P-72 | m/z = 948.37 (C$_{70}$H$_{48}$N$_2$O$_2$ = 949.17) |

TABLE 3-continued

| Compound | FD-MS | Compound | FD-MS |
|---|---|---|---|
| P-73 | m/z = 1072.40 ($C_{80}H_{52}N_2O_2$ = 1073.31) | P-74 | m/z = 948.37 ($C_{70}H_{48}N_2O_2$ = 949.17) |
| P-75 | m/z = 1072.40 ($C_{80}H_{52}N_2O_2$ = 1073.31) | P-76 | m/z = 964.35 ($C_{70}H_{48}N_2OS$ = 965.23) |
| P-77 | m/z = 890.33 ($C_{64}H_{46}N_2OS$ = 981.15) | P-78 | m/z = 948.37 ($C_{70}H_{48}N_2O_2$ = 949.17) |
| P-79 | m/z = 1072.40 ($C_{80}H_{52}N_2O_2$ = 1073.31) | P-80 | m/z = 948.37 ($C_{70}H_{48}N_2O_2$ = 949.17) |
| P-81 | m/z = 824.34 ($C_{60}H_{44}N_2O_2$ = 825.02) | P-82 | m/z = 948.37 ($C_{70}H_{48}N_2O_2$ = 949.17) |
| P-83 | m/z = 916.35 ($C_{66}H_{48}N_2OS$ = 917.18) | P-84 | m/z = 1088.38 ($C_{80}H_{52}N_2OS$ = 1089.37) |
| P-85 | m/z = 948.37 ($C_{70}H_{48}N_2O_2$ = 949.17) | P-86 | m/z = 964.35 ($C_{70}H_{48}N_2OS$ = 965.23) |
| P-87 | m/z = 1072.40 ($C_{80}H_{52}N_2O_2$ = 1073.31) | P-88 | m/z = 948.37 ($C_{70}H_{48}N_2O_2$ = 949.17) |
| P-89 | m/z = 1088.38 ($C_{80}H_{52}N_2OS$ = 1089.37) | P-90 | m/z = 948.37 ($C_{70}H_{48}N_2O_2$ = 949.17) |
| P-91 | m/z = 824.34 ($C_{60}H_{44}N_2O_2$ = 825.02) | P-92 | m/z = 1040.38 ($C_{76}H_{52}N_2OS$ = 1041.33) |
| P-93 | m/z = 824.34 ($C_{60}H_{44}N_2O_2$ = 825.02) | P-94 | m/z = 964.35 ($C_{70}H_{48}N_2OS$ = 965.23) |
| P-95 | m/z = 824.34 ($C_{60}H_{44}N_2O_2$ = 825.02) | P-96 | m/z = 964.35 ($C_{70}H_{48}N_2OS$ = 965.23) |
| P-97 | m/z = 1072.40 ($C_{80}H_{52}N_2O_2$ = 1073.31) | P-98 | m/z = 948.37 ($C_{70}H_{48}N_2O_2$ = 949.17) |
| P-99 | m/z = 1072.40 ($C_{80}H_{52}N_2O_2$ = 1073.31) | P-100 | m/z = 948.37 ($C_{70}H_{48}N_2O_2$ = 949.17) |
| P-101 | m/z = 1088.38 ($C_{80}H_{52}N_2OS$ = 1089.37) | P-102 | m/z = 948.37 ($C_{70}H_{48}N_2O_2$ = 949.17) |
| P-103 | m/z = 964.35 ($C_{70}H_{48}N_2OS$ = 965.23) | P-104 | m/z = 1072.40 ($C_{80}H_{52}N_2O_2$ = 1073.31) |
| P-105 | m/z = 958.43 ($C_{70}H_{38}H_{10}N_2O_2$ = 959.23) | P-106 | m/z = 948.37 ($C_{70}H_{48}N_2O_2$ = 949.17) |
| P-107 | m/z = 1072.40 ($C_{80}H_{52}N_2O_2$ = 1073.31) | P-108 | m/z = 824.34 ($C_{60}H_{44}N_2O_2$ = 825.02) |
| P-109 | m/z = 948.37 ($C_{70}H_{48}N_2O_2$ = 949.17) | P-110 | m/z = 840.32 ($C_{60}H_{44}N_2OS$ = 841.09) |
| P-111 | m/z = 1088.38 ($C_{80}H_{52}N_2OS$ = 1089.37) | P-112 | m/z = 958.43 ($C_{70}H_{38}H_{10}N_2O_2$ = 959.23) |
| P-113 | m/z = 1120.40 ($C_{84}H_{52}N_2O_2$ = 1121.35) | P-114 | m/z = 996.37 ($C_{74}H_{48}N_2O_2$ = 997.21) |
| P-115 | m/z = 1118.39 ($C_{84}H_{50}N_2O_2$ = 1119.34) | P-116 | m/z = 996.37 ($C_{74}H_{48}N_2O_2$ = 997.21) |

Fabrication and Evaluation of Organic Electroluminescent Element

[Example 1] Green OILED (an Emission-Auxiliary Layer)

After vacuum-depositing $N^1$-(naphthalen-2-yl)-$N^4$,$N^4$-bis(4-(naphthalen-2-yl(phenyl)amino)phenyl)-$N^1$-phenylbenzene-1,4-diamine (hereinafter, "2-TNATA") on an ITO layer (anode) formed on a glass substrate to form a hole injection layer with a thickness of 60 nm, a hole transport layer with a thickness of 60 nm was formed by vacuum-depositing N,N'-Bis(1-naphthalenyl)-N, N'-bis-phenyl-(1,1'-biphenyl)-4,4'-diamine (hereinafter, "NPB") on the hole injection layer. Subsequently, the compound P-1 of the present invention was vacuum-deposited on the hole transport layer to form an emission-auxiliary layer with a thickness of 20 nm.

Next, 4,4'-N, N'-dicarbazole-biphenyl (hereinafter, "CBP") as a host material and tris(2-phenylpyridine)-iridium (hereinafter, "Ir(ppy)$_3$") as a dopant material in a weight ratio of 95:5 were deposited on the emission-auxiliary layer to form a light emitting layer with a thickness of 30 nm.

Subsequently, (1,1'-bisphenyl-4-olato)bis(2-methyl-8-quinolinolato)aluminum (hereinafter, "BAlq") was vacuum-deposited to a thickness of 10 nm on the light emitting layer to form a hole blocking layer, and tris(8-quinolinolato)aluminum (hereinafter, "Alq3") was vacuum-deposited to a thickness of 40 nm on the hole blocking layer to form a an electron transport layer. Next, LiF being halogenated alkali was deposited to a thickness of 0.2 nm to form an electron injection layer, and then Al was deposited to a thickness of 150 to form a cathode.

[Example 2] to [Example 37]

The OLEDs were fabricated in the same manner as described in Example 1 except that the compounds of the present invention described in the following Table 4, instead of the compound P-1 of the present invention, were used as an emission-auxiliary layer material.

Comparative Example 1

The OLED was fabricated in the same manner as described in Example 1 except that an emission-auxiliary layer was not formed.

[Comparative Example 2] to [Comparative Example 5]

The OLEDs were fabricated in the same manner as described in Example 1 except that one of the following Comparative Compounds A to D, instead of the compound P-1 of the present invention, was used as an emission-auxiliary layer material.

Comparative Example 6

The OLED was fabricated in the same manner as described in Example 1 except that the compound P-1 of the present invention was used as material of a hole transport layer and NPB was used as an emission-auxiliary layer material.

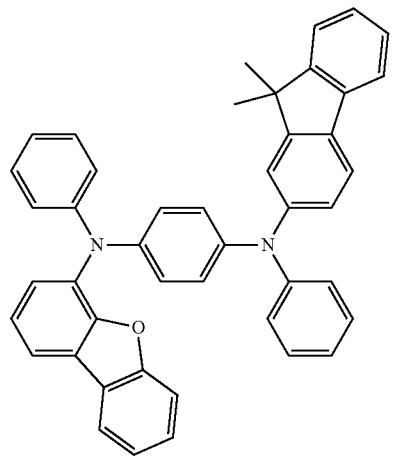

<Comp. compd A>

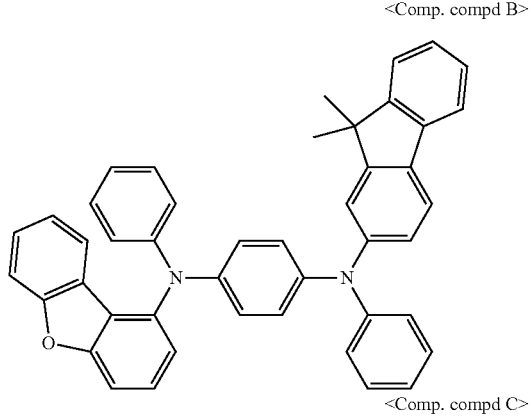
<Comp. compd B>

<Comp. compd C>

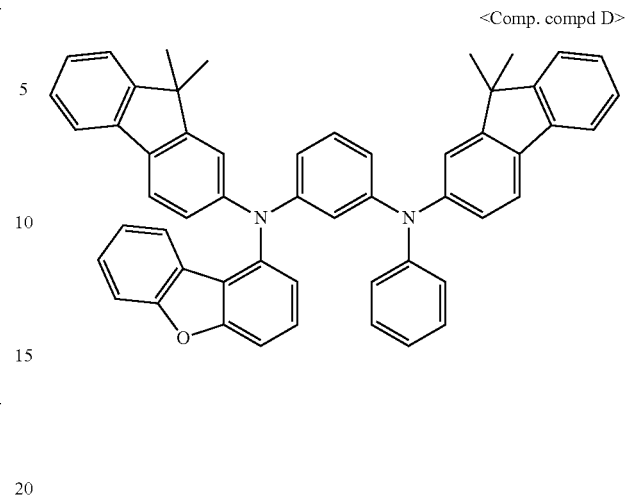
<Comp. compd D>

Electroluminescence (EL) characteristics were measured with a PR-650 (Photoresearch) by applying a forward bias DC voltage to the OLEDs prepared in Examples 1 to 37 of the present invention and Comparative Examples 1 to 6. And, the T95 life time was measured using a life time measuring apparatus manufactured by Mcscience Inc. at reference brightness of 5000 cd/m². The measurement results are shown in Tables 4 below.

TABLE 4

| | HTL com. | EAL com. | Voltage (V) | Current Density (mA/cm²) | Brightness (cd/m²) | Efficiency (cd/A) | Lifetime T(95) | CIE x | CIE y |
|---|---|---|---|---|---|---|---|---|---|
| comp. Ex (1) | NPB | — | 5.9 | 13.6 | 5000.0 | 36.8 | 116.9 | 0.33 | 0.61 |
| comp. Ex (2) | | comp. Com A | 5.8 | 12.5 | 5000.0 | 40.1 | 120.9 | 0.31 | 0.62 |
| comp. Ex (3) | | comp. Com B | 5.7 | 11.6 | 5000.0 | 43.2 | 121.9 | 0.30 | 0.61 |
| comp. Ex (4) | | comp. Com C | 5.5 | 9.9 | 5000.0 | 50.3 | 124.8 | 0.31 | 0.63 |
| comp. Ex (5) | | comp. Com D | 5.5 | 9.8 | 5000.0 | 51.2 | 125.3 | 0.33 | 0.61 |
| comp. Ex (6) | P-1 | NPB | 6.1 | 12.7 | 5000.0 | 39.5 | 116.1 | 0.32 | 0.62 |
| Ex. (1) | NPB | P-1 | 5.1 | 8.1 | 5000.0 | 61.8 | 133.3 | 0.34 | 0.65 |
| Ex. (2) | | P-2 | 5.2 | 9.0 | 5000.0 | 55.4 | 132.6 | 0.30 | 0.63 |
| Ex. (3) | | P-6 | 4.8 | 8.4 | 5000.0 | 59.8 | 134.3 | 0.33 | 0.61 |
| Ex. (4) | | P-7 | 5.1 | 9.0 | 5000.0 | 55.6 | 132.6 | 0.34 | 0.63 |
| Ex. (5) | | P-11 | 5.0 | 8.4 | 5000.0 | 59.8 | 134.3 | 0.30 | 0.61 |
| Ex. (6) | | P-12 | 5.3 | 9.1 | 5000.0 | 55.1 | 130.0 | 0.35 | 0.64 |
| Ex. (7) | | P-13 | 4.7 | 7.9 | 5000.0 | 63.2 | 133.4 | 0.31 | 0.61 |
| Ex. (8) | | P-16 | 4.9 | 8.1 | 5000.0 | 61.5 | 133.9 | 0.33 | 0.63 |
| Ex. (9) | | P-17 | 5.1 | 8.8 | 5000.0 | 57.0 | 131.4 | 0.32 | 0.60 |
| Ex. (10) | | P-19 | 5.1 | 8.9 | 5000.0 | 56.2 | 132.4 | 0.32 | 0.64 |
| Ex. (11) | | P-22 | 5.0 | 8.3 | 5000.0 | 60.0 | 133.6 | 0.31 | 0.63 |
| Ex. (12) | | P-24 | 4.6 | 7.8 | 5000.0 | 64.4 | 133.7 | 0.35 | 0.62 |
| Ex. (13) | | P-27 | 4.9 | 8.2 | 5000.0 | 61.2 | 133.7 | 0.33 | 0.65 |
| Ex. (14) | | P-29 | 4.9 | 8.1 | 5000.0 | 61.9 | 134.5 | 0.32 | 0.63 |
| Ex. (15) | | P-36 | 5.0 | 8.4 | 5000.0 | 59.4 | 130.6 | 0.31 | 0.63 |
| Ex. (16) | | P-38 | 5.1 | 9.0 | 5000.0 | 55.6 | 130.3 | 0.31 | 0.63 |
| Ex. (17) | | P-41 | 4.8 | 8.1 | 5000.0 | 61.9 | 133.0 | 0.33 | 0.61 |
| Ex. (18) | | P-44 | 4.9 | 8.1 | 5000.0 | 61.6 | 133.2 | 0.31 | 0.61 |
| Ex. (19) | | P-46 | 4.7 | 7.7 | 5000.0 | 64.8 | 133.7 | 0.34 | 0.64 |
| Ex. (20) | | P-47 | 4.7 | 7.8 | 5000.0 | 63.8 | 133.9 | 0.32 | 0.61 |
| Ex. (21) | | P-49 | 4.6 | 7.8 | 5000.0 | 64.2 | 134.9 | 0.32 | 0.62 |
| Ex. (22) | | P-54 | 4.8 | 8.4 | 5000.0 | 59.7 | 133.9 | 0.34 | 0.61 |
| Ex. (23) | | P-59 | 5.1 | 8.1 | 5000.0 | 61.9 | 134.0 | 0.31 | 0.63 |
| Ex. (24) | | P-64 | 4.8 | 8.3 | 5000.0 | 60.6 | 133.7 | 0.31 | 0.62 |
| Ex. (25) | | P-67 | 5.1 | 8.4 | 5000.0 | 59.3 | 134.8 | 0.33 | 0.62 |
| Ex. (26) | | P-70 | 5.1 | 8.7 | 5000.0 | 57.4 | 131.5 | 0.34 | 0.64 |
| Ex. (27) | | P-73 | 4.7 | 7.9 | 5000.0 | 63.6 | 133.5 | 0.31 | 0.63 |
| Ex. (28) | | P-80 | 4.9 | 8.1 | 5000.0 | 61.8 | 133.6 | 0.32 | 0.64 |
| Ex. (29) | | P-83 | 5.3 | 9.1 | 5000.0 | 55.2 | 131.3 | 0.33 | 0.60 |
| Ex. (30) | | P-86 | 5.1 | 9.0 | 5000.0 | 55.3 | 131.8 | 0.33 | 0.61 |
| Ex. (31) | | P-89 | 5.2 | 8.7 | 5000.0 | 57.7 | 132.2 | 0.35 | 0.63 |

TABLE 4-continued

| | HTL com. | EAL com. | Voltage (V) | Current Density (mA/cm²) | Brightness (cd/m²) | Efficiency (cd/A) | Lifetime T(95) | CIE x | CIE y |
|---|---|---|---|---|---|---|---|---|---|
| Ex. (32) | | P-94 | 5.2 | 9.1 | 5000.0 | 55.1 | 130.1 | 0.31 | 0.63 |
| Ex. (33) | | P-98 | 4.9 | 8.3 | 5000.0 | 60.2 | 134.2 | 0.32 | 0.63 |
| Ex. (34) | | P-103 | 5.1 | 8.8 | 5000.0 | 57.1 | 130.8 | 0.33 | 0.62 |
| Ex. (35) | | P-108 | 5.0 | 8.3 | 5000.0 | 60.4 | 133.9 | 0.32 | 0.63 |
| Ex. (36) | | P-111 | 4.9 | 8.4 | 5000.0 | 59.8 | 132.2 | 0.33 | 0.65 |
| Ex. (37) | | P-115 | 5.2 | 8.3 | 5000.0 | 60.0 | 133.7 | 0.35 | 0.62 |

As can be seen from the results of Table 4, it is possible to lower the driving voltage as well as improve the luminous efficiency and life of the organic electroluminescent device when a green organic electroluminescent element was manufactured by employing the material for an organic electroluminescent element of the present invention as an emission-auxiliary layer material, compared to case where an emission-auxiliary layer is not formed or Comparative Examples employing Comparative Compounds A to D.

In cases of Comparative Examples 2 to 5 in which an emission-auxiliary layer was formed as one of Comparative Compounds A to D rather than in case of Comparative Example 1 in which an emission-auxiliary layer is not formed, driving voltage, efficiency, and life are improved. In the Examples of the present invention using NPB as a hole transport layer material and the compound of the present invention as an emission-auxiliary layer material rather than in Comparative Examples 1 to 5, the driving voltage, efficiency and life time are significantly improved.

Comparative Compound A and Comparative Compound B differ only in the position where the amine group is bonded to dibenzofuran. The amine group is bonded to 4-position of dibenzofuran in Comparative Compound A and the amine group is bonded to 1-position of dibenzofuran in Comparative Compound B. Looking at the element characteristics of Comparative Examples 2 and 3 employing Comparative Compound A and B as an emission-auxiliary layer material, respectively, it can be seen that the element characteristics of Comparative Example 3 are more excellent.

In addition, comparing Comparative Compound B and C, two compounds differ only in the binding positions of the amines attached to both sides of the phenyl. Both amine groups are linearly positioned (i.e., the amine groups are attached to the phenyl in a para-position) in Comparative Compound B, while both amine groups are non-linearly positioned (i.e., the amine groups are attached to the phenyl in the meta-position) in Comparative Compound C. Looking at the element characteristics of Comparative Examples 3 and 4 employing these compounds as an emission-auxiliary layer material, it can be seen that the element characteristics of Comparative Example 4 employing Comparative Compound C are significantly improved.

In addition, comparing Comparative Compound C and D, phenyl is bonded to nitrogen of the amine group with which dibenzofuran is substituted in Comparative Compound C, while dimethylfluorene is bonded to nitrogen of the amine group in Comparative Compound D. Looking at the element characteristics of Comparative Examples 4 and 5 employing these compounds as an emission-auxiliary layer material, it can be seen that the element characteristics of Comparative Example 5 are slightly improved.

Therefore, from the element characteristics results of Comparative Examples 2 to 5, it can be seen that the characteristics of the organic electroluminescent can be improved when the compound, in which two amine groups are attached to phenyl linker in the meta-position and the same fluorenes are bonded to the nitrogen of both amines, respectively when two amine groups are linked by phenyl linker, is used as an emission-auxiliary layer material.

From these results, it can be seen that the characteristics of the element may vary depending on the substitution position of the substituent and the type of the substituent, even if the structure of a compound is similar. This appears that the physical properties of the compounds are different when the compounds are different, and the physical properties of the compound act as a major factor in improving element performance (e.g. energy balance) due to these differences when depositing a compound in the element manufacturing process.

On the other hand, in the compound according to Formula 1 of the present invention, two amine groups are bonded to the phenyl linker in a meta position, and 1-dibenzofuran and fluorene are bonded to the nitrogen in one of amine groups, and fluorene and dibenzothiophene or fluorene and dibenzofuran are bonded to the nitrogen in the other amine.

Comparing the compound of the present invention with the comparative compound D, there is a difference in that phenyl is bonded to nitrogen in one of the amine groups in Comparative Compound D, while dibenzothiophene or dibenzofuran is bonded in the present invention As can be seen from Table 4, when the compound of the present invention is used as an emission-auxiliary layer material, the characteristics of the element are significantly improved, compared to the case where the comparative compound D was used as an emission-auxiliary layer material. The properties (for example, LUMO, HOMO, band gab, $T_1$, refractive index, etc.) of a compound in which dibenzothiophene or dibenzofuran is substituted are different from those of a compound in which general aryl is substituted and it appears that these differences of the physical properties act as a major factor in improving element performance when depositing a compound in the element manufacturing process.

Accordingly, it can be seen that even if a compound having a similar structure has a slight difference in the type and position of a substituent, an element characteristic result that is difficult to be easily obtained by a person skilled in the art can be derived if that slight difference plays a decisive role in physical properties. Comparing the comparative example 6 with the embodiment of the present invention, it can be seen that even if the same compound is used, the result of completely different element characteristics may be derived depending on which material is used in which layer, that is, the combination of materials used in each layer.

Although the exemplary embodiments of the present invention have been described for illustrative purposes, those skilled in the art to which the present invention pertains will be capable of various modifications without departing from the essential characteristics of the present invention. Therefore, the embodiment disclosed herein is intended to illustrate the scope of the technical idea of the present invention, and the spirit and scope of the present invention are not limited by the embodiments. The scope of the present invention shall be construed on the basis of the accompanying claims, and it shall be construed that all of the technical ideas included within the scope equivalent to the claims belong to the present invention.

The invention claimed is:

1. An organic electric element comprising a first electrode, a second electrode, and an organic material layer formed between the first electrode and the second electrode, wherein the organic material layer comprises an emission-auxiliary layer formed between the first electrode and a light emitting layer and the emission-auxiliary layer comprises a compound represented by the following Formula 1:

[Formula 1]

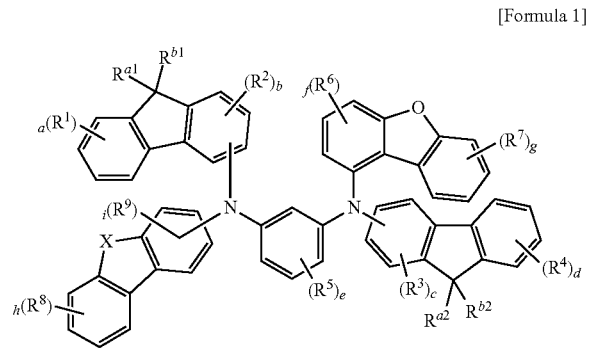

wherein:
X is O or S,
$R^{a1}$, $R^{b1}$, $R^{a2}$ and $R^{b2}$ are each independently a $C_1$-$C_{50}$ alkyl group or a $C_6$-$C_{60}$ aryl group; or $R^{a1}$ and $R^{b1}$ together or $R^{a2}$ and $R^{b2}$ together are bonded to each other to form a $C_6$-$C_{60}$ aromatic hydrocarbon group, a fluorenyl group, a $C_2$-$C_{60}$ heterocyclic group comprising at least one heteroatom selected from the group consisting of O, N, S, Si and P, a $C_3$-$C_{60}$ aliphatic ring, or a fused ring group formed by a $C_3$-$C_{60}$ aliphatic ring with a $C_6$-$C_{60}$ aromatic ring, provided that both $R^{a1}$ and $R^{b1}$ are the aryl group, or both $R^{a2}$ and $R^{b2}$ are the aryl group, or $R^{a1}$ and $R^{b1}$ together form the ring, or $R^{a2}$ and $R^{b2}$ together form the ring,
$R^1$ to $R^4$, and $R^6$ to $R^9$ are each independently selected from the group consisting of hydrogen, deuterium, halogen, a $C_6$-$C_{60}$ aryl group, a fluorenyl group, a $C_2$-$C_{60}$ heterocyclic group containing at least one heteroatom of O, N, S, Si, and P, a fused ring group formed by a $C_3$-$C_{60}$ aliphatic ring with a $C_6$-$C_{60}$ aromatic ring, a $C_1$-$C_{60}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N(R')(R''), or adjacent groups of $R^1$ to $R^9$ are bonded to each other to form a $C_6$-$C_{60}$ aromatic hydrocarbon group, a fluorenyl group, a $C_2$-$C_{60}$ heterocyclic group comprising at least one heteroatom selected from the group consisting of O, N, S, Si and P, a $C_3$-$C_{60}$ aliphatic ring, or a fused ring group formed by a $C_3$-$C_{60}$ aliphatic ring with a $C_6$-$C_{60}$ aromatic ring,
$R^5$ is hydrogen, deuterium, or a $C_6$-$C_{60}$ aryl group; or adjacent groups of $R^5$ may form a $C_6$-$C_{60}$ aromatic hydrocarbon group,
a, d, e, g and h are each represent an integer of 0-4, b, c, f and i are each represent an integer of 0-3,
L' is selected from the group consisting of a single bond, a $C_6$-$C_{60}$ arylene group, a fluorenylene group, a fused ring group formed by a $C_3$-$C_{60}$ aliphatic ring with a $C_6$-$C_{60}$ aromatic ring, and a $C_2$-$C_{60}$ heterocyclic group,
R' and R'' are each independently selected from the group consisting of a $C_6$-$C_{60}$ aryl group, a fluorenyl group, a fused ring group formed by a $C_3$-$C_{60}$ aliphatic ring with a $C_6$-$C_{60}$ aromatic ring, and a $C_2$-$C_{60}$ heterocyclic group containing at least one heteroatom of O, N, S, Si, and P, and
the above $R^{a1}$, $R^{b1}$, $R^{a2}$, $R^{b2}$, $R^1$ to $R^9$, L', R', R'', a ring formed by $R^{a1}$ and $R^{b1}$, a ring formed by $R^{a2}$ and $R^{b2}$, and a ring formed by adjacent groups of $R^1$-$R^9$ may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxyl group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ cycloalkyl group, a $C_7$-$C_{20}$ arylalkyl group, and a $C_8$-$C_{20}$ arylalkenyl group.

2. The organic electric element of claim 1, wherein Formula 1 is represented by Formula 3 or Formula 4:

<Formula 3>

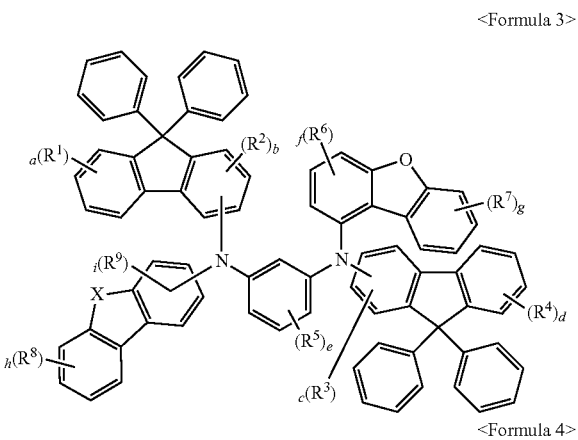

<Formula 4>

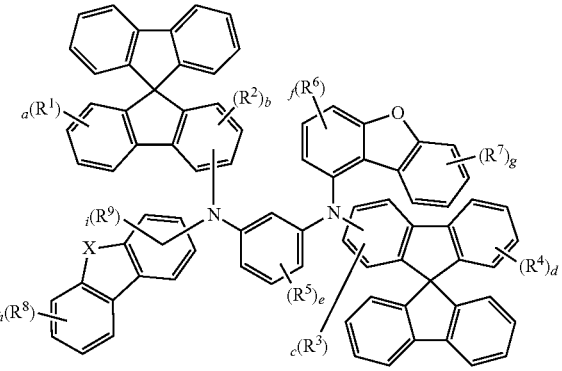

wherein X, $R^1$ to $R^9$, a, b, c, d, e, f, g, h, and i are the same as defined in claim 1.
3. The organic electric element of claim 1, wherein the compound represented by Formula 1 is one of the following compounds:
P-3
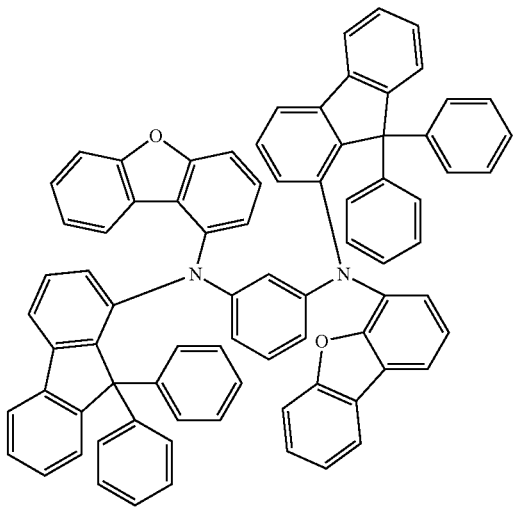
P-4
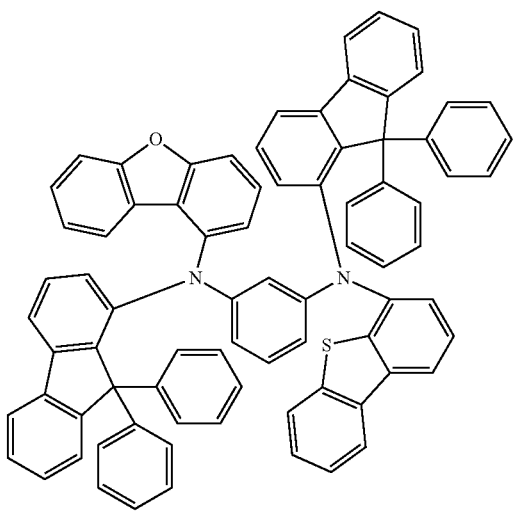
P-6
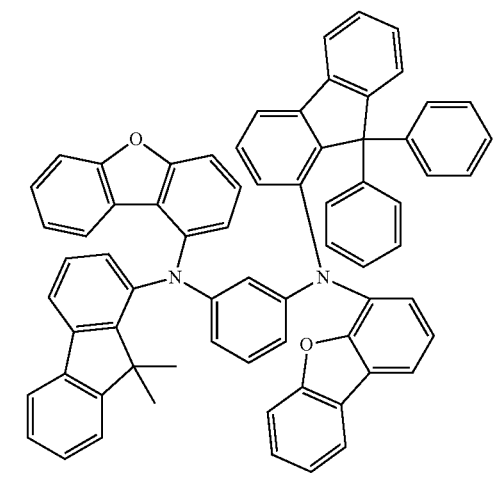
P-7
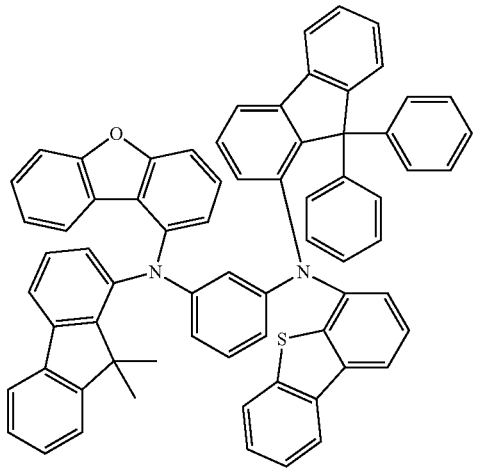
P-8
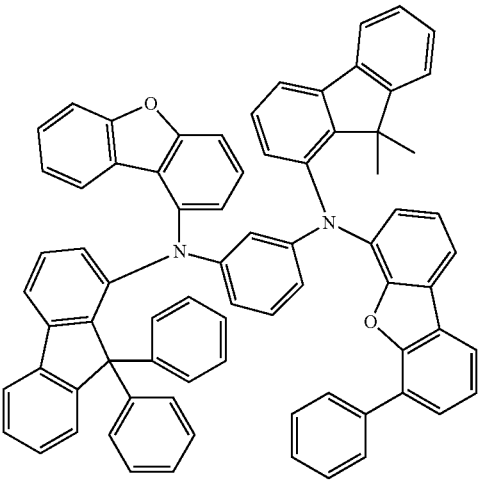
P-9
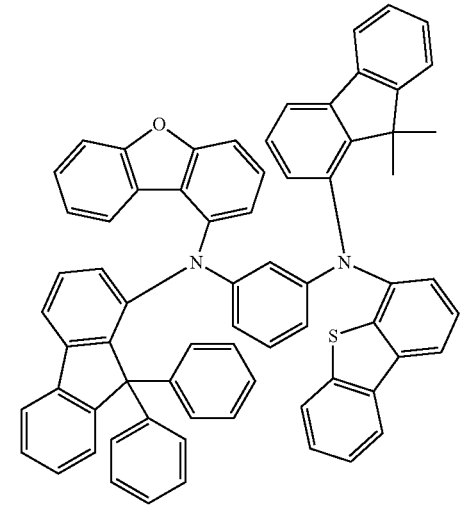

P-13
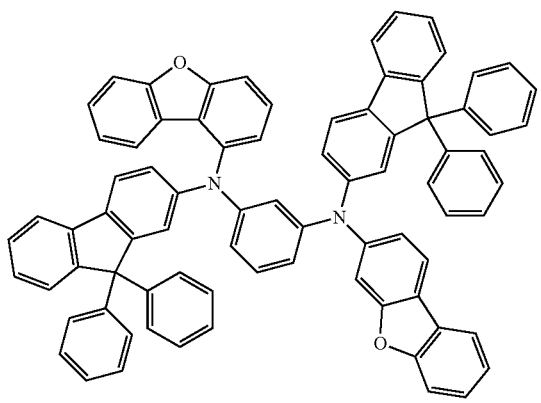
P-17
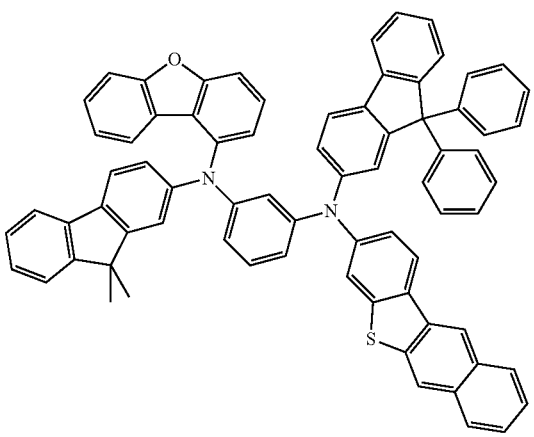
P-14
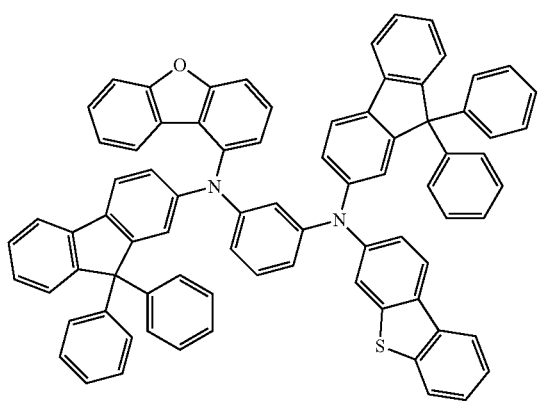
P-18
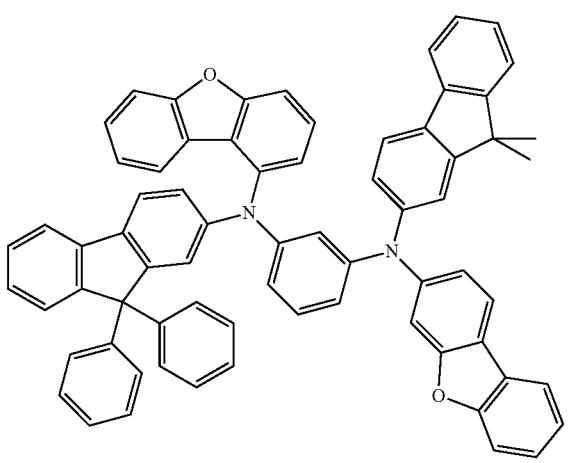
P-16
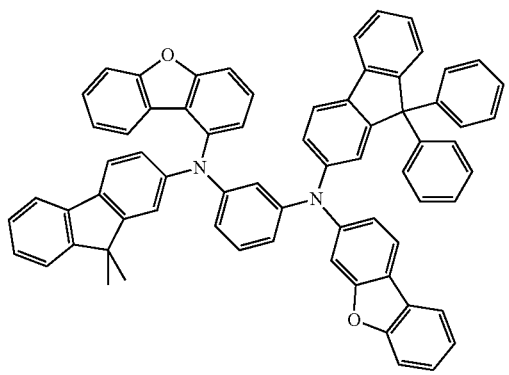
P-19
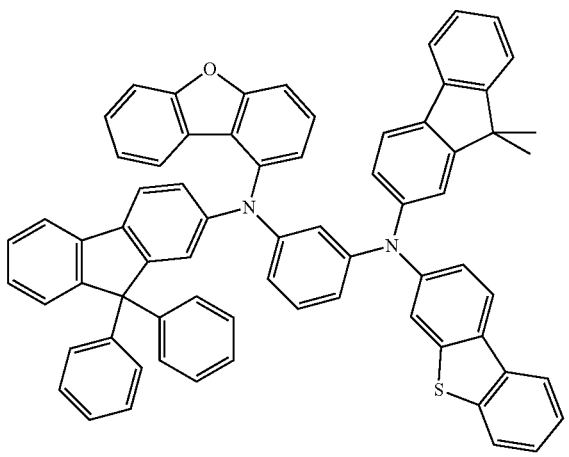

P-24
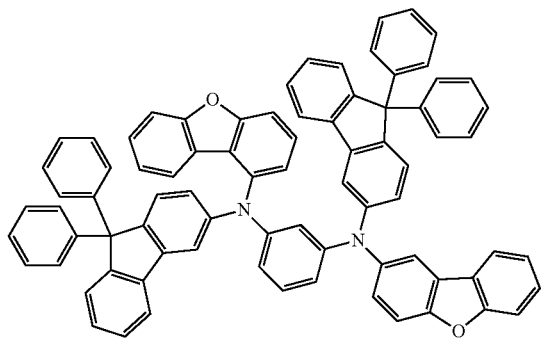
P-25
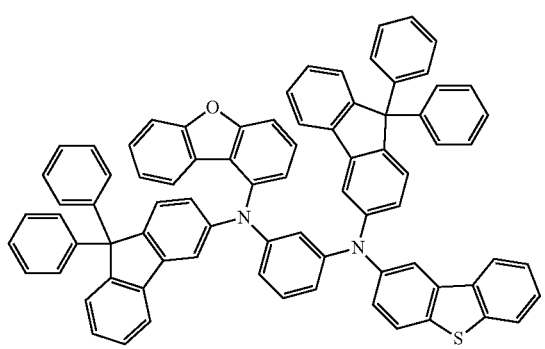
P-27
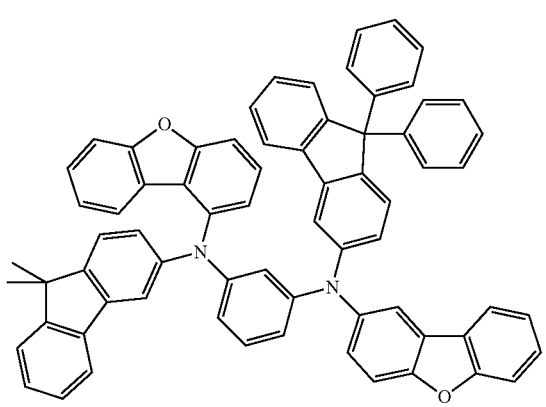
P-28
P-29
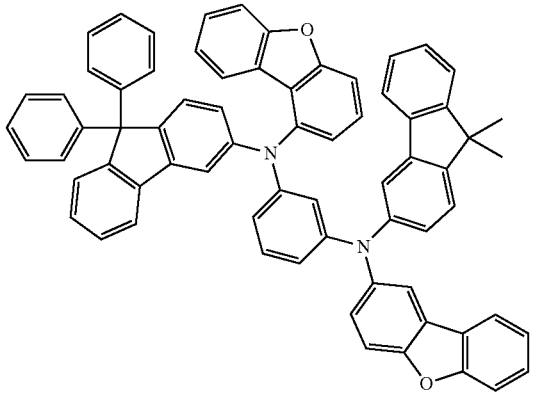
P-30
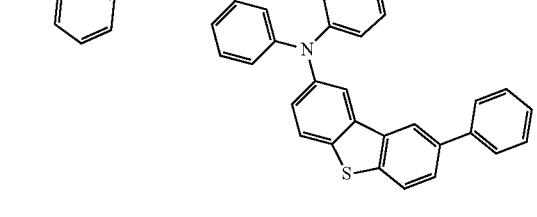
P-35
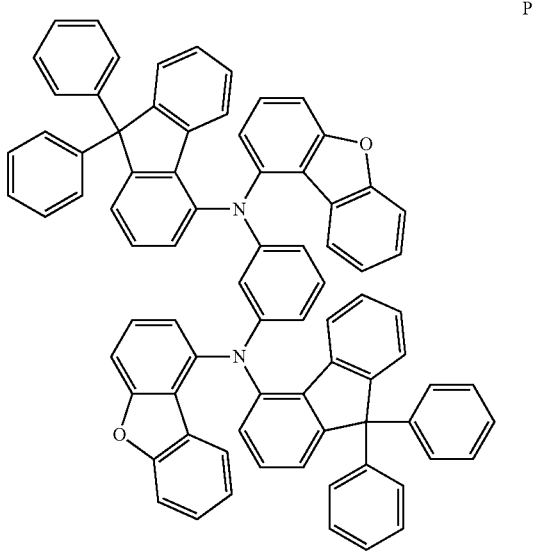

P-36
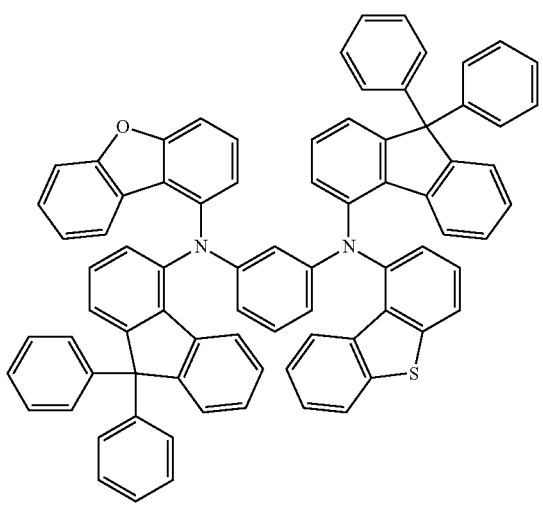
P-37
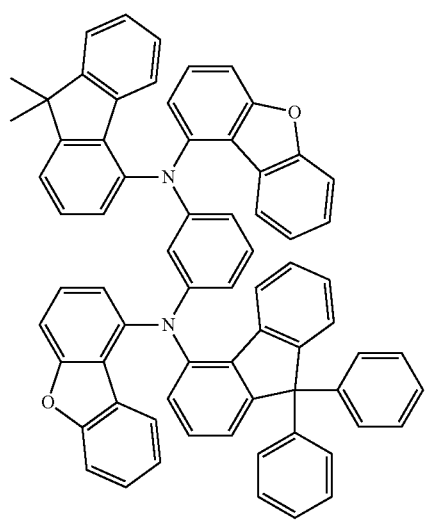
P-38
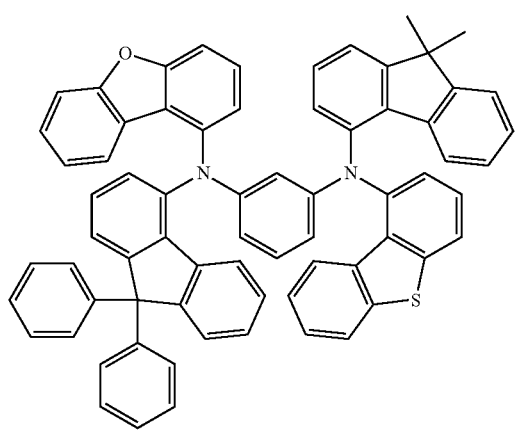
P-39
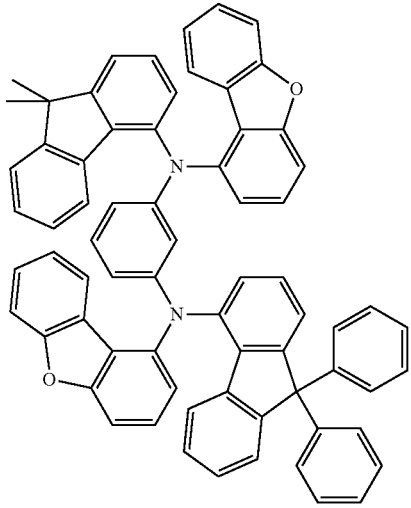
P-40
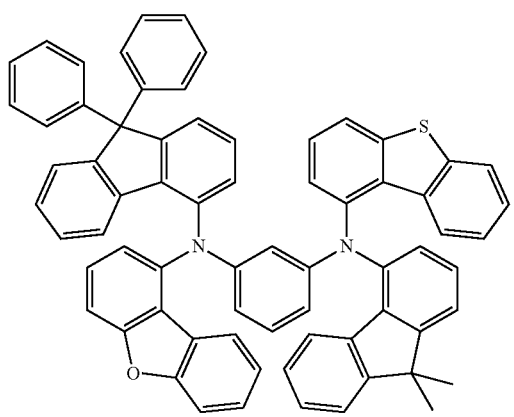
P-41
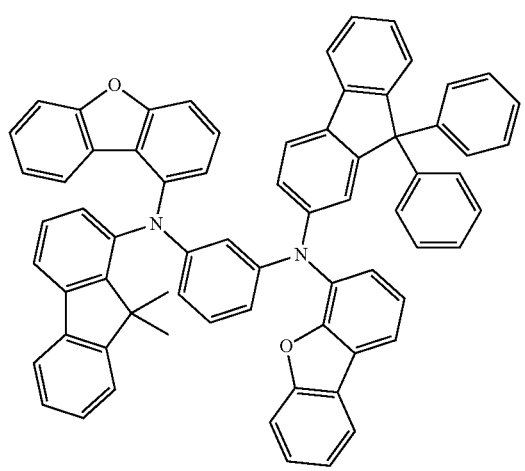

P-42
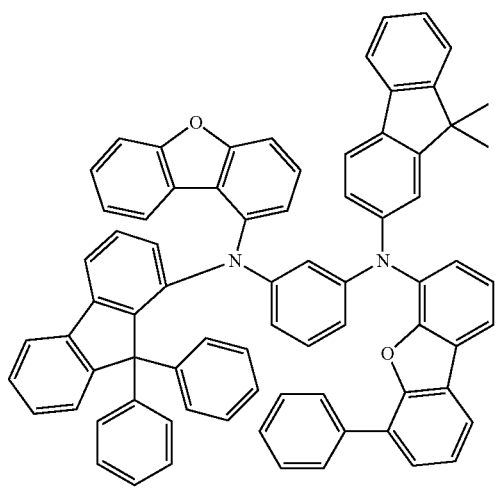
P-47
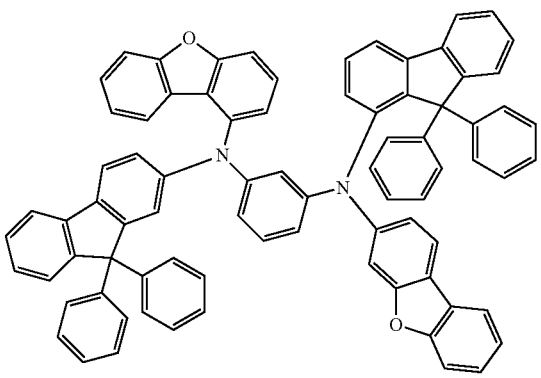
P-44
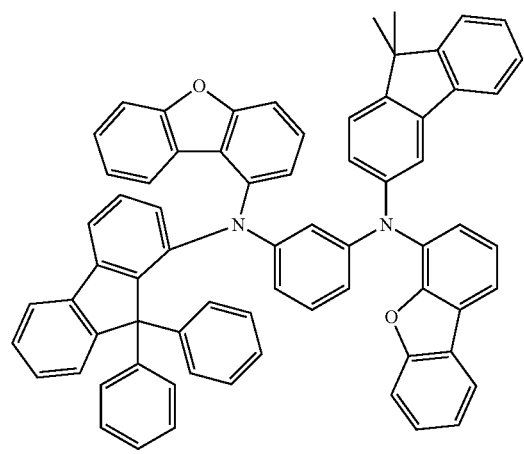
P-48
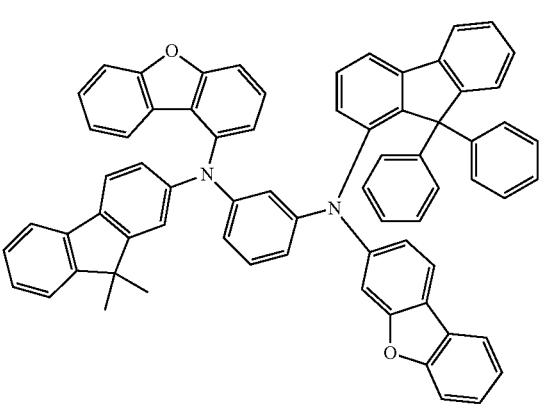
P-46
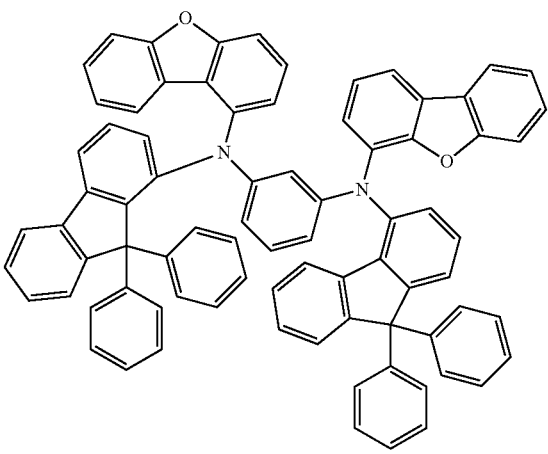
P-49
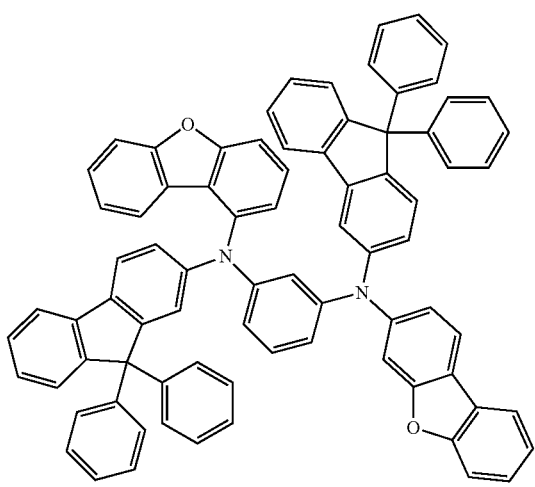

P-50
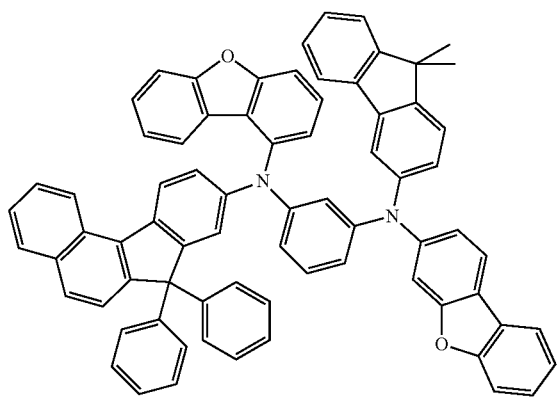
P-52
P-54
P-55
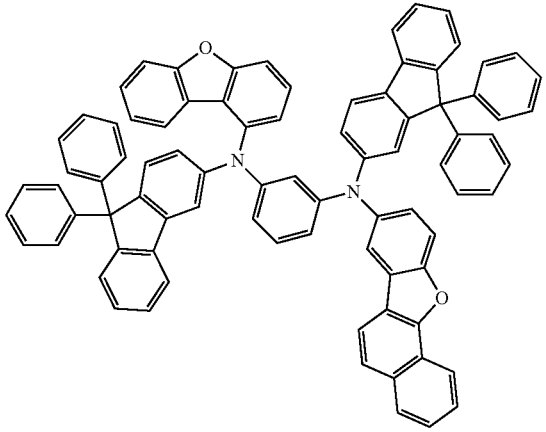
P-56
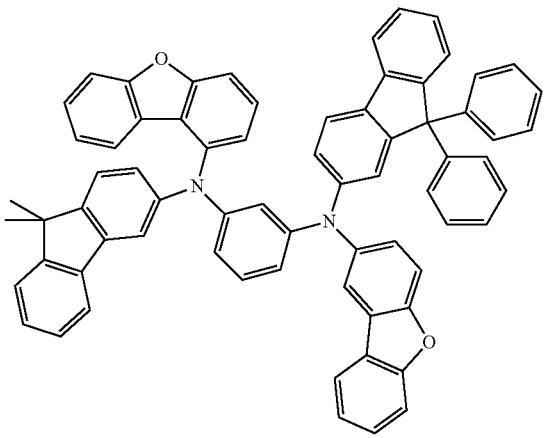
P-58
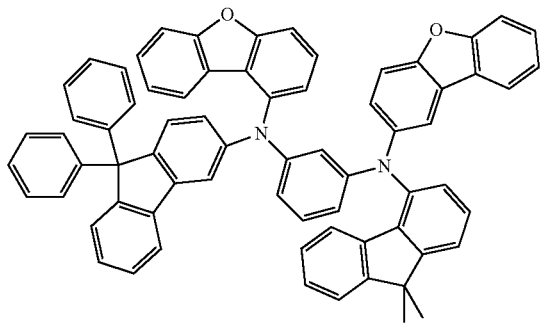
P-60
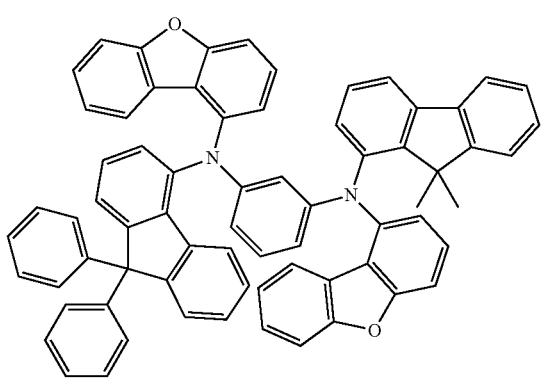

P-61
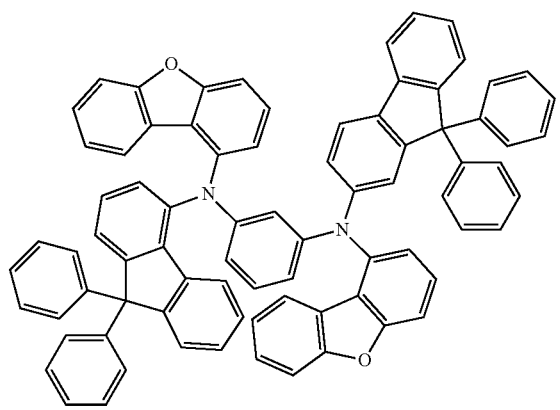
P-64
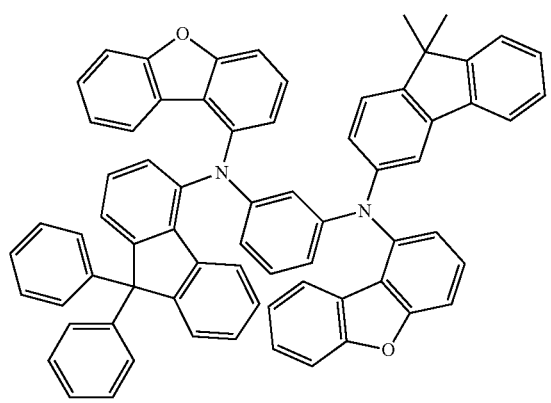
P-62
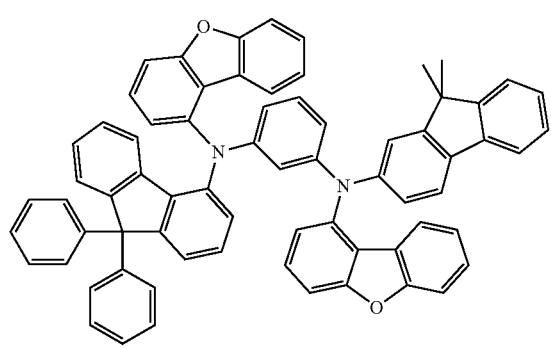
P-66
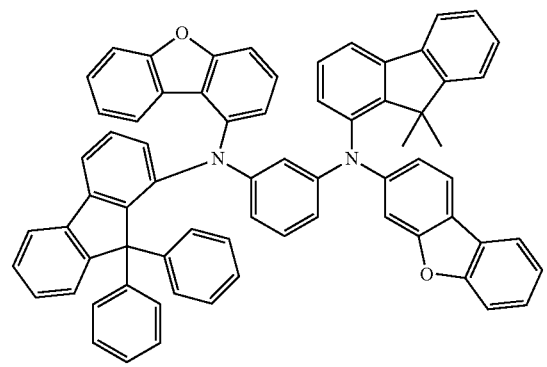
P-63
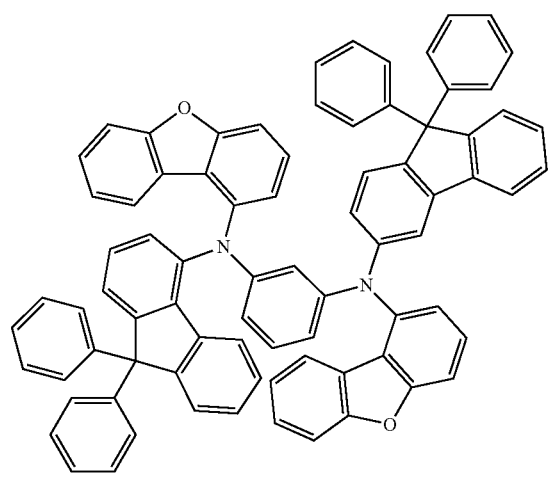
P-68
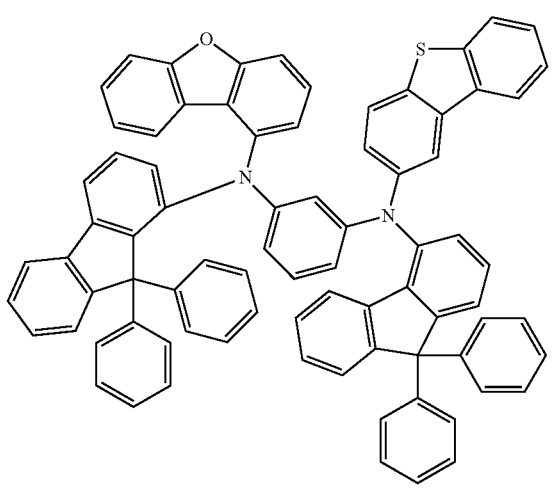

P-69
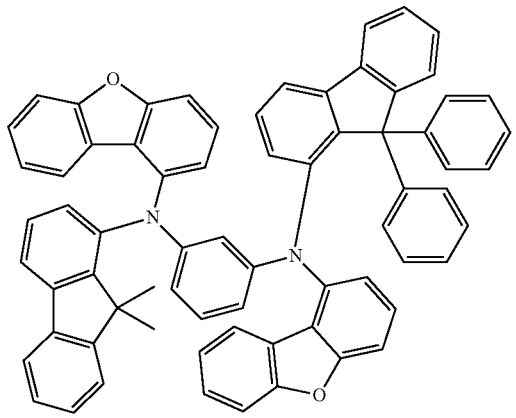
P-73
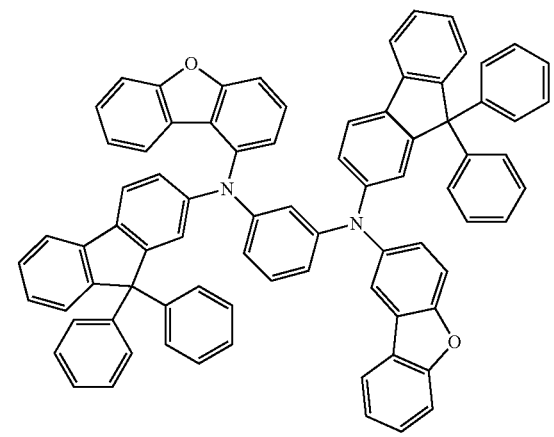
P-70
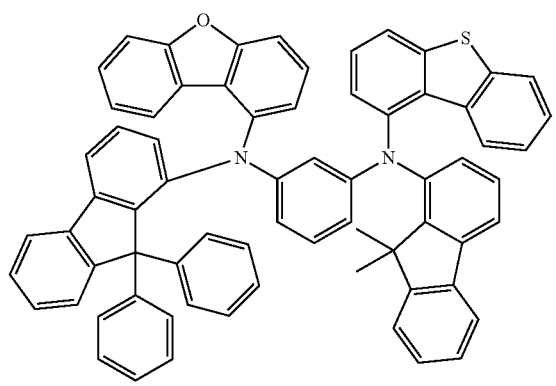
P-74
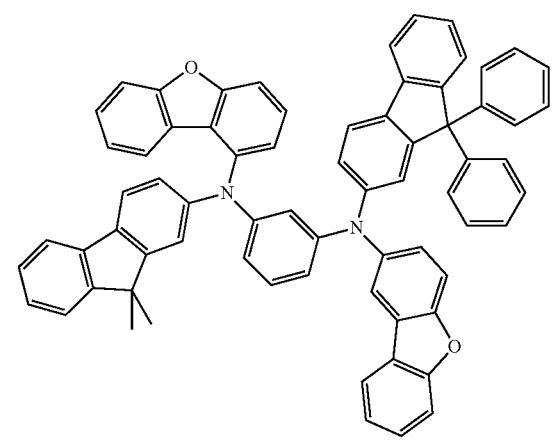
P-72
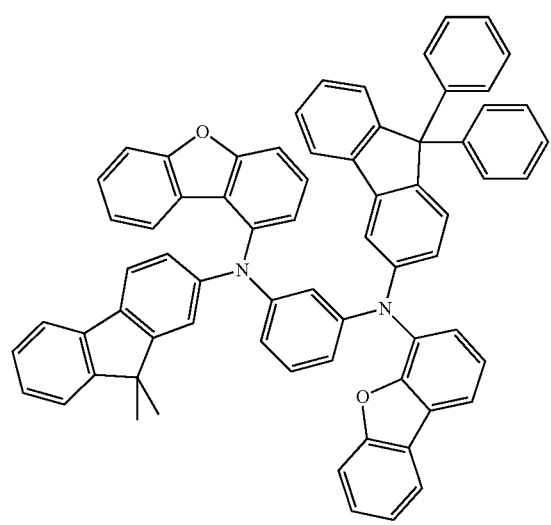
P-75
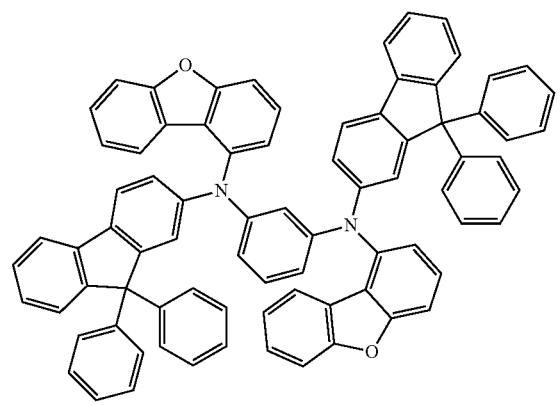

P-76
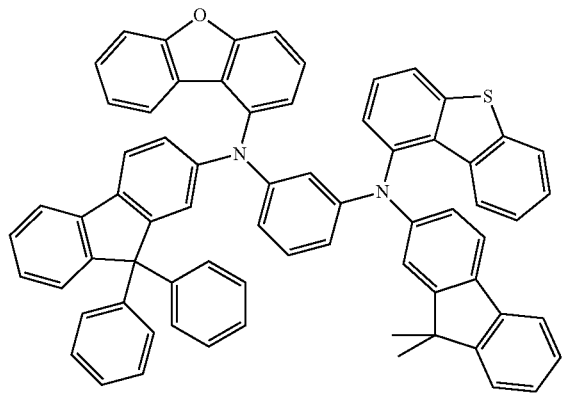
P-78
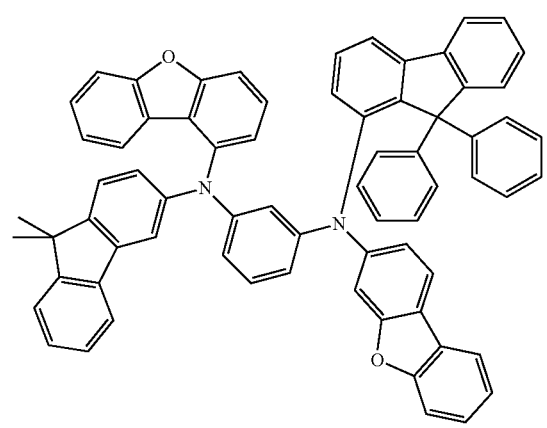
P-79
P-80
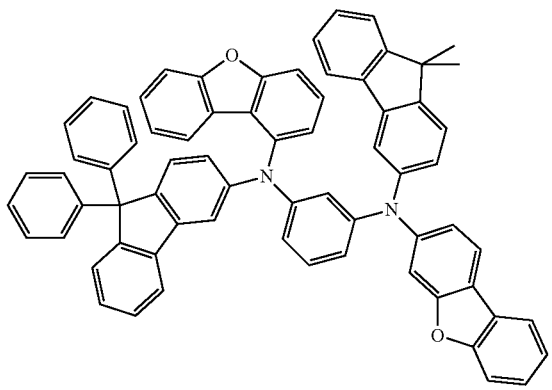
P-82
P-84
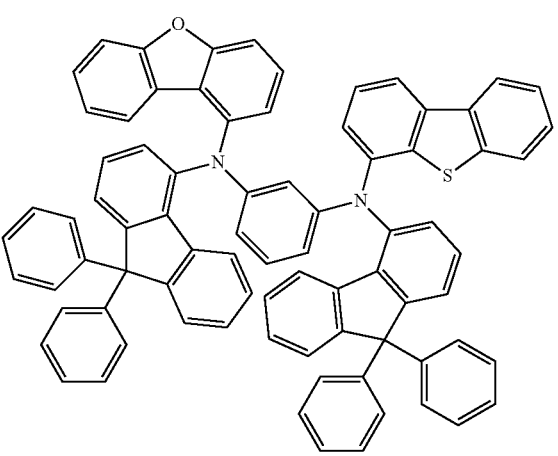

P-85
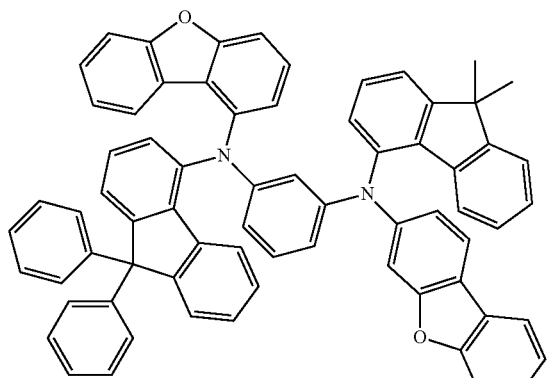
P-86
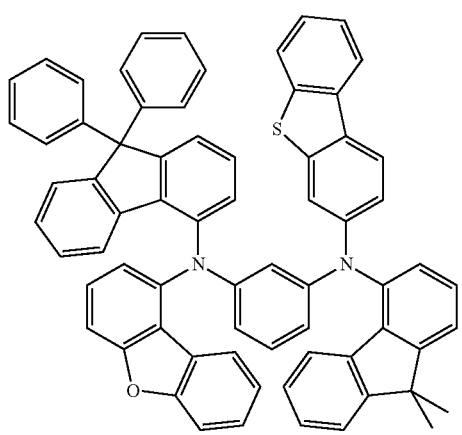
P-87
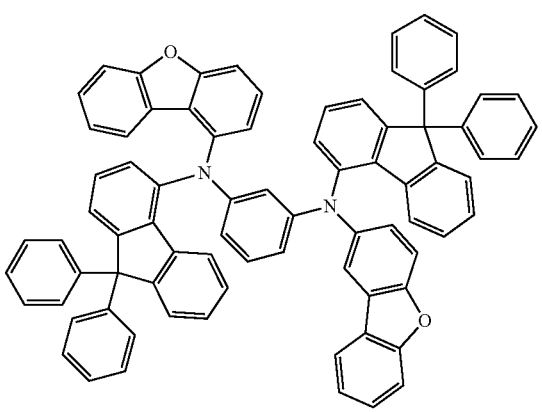
P-88
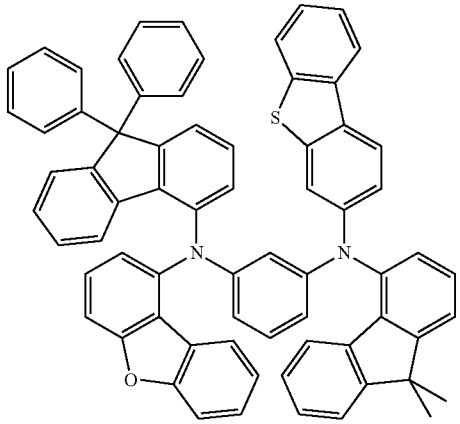
P-89
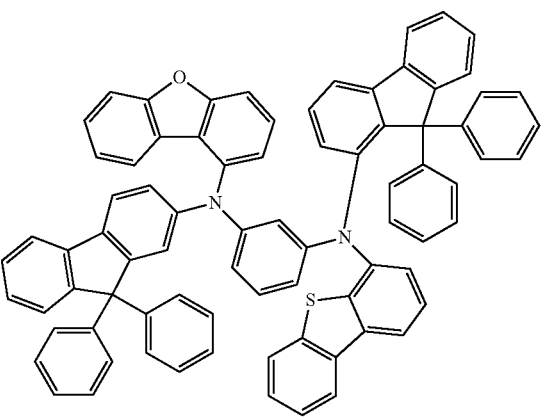
P-90
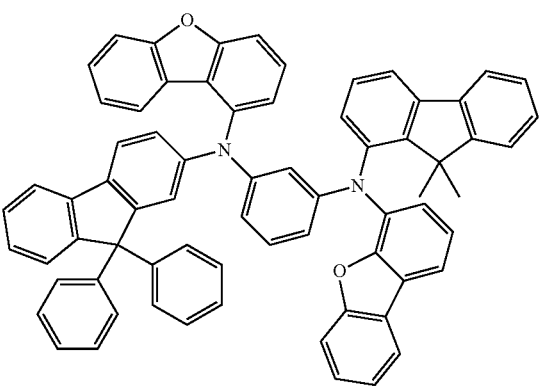

P-92
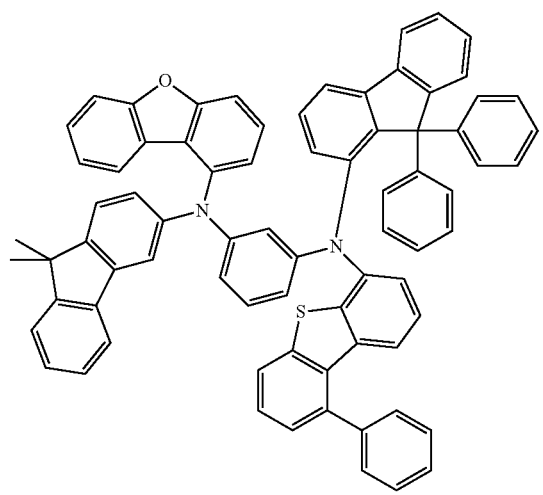
P-96
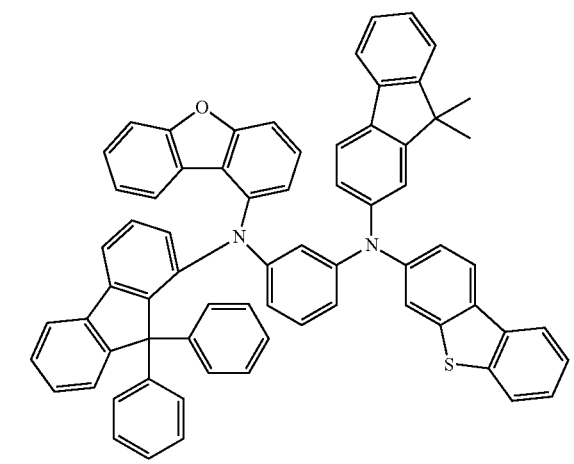
P-94
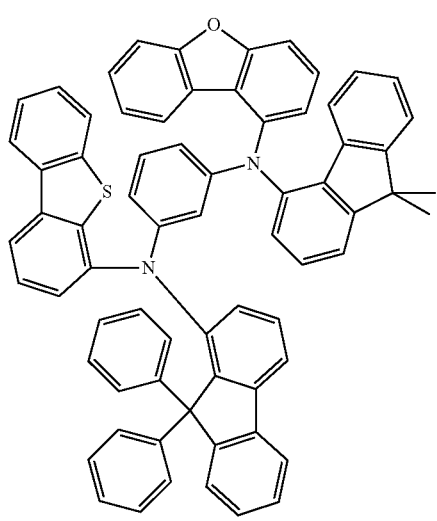
P-97
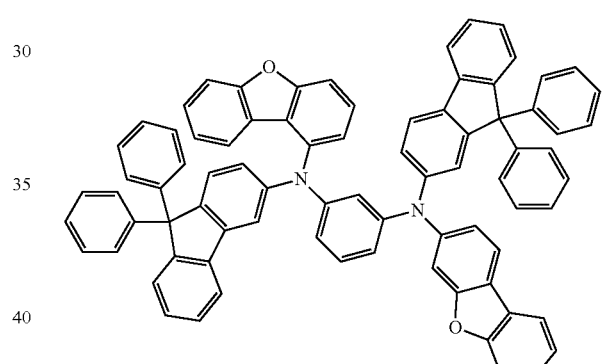
P-95
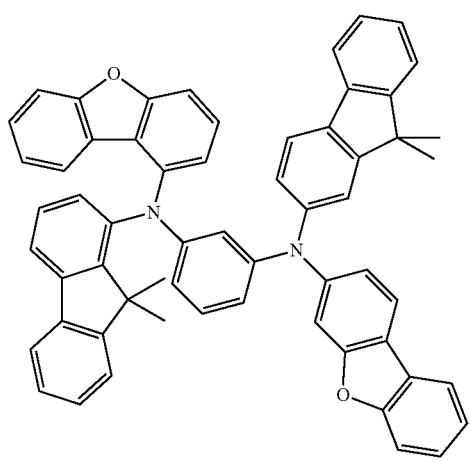
P-98
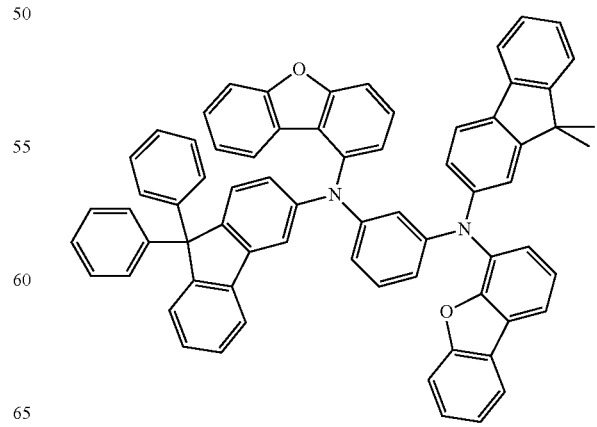

P-99
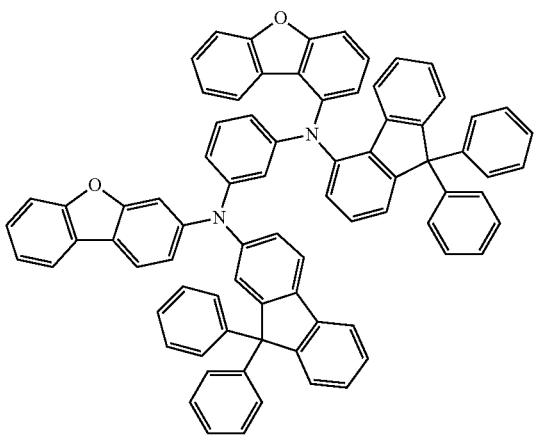
P-100
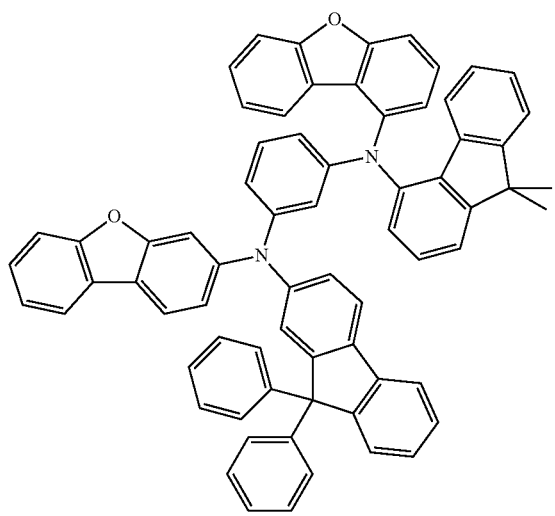
P-101
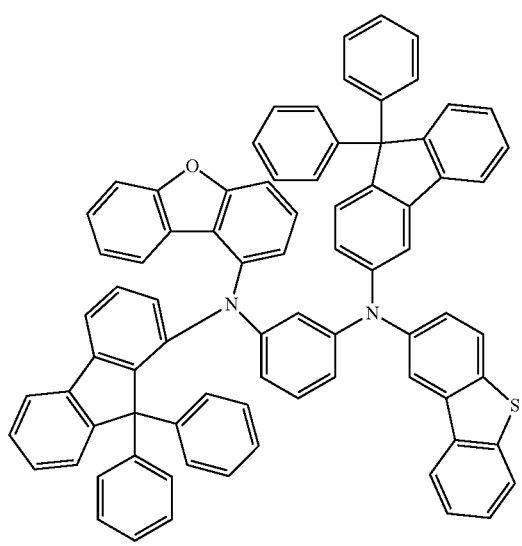
P-102
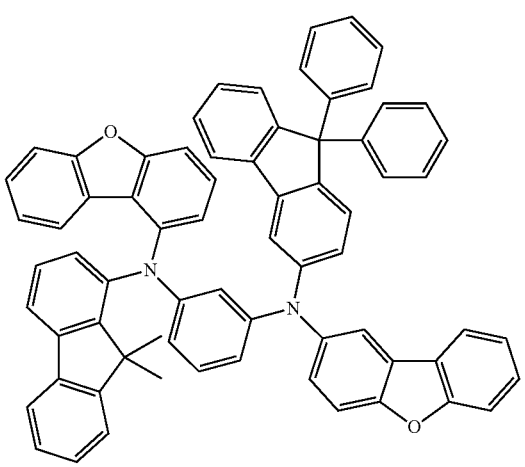
P-103
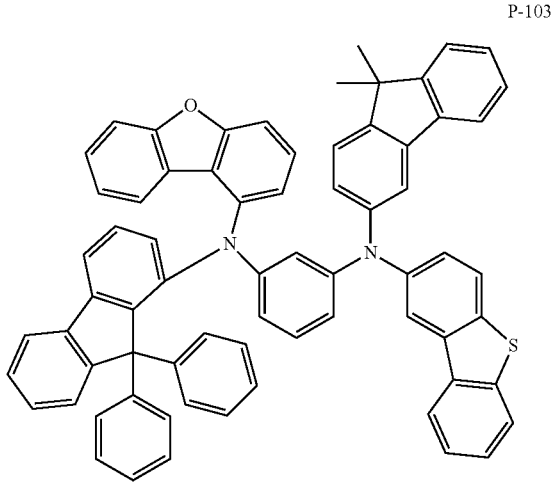
P-104
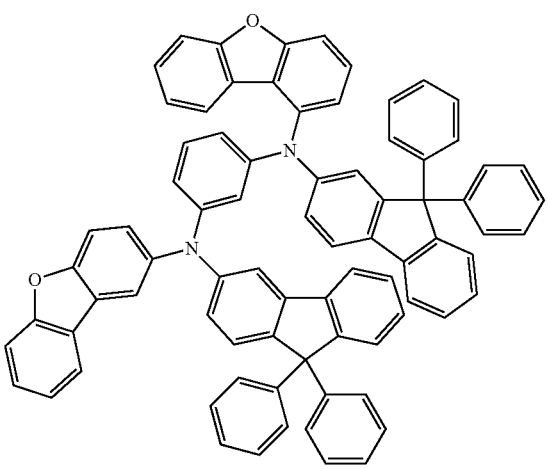

P-105
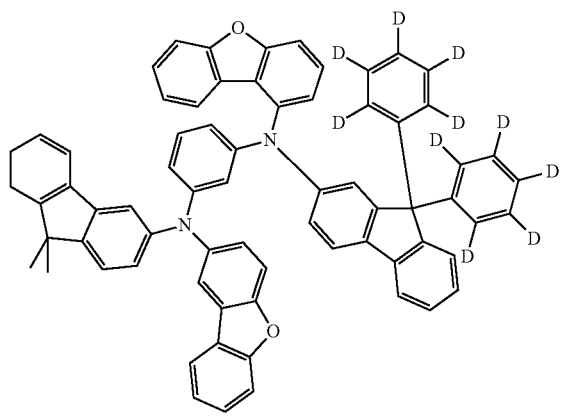
P-109
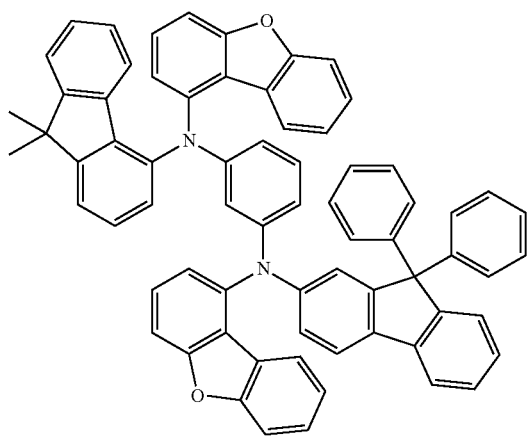
P-106
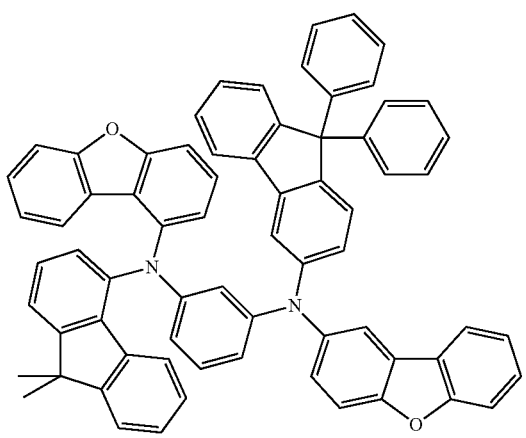
P-111
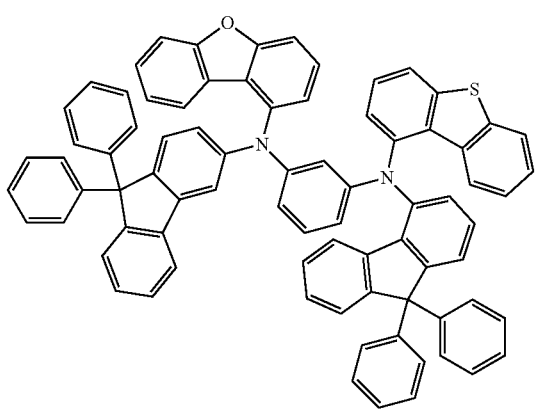
P-107
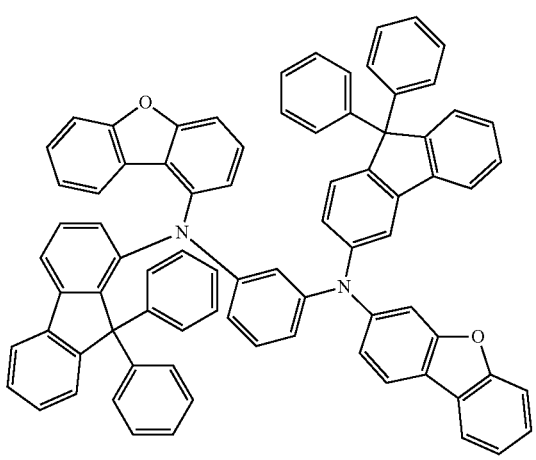
P-112
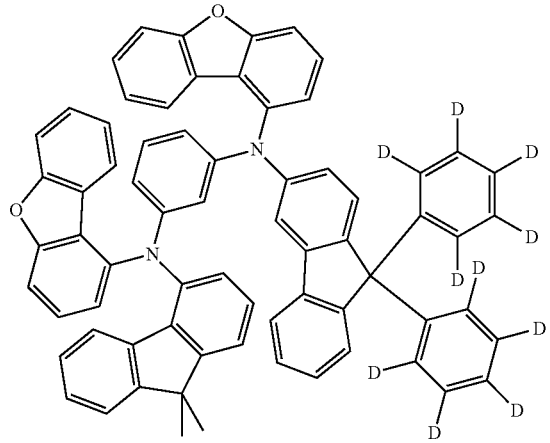

P-113

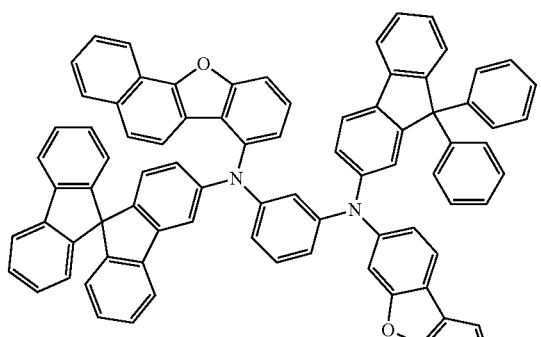

P-114

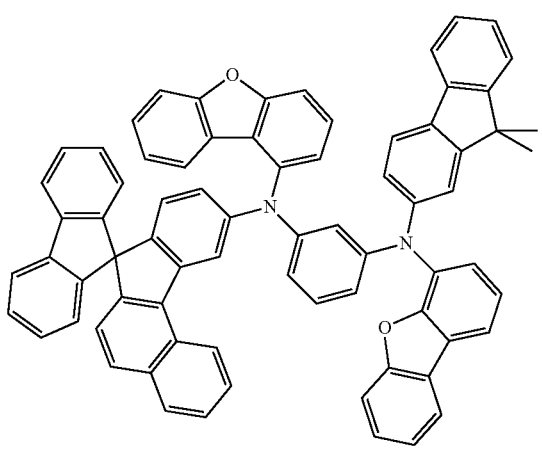

P-115

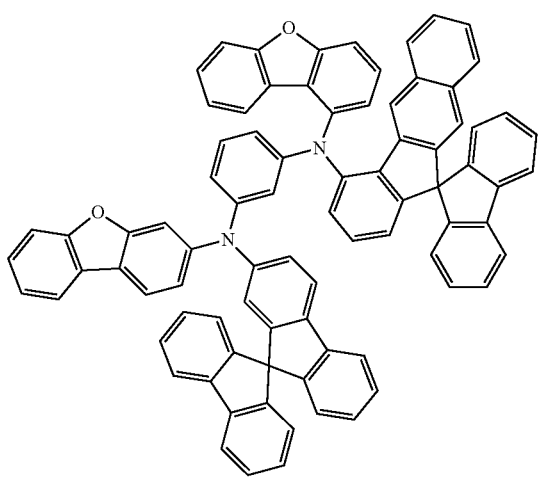

P-116

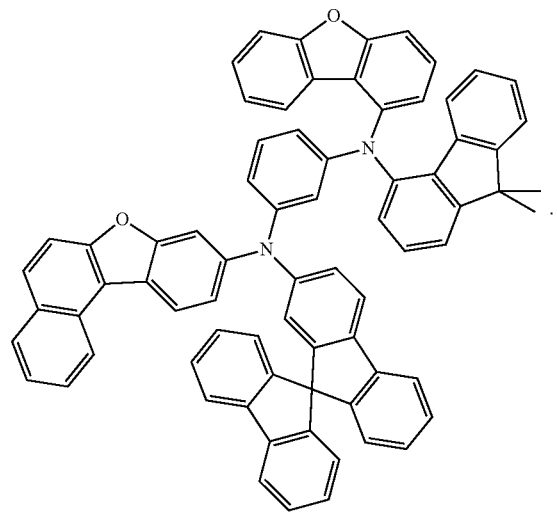

4. The organic electric element of claim 1, wherein the compound represented by Formula 1 is comprised in the emission-auxiliary layer as a single compound or as a mixture.

5. The organic electric element of claim 1, wherein the compound is used as a green emission-auxiliary layer material of the emission-auxiliary layer.

6. The organic electric element of claim 1, wherein the organic material layer is formed by a process of spin coating, nozzle printing, inkjet printing, slot coating, dip coating or roll-to-roll.

7. An electronic device comprising a display device and a control unit for driving the display device, wherein the display device comprises the organic electric element of claim 1.

8. The electronic device of claim 7, wherein the organic electric element is selected from the group consisting of an organic electroluminescent element, an organic solar cell, an organic photo conductor, an organic transistor, an element for monochromatic illumination and element for quantum dot display.

* * * * *